United States Patent
Xia

(10) Patent No.: US 12,289,984 B2
(45) Date of Patent: Apr. 29, 2025

(54) METAL COMPLEX CONTAINING AZABENZOTHIAZOLE

(71) Applicant: BEIJING SUMMER SPROUT TECHNOLOGY CO., LTD., Beijing (CN)

(72) Inventor: Chuanjun Xia, Lawrenceville, NJ (US)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 931 days.

(21) Appl. No.: 16/127,247

(22) Filed: Sep. 11, 2018

(65) Prior Publication Data
US 2019/0157575 A1 May 23, 2019

Related U.S. Application Data

(60) Provisional application No. 62/587,486, filed on Nov. 17, 2017.

(51) Int. Cl.
| | |
|---|---|
| *H10K 85/30* | (2023.01) |
| *C07B 59/00* | (2006.01) |
| *C07F 15/00* | (2006.01) |
| *H10K 50/11* | (2023.01) |
| *H10K 85/60* | (2023.01) |

(52) U.S. Cl.
CPC ......... *H10K 85/342* (2023.02); *C07B 59/004* (2013.01); *C07F 15/0033* (2013.01); *H10K 85/654* (2023.02); *H10K 85/657* (2023.02); *H10K 50/11* (2023.02); *H10K 85/361* (2023.02)

(58) Field of Classification Search
None
See application file for complete search history.

(56) References Cited

U.S. PATENT DOCUMENTS

| | | | |
|---|---|---|---|
| 5,703,436 A | 12/1997 | Forrest et al. | |
| 5,707,745 A | 1/1998 | Forrest et al. | |
| 5,844,363 A | 12/1998 | Gu et al. | |
| 6,097,147 A | 8/2000 | Baldo et al. | |
| 6,303,238 B1 | 10/2001 | Thompson et al. | |
| 6,358,634 B1* | 3/2002 | Igarashi | 428/690 |

(Continued)

FOREIGN PATENT DOCUMENTS

| | | |
|---|---|---|
| CN | 1413426 | 4/2003 |
| CN | 102113147 | 6/2011 |

(Continued)

OTHER PUBLICATIONS

Machine translation of JP 10330744 A, Chin Hsin Chen, Dec. 15, 1998 (Year: 1998).*
A machine translated English document of JPH 10330744 A, Chin Hsin Chen et al. (Year: 1998).*
A machine translated English document of JPH 07133483 A, Norikazu Nakamura et al. (Year: 1995).*

(Continued)

*Primary Examiner* — Seokmin Jeon
(74) *Attorney, Agent, or Firm* — Workman Nydegger

(57) ABSTRACT

Metal complexes containing azabenzothiazole are disclosed, which comprise a new series of ligands containing azabenzothiazole structure. The metal complexes can be used as emitters in the emissive layer of an organic electroluminescent device. The use of these novel metal complexes as emitters in OLED devices leads to more saturated color than the compounds containing benzothiazole ligands. An electroluminescent device and a formulation are also disclosed.

19 Claims, 3 Drawing Sheets

(56) References Cited

U.S. PATENT DOCUMENTS

| | | |
|---|---|---|
| 7,279,704 B2 | 10/2007 | Walters et al. |
| 7,968,146 B2 | 6/2011 | Wagner et al. |
| 2003/0230980 A1 | 12/2003 | Forrest et al. |
| 2004/0174116 A1 | 9/2004 | Lu et al. |
| 2007/0184301 A1* | 8/2007 | Oshiyama .................... 428/690 |
| 2010/0295032 A1 | 11/2010 | Kwong et al. |
| 2011/0127503 A1* | 6/2011 | Takahashi ...................... 257/40 |
| 2012/0228583 A1* | 9/2012 | Wu ................................. 257/40 |
| 2013/0075716 A1* | 3/2013 | Nishimura .......... H01L 51/5016 257/40 |
| 2015/0349273 A1 | 12/2015 | Hung et al. |
| 2016/0359122 A1 | 12/2016 | Boudreault et al. |

FOREIGN PATENT DOCUMENTS

| | | |
|---|---|---|
| CN | 103626784 | 3/2014 |
| CN | 107075361 | 8/2017 |
| JP | 2003192691 A * | 7/2003 |
| WO | WO0141512 A1 * | 6/2001 |

OTHER PUBLICATIONS

Tang, C. W. et al., "Organic electroluminescent diodes", Applied Physics Letters, 51(12): 913-915 (1987).

Hiroki Uoyama et al., "Highly efficient organic light-emitting diodes from delayed fluorescence", Nature, vol. 492, pp. 234-238 (2012).

Search Report issued in CN 2018111483579 dated Dec. 2, 2020.

Chinese Office Action issued in 201811148357.9 dated Dec. 9, 2020.

* cited by examiner

METAL COMPLEX CONTAINING AZABENZOTHIAZOLE

This application claims the benefit of U.S. Provisional Application No. 62/587,486, filed Nov. 17, 2017, the entire content of which is incorporated herein by reference.

FIELD OF THE INVENTION

The present invention relates to compounds for organic electronic devices, such as organic light emitting devices. More specifically, the present invention relates to a metal complex containing azabenzothiazole ligands, an organic electroluminescent device and a formulation comprising the metal complex.

BACKGROUND ART

An organic electronic device is preferably selected from the group consisting of organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (*Applied Physics Letters,* 1987, 51 (12): 913-915). Once a bias is applied to the device, green light was emitted from the device. This invention laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since OLED is a self-emitting solid state device, it offers tremendous potential for display and lighting applications. In addition, the inherent properties of organic materials, such as their flexibility, may make them well suited for particular applications such as fabrication on flexible substrates.

OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of a fluorescent OLED is only 25%. This limitation hindered the commercialization of OLED. In 1997, Forrest and Thompson reported phosphorescent OLED, which uses triplet emission from heave metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. Small molecule refers to any organic or organometallic material that is not a polymer. The molecular weight of a small molecule can be large as long as it has well defined structure. Dendrimers with well-defined structures are considered as small molecules. Polymer OLEDs include conjugated polymers and non-conjugated polymers with pendant emitting groups. Small molecule OLED can become a polymer OLED if post polymerization occurred during the fabrication process.

There are various methods for OLED fabrication. Small molecule OLEDs are generally fabricated by vacuum thermal evaporation. Polymer OLEDs are fabricated by solution process, such as spin-coating, ink-jet printing, and nozzle printing. Small molecule OLEDs can also be fabricated by solution process if the materials can be dissolved or dispersed in solvents.

The emitting color of an OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent emitters still suffer from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

Compounds containing benzothiazole ligands have been used in phosphorescent OLEDs, but their properties do not meet the requirements, such as color saturation. The present invention provides a series of new metal complexes containing azabenzothiazole ligands. It has been found through investigation that the use of these compounds as emitters in phosphorescent OLED devices enables to obtain more saturated color than the compounds containing benzothiazole ligands.

SUMMARY OF THE INVENTION

The present invention aims to provide a series of new metal complexes containing azabenzothiazole ligands to solve at least part of above problems. The metal complexes can be used as emitters in the emissive layer of an organic electroluminescent device. Compared to existing compounds containing benzothiazole ligands, the use of these compounds as emitters in phosphorescent OLED devices enables to obtain more saturated color and better device performance.

According to an embodiment of the present invention, a metal complex having a partial structure represented by Formula 1 is disclosed:

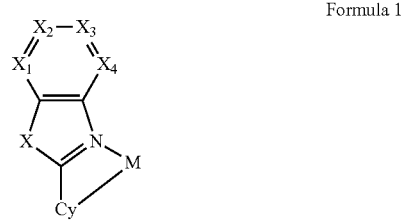

Formula 1

Wherein Cy is a substituted or unsubstituted aryl or heteroaryl group having 5 to 24 aromatic ring atoms;
wherein Cy is bonded to M via a carbon atom;
wherein M is selected from the group consisting of Cu, Ag, Au, Ru, Rh, Pd, Os, Ir, and Pt;
wherein X is selected from the group consisting of O, S, and Se;
wherein $X_1$ to $X_4$ are independently selected from N or CR;
at least one of $X_1$ to $X_4$ is N;
wherein R is selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;
two adjacent substituents are optionally joined to form a ring.

According to another embodiment, an electroluminescent device is disclosed, which comprising:
an anode,
a cathode,
and an organic layer, disposed between the anode and the cathode, the organic layer comprises a metal complex having a partial structure represented by Formula 1:

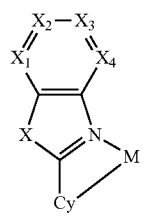

Formula 1

Wherein Cy is a substituted or unsubstituted aryl or heteroaryl group having 5 to 24 aromatic ring atoms;
wherein Cy is bonded to M via a carbon atom;
wherein M is selected from the group consisting of Cu, Ag, Au, Ru, Rh, Pd, Os, Ir, and Pt;
wherein X is selected from the group consisting of O, S, and Se;
wherein $X_1$ to $X_4$ are independently selected from N or CR;
at least one of $X_1$ to $X_4$ is N;
wherein R is selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;
two adjacent substituents are optionally joined to form a ring.

According to yet another embodiment, a formulation comprising the metal complex is also disclosed. The metal complex comprises a partial structure represented by Formula 1.

The metal complexes containing azabenzothiazole ligands disclosed in the present invention can be used as emitters in the emissive layer of an organic electroluminescent device. Compared to existing compounds containing benzothiazole ligands, the use of these novel compounds as emitters in phosphorescent OLED devices can obtain more saturated color and better device performance.

DETAILED DESCRIPTION

Figure 1:
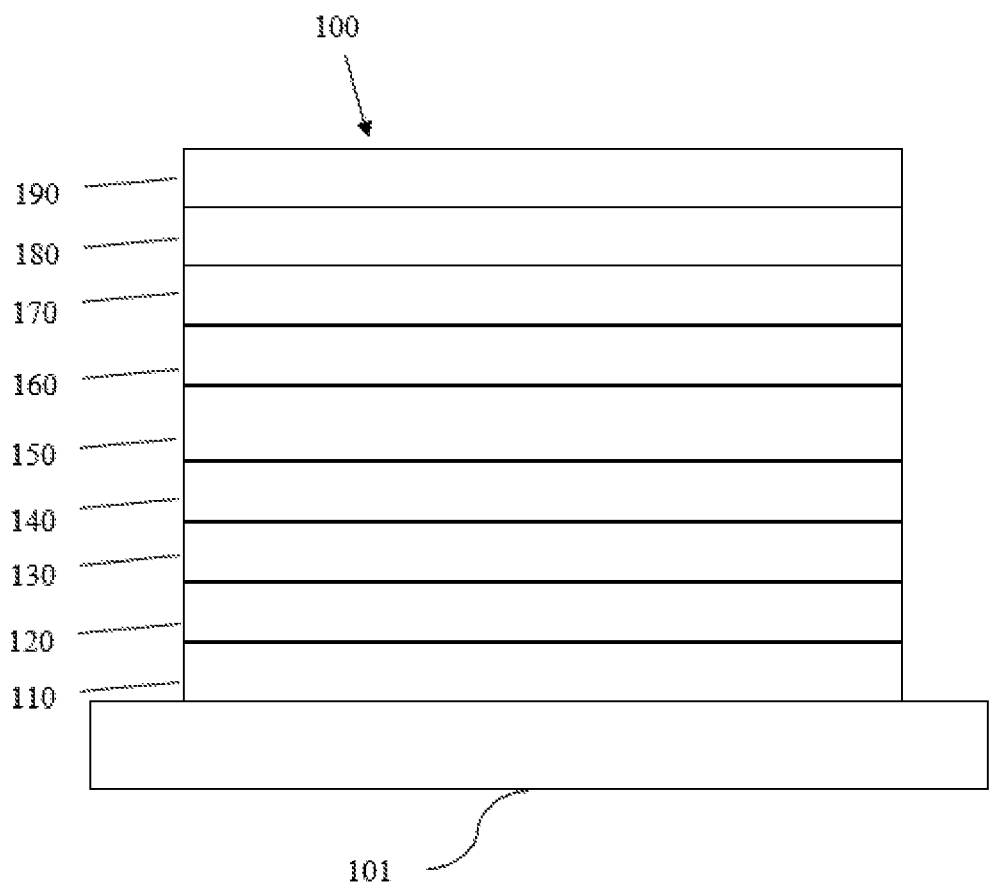
FIG. 1 schematically shows an organic light emitting device that can incorporate the metal complex or formulation disclosed herein.

OLEDs can be fabricated on various types of substrates such as glass, plastic, and metal foil. FIG. 1 schematically shows the organic light emitting device 100 without limitation. The figures are not necessarily drawn to scale. Some of the layer in the figure can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, which are incorporated by reference in its entirety.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

The layered structure described above is provided by way of non-limiting example. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have a two layers of different emitting materials to achieve desired emission spectrum.

In one embodiment, an OLED may be described as having an "organic layer" disposed between a cathode and an anode. This organic layer may comprise a single layer or multiple layers.

Figure 2:
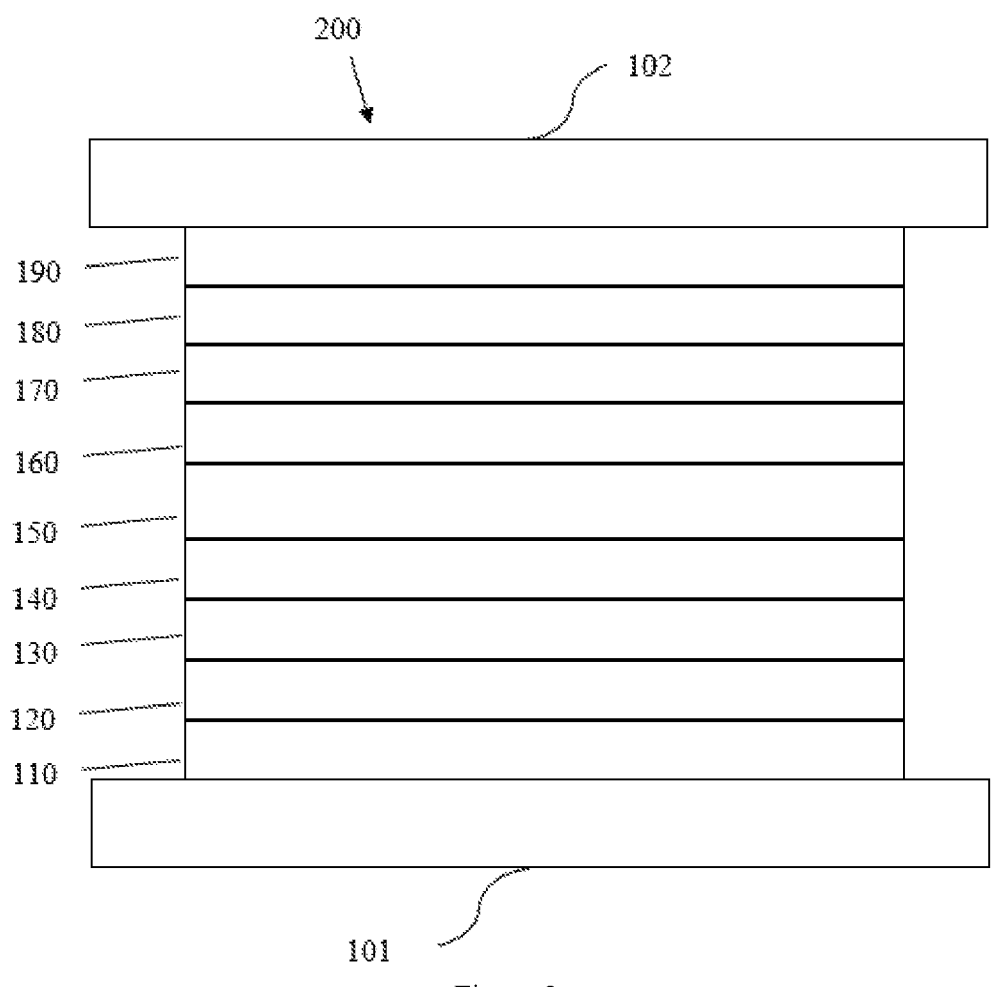
FIG. 2 schematically shows another organic light emitting device that can incorporate the metal complex or formulation disclosed herein.
Figure 3:
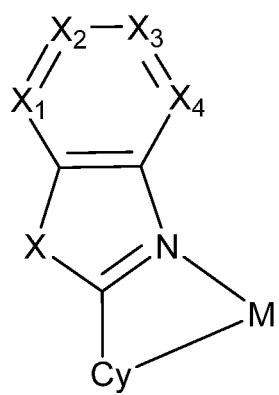
FIG. 3 shows the Formula 1 of metal complex having a partial structure disclosed herein.

An OLED can be encapsulated by a barrier layer to protect it from harmful species from the environment such as moisture and oxygen. FIG. 2 schematically shows the organic light emitting device 200 without limitation. FIG. 2 differs from FIG. 1 in that the organic light emitting device 200 include a barrier layer 102, which is above the cathode 190. Any material that can provide the barrier function can be used as the barrier layer such as glass and organic-inorganic hybrid layers. The barrier layer should be placed directly or indirectly outside of the OLED device. Multi-layer thin film encapsulation was described in U.S. Pat. No. 7,968,146, which is herein incorporated by reference in its entirety.

Devices fabricated in accordance with embodiments of the invention can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small $\Delta E_{S-T}$. These states may involve CT states. Often, donor-acceptor luminescent materials are constructed by connecting an electron donor moiety such as amino- or carbazole-derivatives and an electron acceptor moiety such as N-containing six-membered aromatic rings.

Definition of Terms of Substituents halogen or halide—as used herein includes fluorine, chlorine, bromine, and iodine.

Alkyl—contemplates both straight and branched chain alkyl groups. Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, 3-methylpentyl group. Additionally, the alkyl group may be optionally substituted. The carbons in the alkyl chain can be replaced by other hetero atoms. Of the above, preferred are methyl group, ethyl group, propyl group, isopropyl group, n-butyl group, s-butyl group, isobutyl group, t-butyl group, n-pentyl group, and neopentyl group.

Cycloalkyl—as used herein contemplates cyclic alkyl groups. Preferred cycloalkyl groups are those containing 4 to 10 ring carbon atoms and includes cyclobutyl, cyclopentyl, cyclohexyl, 4-methylcyclohexyl, 4,4-dimethylcylcohexyl, 1-adamantyl, 2-adamantyl, 1-norbornyl, 2-norbornyl and the like. Additionally, the cycloalkyl group may be optionally substituted. The carbons in the ring can be replaced by other hetero atoms.

Alkenyl—as used herein contemplates both straight and branched chain alkene groups. Preferred alkenyl groups are those containing two to fifteen carbon atoms. Examples of the alkenyl group include vinyl group, allyl group, 1-butenyl group, 2-butenyl group, 3-butenyl group, 1,3-butandienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl1-butenyl group, and 3-phenyl-1-butenyl group. Additionally, the alkenyl group may be optionally substituted.

Alkynyl—as used herein contemplates both straight and branched chain alkyne groups. Preferred alkynyl groups are those containing two to fifteen carbon atoms. Additionally, the alkynyl group may be optionally substituted.

Aryl or aromatic group—as used herein contemplates noncondensed and condensed systems. Preferred aryl groups are those containing six to sixty carbon atoms, preferably six to twenty carbon atoms, more preferably six to twelve carbon atoms. Examples of the aryl group include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl group may be optionally substituted. Examples of the non-condensed aryl group include phenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenylyl group, 4"-t-butyl p-terphenyl-4-yl group, o-cumenyl group, m-cumenyl group, p-cumenyl group, 2,3-xylyl group, 3,4-xylyl group, 2,5-xylyl group, mesityl group, and m-quarterphenyl group.

Heterocyclic group or heterocycle—as used herein contemplates aromatic and non-aromatic cyclic groups. Heteroaromatic also means heteroaryl. Preferred non-aromatic heterocyclic groups are those containing 3 to 7 ring atoms which includes at least one hetero atom such as nitrogen, oxygen, and sulfur. The heterocyclic group can also be an aromatic heterocyclic group having at least one heteroatom selected from nitrogen atom, oxygen atom, sulfur atom, and selenium atom.

Heteroaryl—as used herein contemplates noncondensed and condensed hetero-aromatic groups that may include from one to five heteroatoms. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—it is represented by —O-Alkyl. Examples and preferred examples thereof are the same as those described above. Examples of the alkoxy group having 1 to 20 carbon atoms, preferably 1 to 6 carbon atoms include methoxy group, ethoxy group, propoxy group, butoxy group, pentyloxy group, and hexyloxy group. The alkoxy group having 3 or more carbon atoms may be linear, cyclic or branched.

Aryloxy—it is represented by —O-Aryl or —O-heteroaryl. Examples and preferred examples thereof are the same as those described above. Examples of the aryloxy group having 6 to 40 carbon atoms include phenoxy group and biphenyloxy group.

Arylalkyl—as used herein contemplates an alkyl group that has an aryl substituent. Additionally, the arylalkyl group may be optionally substituted. Examples of the arylalkyl group include benzyl group, 1-phenylethyl group, 2-phenylethyl group, 1-phenylisopropyl group, 2-phenylisopropyl group, phenyl-t-butyl group, alpha.-naphthylmethyl group, 1-alpha.-naphthylethyl group, 2-alpha-naphthylethyl group, 1-alpha-naphthylisopropyl group, 2-alpha-naphthylisopropyl group, beta-naphthylmethyl group, 1-beta-naphthylethyl group, 2-beta-naphthylethyl group, 1-beta-naphthylisopropyl group, 2-beta-naphthylisopropyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro2-phenylisopropyl group. Of the above, preferred are benzyl group, p-cyanobenzyl group, m-cyanobenzyl group, o-cyanobenzyl group, 1-phenylethyl group, 2-phenylethyl group, 1-phenylisopropyl group, and 2-phenylisopropyl group.

The term "aza" in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline,dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, arylalkyl, alkoxy, aryloxy, amino, cyclic amino, silyl, alkenyl, cycloalkenyl, heteroalkenyl, alkynyl, aryl, heteroaryl, an acyl group, a carbonyl group, a carboxylic acid group, an ether group, an ester group, a nitrile group, an isonitrile group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in this disclosure, the hydrogen atoms can be partially or fully replaced by deuterium. Other atoms such as carbon and nitrogen, can also be replaced by their other stable isotopes. The replacement by other stable isotopes in the compounds may be preferred due to its enhancements of device efficiency and stability.

In the compounds mentioned in this disclosure, multiple substitutions refer to a range that includes a double substitution, up to the maximum available substitutions.

In the compounds mentioned in this disclosure, the expression that adjacent substituents are optionally joined to form a ring is intended to be taken to mean that two radicals are linked to each other by a chemical bond. This is illustrated by the following scheme:

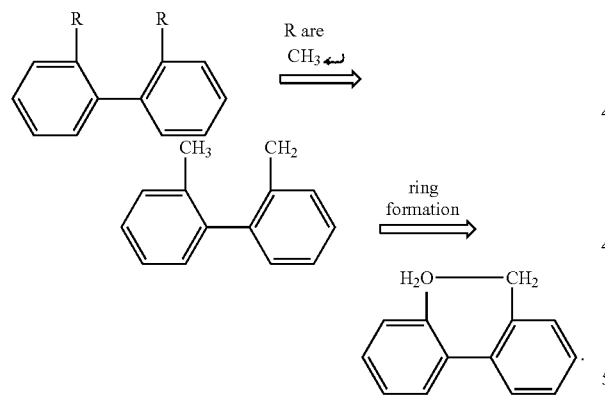

Furthermore, the expression that adjacent substituents are optionally joined to form a ring is also intended to be taken to mean that in the case where one of the two radicals represents hydrogen, the second radical is bonded at a position to which the hydrogen atom was bonded, with formation of a ring. This is illustrated by the following scheme:

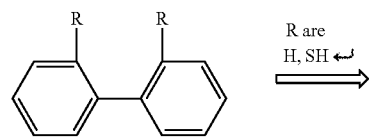

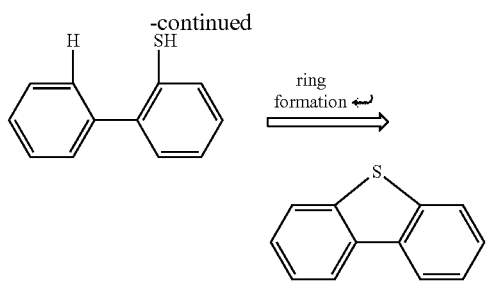

According to an embodiment of the present invention, a metal complex having a partial structure represented by Formula 1 is disclosed:

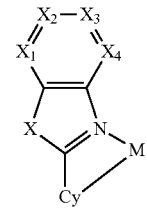

Formula 1

Wherein

Cy is a substituted or unsubstituted aryl or heteroaryl group having 5 to 24 aromatic ring atoms;

Cy is bonded to M via a carbon atom;

M is selected from the group consisting of Cu, Ag, Au, Ru, Rh, Pd, Os, Ir, and Pt;

X is selected from the group consisting of O, S, and Se;

$X_1$, $X_2$, $X_3$, and $X_4$ are independently selected from N or CR;

at least one of $X_1$, $X_2$, $X_3$, and $X_4$ is N;

wherein R is selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

two adjacent substituents are optionally joined to form a ring;

In this embodiment, when Cy is a substituted aryl or heteroaryl group having 5 to 24 aromatic ring atoms, it means that a mono-substitution, a di-substitution, or up to the maximum available substitutions may be present on the carbocyclic or heterocyclic group having 5 to 24 aromatic ring atoms. The above substitutions may each independently be selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof.

In one embodiment, wherein the metal is selected from the group consisting of Pt and Ir.

In one embodiment, wherein Cy has a partial structure selected from the group consisting of:

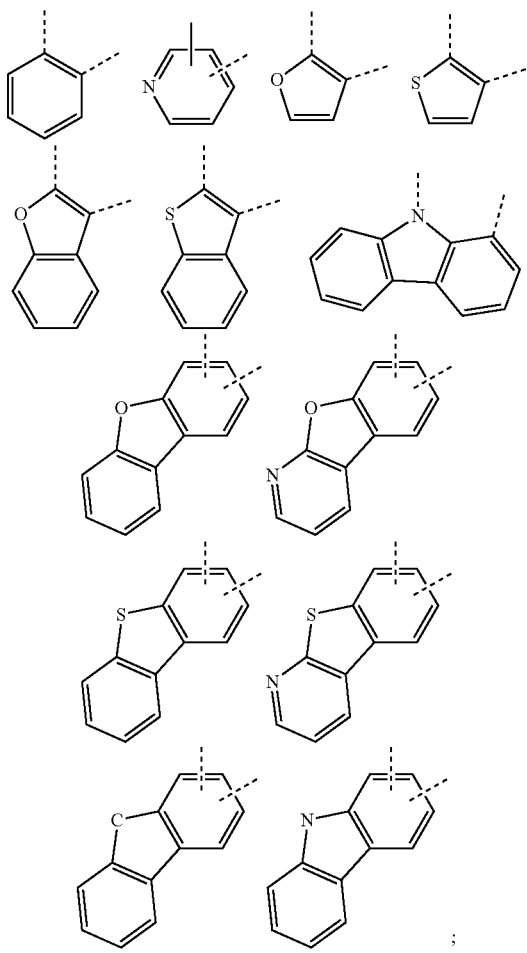

In this embodiment, Cy has a partial structure selected from the above group, it means that Cy comprises a substituted or unsubstituted group selected from the above group. When Cy is the substituted group, it means that there may be a mono-substitution, a di-substitution, or up to the maximum available substitution on the group. The above substitutions may each independently be selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof.

In one embodiment, wherein the complex has the formula of $M(L_a)_m(L_b)_n(L_c)_q$, wherein $L_b$ and $L_c$ are the second and third ligand coordinating to M, $L_b$ and $L_c$ can be the same of different;

$L_a$, $L_b$, and $L_c$ can be optionally joined to form a tetradentate or hexadentate ligand;

wherein m is 1, 2, or 3, n is 0, 1, or 2, q is 0, 1, or 2; m+n+q is the oxidation state of M.

In one embodiment, wherein $L_a$ is independently selected from the group consisting of:

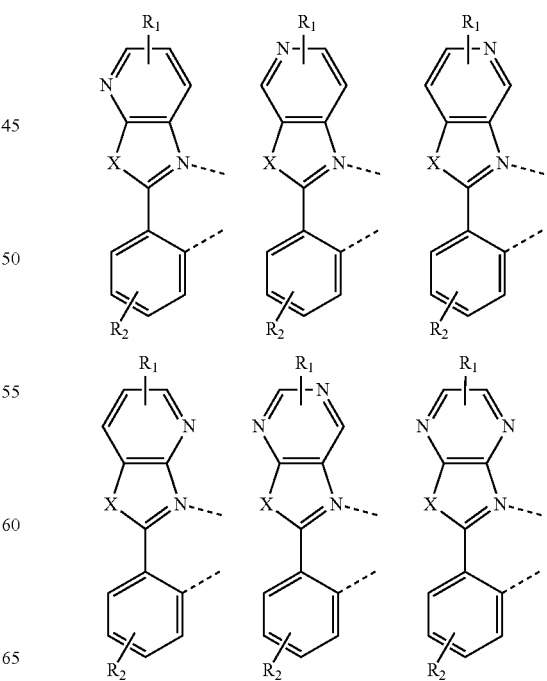

-continued

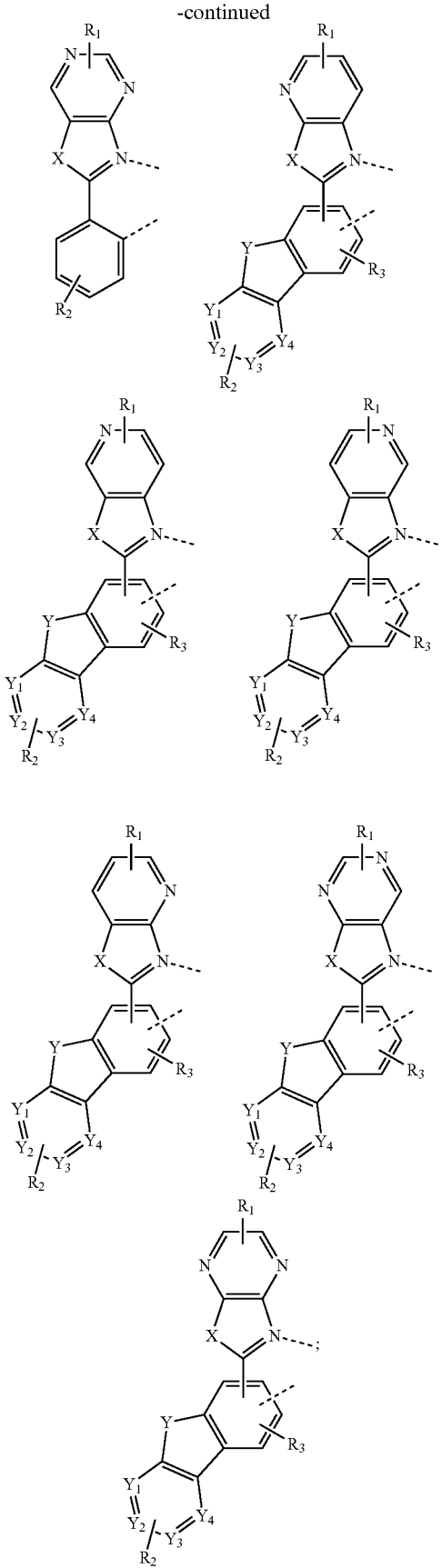

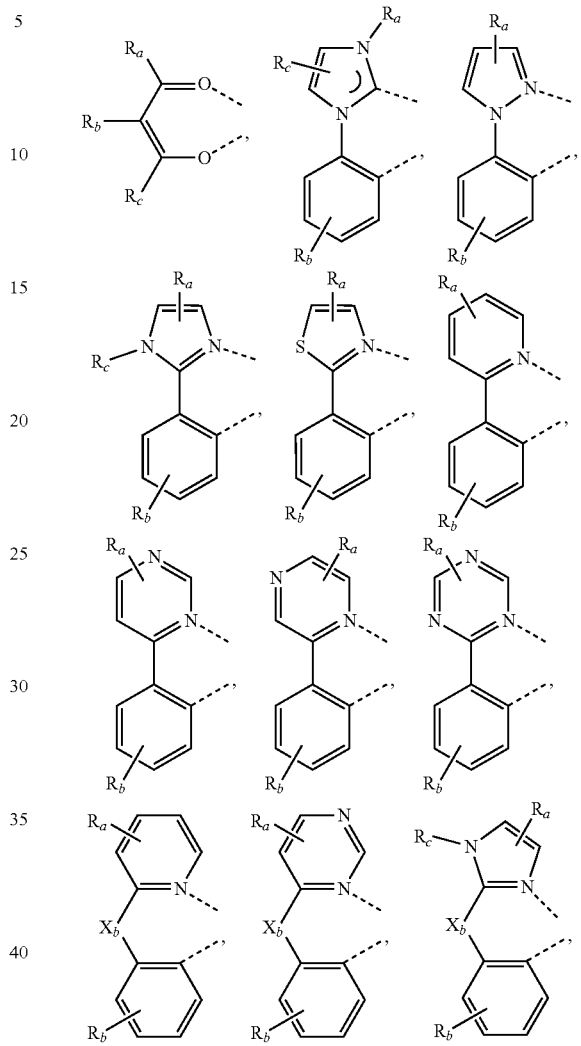

Wherein L_b and L_c are independently selected from the group consisting of:

Wherein
Y is selected from the group consisting of O, S, Se, NR', CR"R'";
$Y_1$, $Y_2$, $Y_3$, and $Y_4$ are each independently selected from the group consisting of N and CR"";
$R_1$, $R_2$, $R_3$, $R_a$, $R_b$, and $R_c$ can represent mono, di, tri, or tetra substitution or no substitution;
R', R", R'", R"", $R_1$, $R_2$, $R_3$, $R_a$, $R_b$, and $R_c$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

$X_b$ is selected from the group consisting of O, S, Se, $NR_{N1}$, and $CR_{C1}R_{C2}$;

$R_{N1}$, $R_{C1}$ and $R_{C2}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

two adjacent substituents are optionally joined to form a ring.

In one embodiment, wherein $L_a$ has the structure represented by Formula 2:

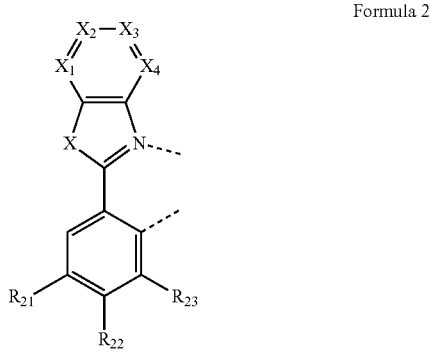

Formula 2 wherein $X_1$, $X_2$, $X_3$, $X_4$, X, $R_{21}$, $R_{22}$, and $R_{23}$ of Formula 2 are each selected from the group or the atom shown in the following table:

| Number | $X_1$ | $X_2$ | $X_3$ | $X_4$ | X | $R_{21}$ | $R_{22}$ | $R_{23}$ |
|---|---|---|---|---|---|---|---|---|
| La1. | N | CH | CH | CH | S | H | H | H |
| La2. | N | CH | CH | CH | S | $CH_3$ | H | H |
| La3. | N | CH | CH | CH | S | H | $CH_3$ | H |
| La4. | N | CH | CH | CH | S | $CH_3$ | H | $CH_3$ |
| La5. | N | CH | CH | CH | S | $CD_3$ | H | H |
| La6. | N | CH | CH | CH | S | H | $CD_3$ | H |
| La7. | N | CH | CH | CH | S | $CH_3$ | H | $CD_3$ |
| La8. | N | $CCH_3$ | CH | CH | S | H | H | H |
| La9. | N | ![isopropyl] | CH | CH | S | H | H | H |
| La10. | N | ![isobutyl] | CH | CH | S | H | H | H |
| La11. | N | ![tert-butyl] | CH | CH | S | H | H | H |
| La12. | N | ![cyclopentyl] | CH | CH | S | H | H | H |
| La13. | N | ![cyclohexyl] | CH | CH | S | H | H | H |
| La14. | N | ![methylcyclohexyl] | CH | CH | S | H | H | H |

-continued
| Number | X₁ | X₂ | X₃ | X₄ | X | R₂₁ | R₂₂ | R₂₃ |
|---|---|---|---|---|---|---|---|---|
| La15. | N |  | CH | CH | S | H | H | H |
| La16. | N | 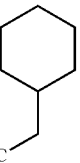 | CH | CH | S | H | H | H |
| La17. | N | CCD₃ | CH | CH | S | H | H | H |
| La18. | N |  | CH | CH | S | H | H | H |
| La19. | N | 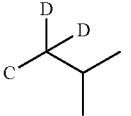 | CH | CH | S | H | H | H |
| La20. | N | 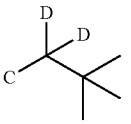 | CH | CH | S | H | H | H |
| La21. | N | 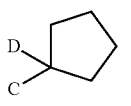 | CH | CH | S | H | H | H |
| La22. | N | 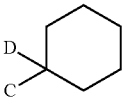 | CH | CH | S | H | H | H |
| La23. | N | 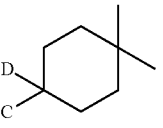 | CH | CH | S | H | H | H |
| La24. | N | 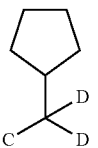 | CH | CH | S | H | H | H |
| La25. | N | 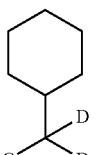 | CH | CH | S | H | H | H |
| La26. | N | CCH₃ | CH | CH | S | CH₃ | H | H |
| La27. | N |  | CH | CH | S | CH₃ | H | H |

-continued
| Number | X₁ | X₂ | X₃ | X₄ | X | R₂₁ | R₂₂ | R₂₃ |
|---|---|---|---|---|---|---|---|---|
| La28. | N | 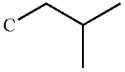 | CH | CH | S | CH₃ | H | H |
| La29. | N | 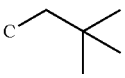 | CH | CH | S | CH₃ | H | H |
| La30. | N |  | CH | CH | S | CH₃ | H | H |
| La31. | N | 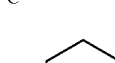 | CH | CH | S | CH₃ | H | H |
| La32. | N | 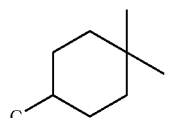 | CH | CH | S | CH₃ | H | H |
| La33. | N |  | CH | CH | S | CH₃ | H | H |
| La34. | N | 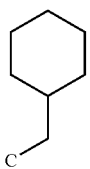 | CH | CH | S | CH₃ | H | H |
| La35. | N | CCD₃ | CH | CH | S | CD | H | H |
| La36. | N |  | CH | CH | S | CD₃ | H | H |
| La37. | N | 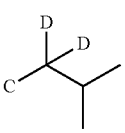 | CH | CH | S | CD₃ | H | H |
| La38. | N | 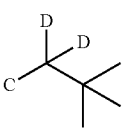 | CH | CH | S | CD₃ | H | H |
| La39. | N | 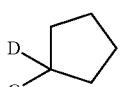 | CH | CH | S | CD₃ | H | H |
| La40. | N | 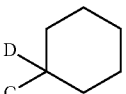 | CH | CH | S | CD₃ | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La41. | N | 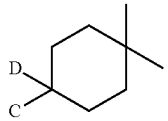 | CH | CH | S | $CD_3$ | H | H |
| La42. | N | 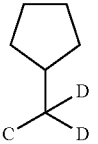 | CH | CH | S | $CD_3$ | H | H |
| La43. | N | 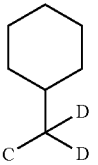 | CH | CH | S | $CD_3$ | H | H |
| La44. | N | $CCH_3$ | CH | CH | S | $CH_3$ | H | $CH_3$ |
| La45. | N |  | CH | CH | S | $CH_3$ | H | $CH_3$ |
| La46. | N | 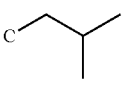 | CH | CH | S | $CH_3$ | H | $CH_3$ |
| La47. | N | 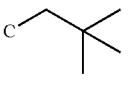 | CH | CH | S | $CH_3$ | H | $CH_3$ |
| La48. | N | 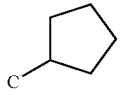 | CH | CH | S | $CH_3$ | H | $CH_3$ |
| La49. | N | 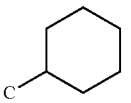 | CH | CH | S | $CH_3$ | H | $CH_3$ |
| La50. | N | 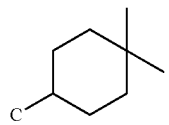 | CH | CH | S | $CH_3$ | H | $CH_3$ |
| La51. | N | 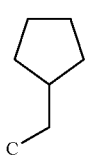 | CH | CH | S | $CH_3$ | H | $CH_3$ |
| La52. | N | 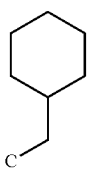 | CH | CH | S | $CH_3$ | H | $CH_3$ |
| La53. | N | $CCD_3$ | CH | CH | S | $CD_3$ | H | $CD_3$ |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La54. | N | *tert*-butyl-d1 (C-CD) | CH | CH | S | $CD_3$ | H | $CD_3$ |
| La55. | N | isobutyl-d2 | CH | CH | S | $CD_3$ | H | $CD_3$ |
| La56. | N | neopentyl-d2 | CH | CH | S | $CD_3$ | H | $CD_3$ |
| La57. | N | cyclopentyl-d1 | CH | CH | S | $CD_3$ | H | $CD_3$ |
| La58. | N | cyclohexyl-d1 | CH | CH | S | $CD_3$ | H | $CD_3$ |
| La59. | N | 4,4-dimethylcyclohexyl-d1 | CH | CH | S | $CD_3$ | H | $CD_3$ |
| La60. | N | cyclopentylmethyl-d2 | CH | CH | S | $CD_3$ | H | $CD_3$ |
| La61. | N | cyclohexylmethyl-d2 | CH | CH | S | $CD_3$ | H | $CD_3$ |
| La62. | N | CH | $CCH_3$ | CH | S | H | H | H |
| La63. | N | CH | isopropyl | CH | S | H | H | H |
| La64. | N | CH | isobutyl | CH | S | H | H | H |
| La65. | N | CH | neopentyl | CH | S | H | H | H |
| La66. | N | CH | cyclopentyl | CH | S | H | H | H |

-continued
| Number | X₁ | X₂ | X₃ | X₄ | X | R₂₁ | R₂₂ | R₂₃ |
|---|---|---|---|---|---|---|---|---|
| La67. | N | CH | 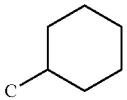 | CH | S | H | H | H |
| La68. | N | CH | 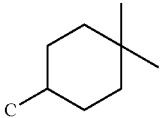 | CH | S | H | H | H |
| La69. | N | CH | 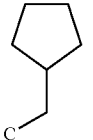 | CH | S | H | H | H |
| La70. | N | CH | 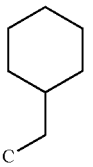 | CH | S | H | H | H |
| La71. | N | CH | CCD₃ | CH | S | H | H | H |
| La72. | N | CH |  | CH | S | H | H | H |
| La73. | N | CH | 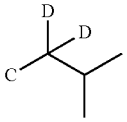 | CH | S | H | H | H |
| La74. | N | CH | 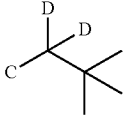 | CH | S | H | H | H |
| La75. | N | CH | 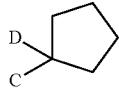 | CH | S | H | H | H |
| La76. | N | CH | 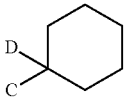 | CH | S | H | H | H |
| La77. | N | CH | 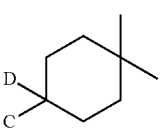 | CH | S | H | H | H |
| La78. | N | CH | 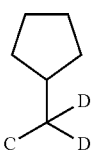 | CH | S | H | H | H |

-continued
| Number | X₁ | X₂ | X₃ | X₄ | X | R₂₁ | R₂₂ | R₂₃ |
|---|---|---|---|---|---|---|---|---|
| La79. | N | CH | 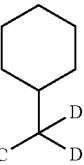 | CH | S | H | H | H |
| La80. | N | CH | CCH₃ | CH | S | CH₃ | H | H |
| La81. | N | CH |  | CH | S | CH₃ | H | H |
| La82. | N | CH | 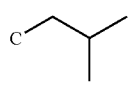 | CH | S | CH₃ | H | H |
| La83. | N | CH | 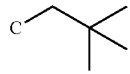 | CH | S | CH₃ | H | H |
| La84. | N | CH | 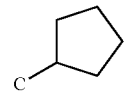 | CH | S | CH₃ | H | H |
| La85. | N | CH | 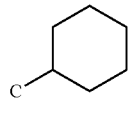 | CH | S | CH₃ | H | H |
| La86. | N | CH | 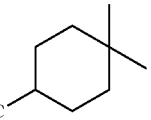 | CH | S | CH₃ | H | H |
| La87. | N | CH | 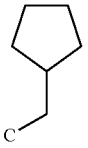 | CH | S | CH₃ | H | H |
| La88. | N | CH | 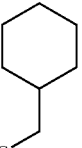 | CH | S | CH₃ | H | H |
| La89. | N | CH | CCD₃ | CH | S | CD₃ | H | H |
| La90. | N | CH |  | CH | S | CD₃ | H | H |
| La91. | N | CH | 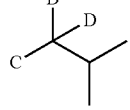 | CH | S | CD₃ | H | H |
| La92. | N | CH | 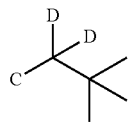 | CH | S | CD₃ | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La93. | N | CH | 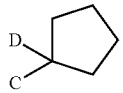 | CH | S | $CD_3$ | H | H |
| La94. | N | CH | 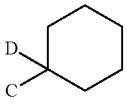 | CH | S | $CD_3$ | H | H |
| La95. | N | CH | 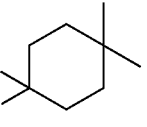 | CH | S | $CD_3$ | H | H |
| La96. | N | CH | 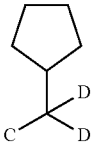 | CH | S | $CD_3$ | H | H |
| La97. | N | CH | 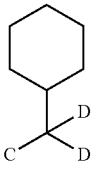 | CH | S | $CD_3$ | H | H |
| La98. | N | CH | $CCH_3$ | CH | S | $CH_3$ | H | $CH_3$ |
| La99. | N | CH |  | CH | S | $CH_3$ | H | $CH_3$ |
| La100. | N | CH | 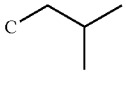 | CH | S | $CH_3$ | H | $CH_3$ |
| La101. | N | CH | 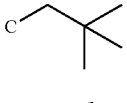 | CH | S | $CH_3$ | H | $CH_3$ |
| La102. | N | CH | 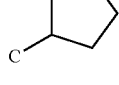 | CH | S | $CH_3$ | H | $CH_3$ |
| La103. | N | CH | 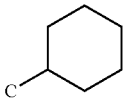 | CH | S | $CH_3$ | H | $CH_3$ |
| La104. | N | CH | 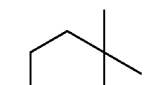 | CH | S | $CH_3$ | H | $CH_3$ |
| La105. | N | CH |  | CH | S | $CH_3$ | H | $CH_3$ |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La106. | N | CH | cyclohexyl-CH2- | CH | S | $CH_3$ | H | $CH_3$ |
| La107. | N | CH | $CCD_3$ | CH | S | $CD_3$ | H | $CD_3$ |
| La108. | N | CH | C(CH3)2D | CH | S | $CD_3$ | H | $CD_3$ |
| La109. | N | CH | CD2-CH(CH3)2 | CH | S | $CD_3$ | H | $CD_3$ |
| La110. | N | CH | CD2-C(CH3)3 | CH | S | $CD_3$ | H | $CD_3$ |
| La111. | N | CH | 1-D-cyclopentyl | CH | S | $CD_3$ | H | $CD_3$ |
| la112. | N | CH | 1-D-cyclohexyl | CH | S | $CD_3$ | H | $CD_3$ |
| La113. | N | CH | 4-D-4-methylcyclohexyl | CH | S | $CD_3$ | H | $CD_3$ |
| La114. | N | CH | cyclopentyl-CD2- | CH | S | $CD_3$ | H | $CD_3$ |
| La115. | N | CH | cyclohexyl-CD2- | CH | S | $CD_3$ | H | $CD_3$ |
| La116. | N | CH | CH | CH | Se | H | H | H |
| La117. | N | CH | CH | CH | Se | $CH_3$ | H | H |
| La118. | N | CH | CH | CH | Se | H | $CH_3$ | H |
| La119. | N | CH | CH | CH | Se | $CH_3$ | H | $CH_3$ |
| La120. | N | CH | CH | CH | Se | $CD_3$ | H | H |
| La121. | N | CH | CH | CH | Se | H | $CD_3$ | H |
| La122. | N | CH | CH | CH | Se | $CH_3$ | H | $CD_3$ |
| La123. | N | $CCH_3$ | CH | CH | Se | H | H | H |
| La124. | N | CH(CH3)2 | CH | CH | Se | H | H | H |

-continued
| Number | X₁ | X₂ | X₃ | X₄ | X | R₂₁ | R₂₂ | R₂₃ |
|---|---|---|---|---|---|---|---|---|
| La125. | N | 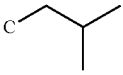 | CH | CH | Se | H | H | H |
| La126. | N | 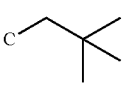 | CH | CH | Se | H | H | H |
| La127. | N | 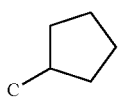 | CH | CH | Se | H | H | H |
| La128. | N | 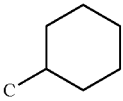 | CH | CH | Se | H | H | H |
| La129. | N | 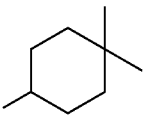 | CH | CH | Se | H | H | H |
| La130. | N | 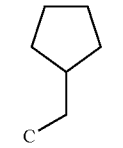 | CH | CH | Se | H | H | H |
| La131. | N | 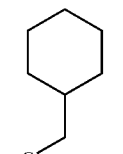 | CH | CH | Se | H | H | H |
| La132. | N | CCD₃ | CH | CH | Se | H | H | H |
| La133. | N |  | CH | CH | Se | H | H | H |
| La134. | N | 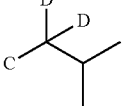 | CH | CH | Se | H | H | H |
| La135. | N | 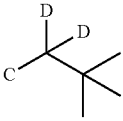 | CH | CH | Se | H | H | H |
| La136. | N | 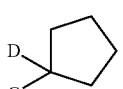 | CH | CH | Se | H | H | H |
| La137. | N | 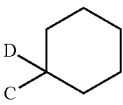 | CH | CH | Se | H | H | H |

-continued
| Number | X$_1$ | X$_2$ | X$_3$ | X$_4$ | X | R$_{21}$ | R$_{22}$ | R$_{23}$ |
|---|---|---|---|---|---|---|---|---|
| La138. | N | 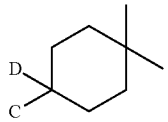 | CH | CH | Se | H | H | H |
| La139. | N | 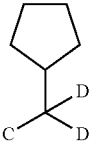 | CH | CH | Se | H | H | H |
| La140. | N | 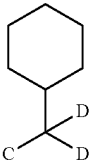 | CH | CH | Se | H | H | H |
| La141. | N | CCH$_3$ | H | H | Se | CH$_3$ | H | H |
| La142. | N |  | CH | CH | Se | CH$_3$ | H | H |
| La143. | N | 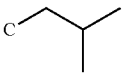 | CH | CH | Se | CH$_3$ | H | H |
| La144. | N | 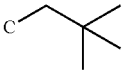 | CH | CH | Se | CH$_3$ | H | H |
| La145. | N | 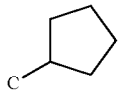 | CH | CH | Se | CH$_3$ | H | H |
| La146. | N | 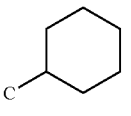 | CH | CH | Se | CH$_3$ | H | H |
| La147. | N | 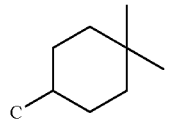 | CH | CH | Se | CH$_3$ | H | H |
| La148. | N | 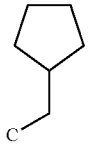 | CH | CH | Se | CH$_3$ | H | H |
| La149. | N | 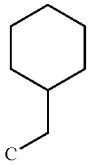 | CH | CH | Se | CH$_3$ | H | H |
| La150. | N | CCD$_3$ | CH | CH | Se | CD$_3$ | H | H |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La151. | N | ![isopropyl-d1 group, C-C(D)(CH3)2] | CH | CH | Se | $CD_3$ | H | H |
| La152. | N | ![CD2-CH(CH3)2 group] | CH | CH | Se | $CD_3$ | H | H |
| La153. | N | ![CD2-C(CH3)3 group] | CH | CH | Se | $CD_3$ | H | H |
| La154. | N | ![1-deutero-cyclopentyl] | CH | CH | Se | $CD_3$ | H | H |
| La155. | N | ![1-deutero-cyclohexyl] | CH | CH | Se | $CD_3$ | H | H |
| La156. | N | ![1-deutero-4-methylcyclohexyl] | CH | CH | Se | $CD_3$ | H | H |
| La157. | N | ![cyclopentyl-CD2-] | CH | CH | Se | $CD_3$ | H | H |
| La158. | N | ![cyclohexyl-CD2-] | CH | CH | Se | $CD_3$ | H | H |
| La159. | N | $CCH_3$ | CH | CH | Se | $CH_3$ | H | $CH_3$ |
| La160. | N | ![isobutyl group] | CH | CH | Se | $CH_3$ | H | $CH_3$ |
| La161. | N | ![CH2-CH(CH3)2] | CH | CH | Se | $CH_3$ | H | $CH_3$ |
| La162. | N | ![CH2-C(CH3)3] | CH | CH | Se | $CH_3$ | H | $CH_3$ |
| La163. | N | ![cyclopentyl] | CH | CH | Se | $CH_3$ | H | $CH_3$ |
| La164. | N | ![cyclohexyl] | CH | CH | Se | $CH_3$ | H | $CH_3$ |

-continued
| Number | X₁ | X₂ | X₃ | X₄ | X | R₂₁ | R₂₂ | R₂₃ |
|---|---|---|---|---|---|---|---|---|
| La165. | N | 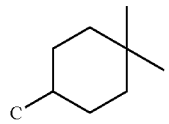 | CH | CH | Se | CH₃ | H | CH₃ |
| La166. | N | 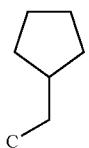 | CH | CH | Se | CH₃ | H | CH₃ |
| La167. | N | 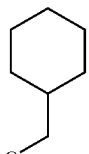 | CH | CH | Se | CH₃ | H | CH₃ |
| La168. | N | CCD₃ | CH | CH | Se | CD₃ | H | CD₃ |
| La169. | N | 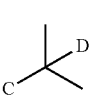 | CH | CH | Se | CD₃ | H | CD₃ |
| La170. | N | 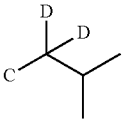 | CH | CH | Se | CD₃ | H | CD₃ |
| La171. | N | 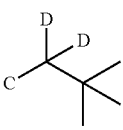 | CH | CH | Se | CD₃ | H | CD₃ |
| La172. | N | 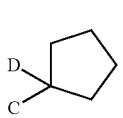 | CH | CH | Se | CD₃ | H | CD₃ |
| La173. | N | 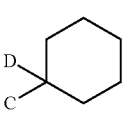 | CH | CH | Se | CD₃ | H | CD₃ |
| La174. | N | 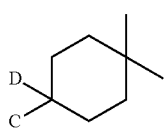 | CH | CH | Se | CD₃ | H | CD₃ |
| La175. | N | 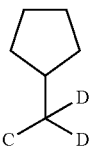 | CH | CH | Se | CD₃ | H | CD₃ |
| La176. | N | 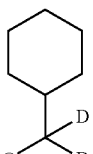 | CH | CH | Se | CD₃ | H | CD₃ |

-continued
| Number | X₁ | X₂ | X₃ | X₄ | X | R₂₁ | R₂₂ | R₂₃ |
|---|---|---|---|---|---|---|---|---|
| La177. | N | CH | CCH₃ | CH | Se | H | H | H |
| La178. | N | CH |  | CH | Se | H | H | H |
| La179. | N | CH |  | CH | Se | H | H | H |
| La180. | N | CH |  | CH | Se | H | H | H |
| La181. | N | CH |  | CH | Se | H | H | H |
| La182. | N | CH |  | CH | Se | H | H | H |
| La183. | N | CH |  | CH | Se | H | H | H |
| La184. | N | CH |  | CH | Se | H | H | H |
| La185. | N | CH |  | CH | Se | H | H | H |
| La186. | N | CH | CCD₃ | CH | Se | H | H | H |
| La187. | N | CH |  | CH | Se | H | H | H |
| La188. | N | CH |  | CH | Se | H | H | H |
| La189. | N | CH |  | CH | Se | H | H | H |
| La190. | N | CH |  | CH | Se | H | H | H |

-continued
| Number | X₁ | X₂ | X₃ | X₄ | X | R₂₁ | R₂₂ | R₂₃ |
|---|---|---|---|---|---|---|---|---|
| La191. | N | CH | 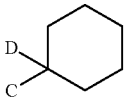 | CH | Se | H | H | H |
| La192. | N | CH | 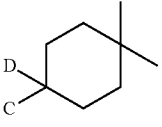 | CH | Se | H | H | H |
| La193. | N | CH | 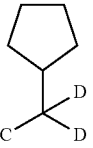 | CH | Se | H | H | H |
| La194. | N | CH | 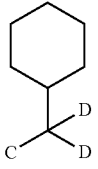 | CH | Se | H | H | H |
| La195. | N | CH | CCH₃ | CH | Se | CH₃ | H | H |
| La196. | N | CH |  | CH | Se | CH₃ | H | H |
| La197. | N | CH |  | CH | Se | CH₃ | H | H |
| La198. | N | CH | 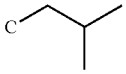 | CH | Se | CH₃ | H | H |
| La199. | N | CH | 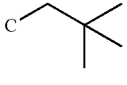 | CH | Se | CH₃ | H | H |
| La200. | N | CH | 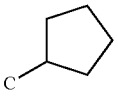 | CH | Se | CH₃ | H | H |
| La201. | N | CH | 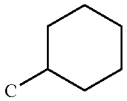 | CH | Se | CH₃ | H | H |
| La202. | N | CH | 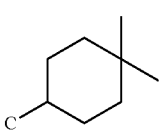 | CH | Se | CH₃ | H | H |
| La203. | N | CH | 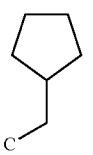 | CH | Se | CH₃ | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La204. | N | CH | CCD$_3$ | CH | Se | CD$_3$ | H | H |
| La205. | N | CH |  | CH | Se | CD$_3$ | H | H |
| La206. | N | CH | 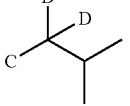 | CH | Se | CD$_3$ | H | H |
| La207. | N | CH | 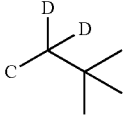 | CH | Se | CD$_3$ | H | H |
| La208. | N | CH | 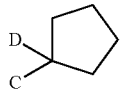 | CH | Se | CD$_3$ | H | H |
| La209. | N | CH | 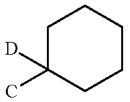 | CH | Se | CD$_3$ | H | H |
| La210. | N | CH | 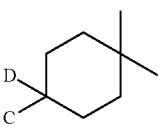 | CH | Se | CD$_3$ | H | H |
| La211. | N | CH | 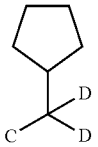 | CH | Se | CD$_3$ | H | H |
| La212. | N | CH | 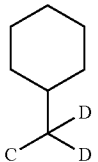 | CH | Se | CD$_3$ | H | H |
| La213. | N | CH | CCH$_3$ | CH | Se | CH$_3$ | H | CH$_3$ |
| La214. | N | CH | 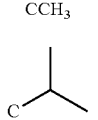 | CH | Se | CH$_3$ | H | CH$_3$ |
| La215. | N | CH | 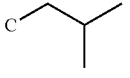 | CH | Se | CH$_3$ | H | CH$_3$ |
| La216. | N | CH | 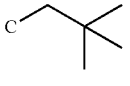 | CH | Se | CH$_3$ | H | CH$_3$ |
| La217. | N | CH | 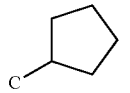 | CH | Se | CH$_3$ | H | CH$_3$ |

-continued
| Number | X₁ | X₂ | X₃ | X₄ | X | R₂₁ | R₂₂ | R₂₃ |
|---|---|---|---|---|---|---|---|---|
| La218. | N | CH | 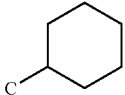 | CH | Se | CH₃ | H | CH₃ |
| La219. | N | CH | 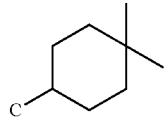 | CH | Se | CH₃ | H | CH₃ |
| La220. | N | CH | 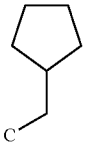 | CH | Se | CH₃ | H | CH₃ |
| La221. | N | CH | 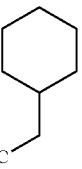 | CH | Se | CH₃ | H | CH₃ |
| La222. | N | CH | CCD₃ | CH | Se | CD₃ | H | CD₃ |
| La223. | N | CH |  | CH | Se | CD₃ | H | CD₃ |
| La224. | N | CH | 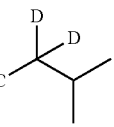 | CH | Se | CD₃ | H | CD₃ |
| La225. | N | CH | 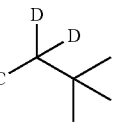 | CH | Se | CD₃ | H | CD₃ |
| La226. | N | CH | 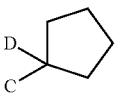 | CH | Se | CD₃ | H | CD₃ |
| La227. | N | CH | 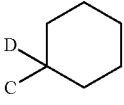 | CH | Se | CD₃ | H | CD₃ |
| La228. | N | CH | 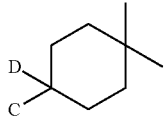 | CH | Se | CD₃ | H | CD₃ |
| La229. | N | CH | 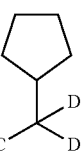 | CH | Se | CD₃ | H | CD₃ |

-continued
| Number | X₁ | X₂ | X₃ | X₄ | X | R₂₁ | R₂₂ | R₂₃ |
|---|---|---|---|---|---|---|---|---|
| La230. | N | CH | 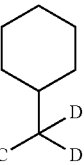 | CH | Se | CD₃ | H | CD₃ |
| La231. | CH | N | | CH | S | H | H | H |
| La232. | CH | N | | CH | S | CH₃ | H | H |
| La233. | CH | N | | CH | S | H | CH₃ | H |
| La234. | CH | N | | CH | S | CH₃ | H | CH₃ |
| La235. | CH | N | | CH | S | CD₃ | H | H |
| La236. | CH | N | | CH | S | H | CD₃ | H |
| La237. | CH | N | | CH | S | CH₃ | H | CD₃ |
| La238. | CCH₃ | N | | CH | S | H | H | H |
| La239. |  | N | | CH | S | H | H | H |
| La240. | 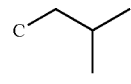 | N | | CH | S | H | H | H |
| La241. | 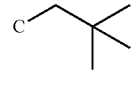 | N | | CH | S | H | H | H |
| La242. | 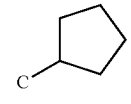 | N | | CH | S | H | H | H |
| La243. | 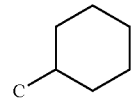 | N | | CH | S | H | H | H |
| La244. | 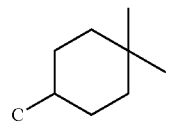 | N | | CH | S | H | H | H |
| La245. | 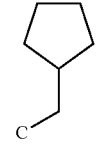 | N | | CH | S | H | H | H |
| La246. | 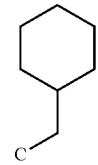 | N | | CH | S | H | H | H |
| La247. | CCD₃ | N | | CH | S | H | H | H |
| La248. | 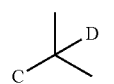 | N | | CH | S | H | H | H |
| La249. | 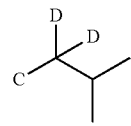 | N | | CH | S | H | H | H |

-continued

| Number | X₁ | X₂ | X₃ | X₄ | X | R₂₁ | R₂₂ | R₂₃ |
|---|---|---|---|---|---|---|---|---|
| La250. | *neopentyl-d2* | N | CH | CH | S | H | H | H |
| La251. | *cyclopentyl-d1* | N | CH | CH | S | H | H | H |
| La252. | *cyclohexyl-d1* | N | CH | CH | S | H | H | H |
| La253. | *4-methylcyclohexyl-d1* | N | CH | CH | S | H | H | H |
| La254. | *cyclopentylmethyl-d2* | N | CH | CH | S | H | H | H |
| La255. | *cyclohexylmethyl-d2* | N | CH | CH | S | H | H | H |
| La256. | CCH₃ | N | CH | CH | S | CH₃ | H | H |
| La257. | *isopropyl* | N | CH | CH | S | CH₃ | H | H |
| La258. | *isobutyl* | N | CH | CH | S | CH₃ | H | H |
| La259. | *neopentyl* | N | CH | CH | S | CH₃ | H | H |
| La260. | *cyclopentyl* | N | CH | CH | S | CH₃ | H | H |
| La261. | *cyclohexyl* | N | CH | CH | S | CH₃ | H | H |
| La262. | *4-methylcyclohexyl* | N | CH | CH | S | CH₃ | H | H |

-continued
| Number | X₁ | X₂ | X₃ | X₄ | X | R₂₁ | R₂₂ | R₂₃ |
|---|---|---|---|---|---|---|---|---|
| La263. | 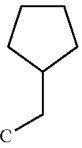 | N | CH | CH | S | CH₃ | H | H |
| La264. | 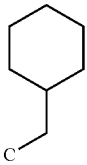 | N | CH | CH | S | CH₃ | H | H |
| La265. | CCD₃ | N | CH | CH | S | CD₃ | H | H |
| La266. |  | N | CH | CH | S | CD₃ | H | H |
| La267. | 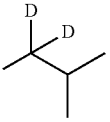 | N | CH | CH | S | CD₃ | H | H |
| La268. | 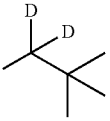 | N | CH | CH | S | CD₃ | H | H |
| La269. |  | N | CH | CH | S | CD₃ | H | H |
| La270. |  | N | CH | CH | S | CD₃ | H | H |
| La271. | 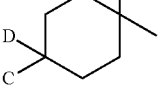 | N | CH | CH | S | CD₃ | H | H |
| La272. | 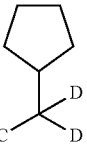 | N | CH | CH | S | CD₃ | H | H |
| La273. | 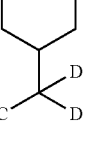 | N | CH | CH | S | CD₃ | H | H |
| La274. | CCH₃ | N | CH | CH | S | CH₃ | H | CH₃ |
| La275. |  | N | CH | CH | S | CH₃ | H | CH₃ |

-continued
| Number | X₁ | X₂ | X₃ | X₄ | X | R₂₁ | R₂₂ | R₂₃ |
|---|---|---|---|---|---|---|---|---|
| La276. | 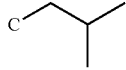 | N | CH | CH | S | CH₃ | H | CH₃ |
| La277. | 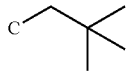 | N | CH | CH | S | CH₃ | H | CH₃ |
| La278. | 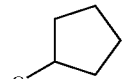 | N | CH | CH | S | CH₃ | H | CH₃ |
| La279. | 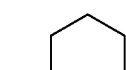 | N | CH | CH | S | CH₃ | H | CH₃ |
| La280. | 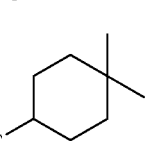 | N | CH | CH | S | CH₃ | H | CH₃ |
| La281. | 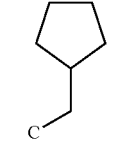 | N | CH | CH | S | CH₃ | H | CH₃ |
| La282. | 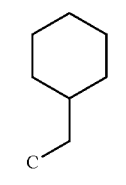 | N | CH | CH | S | CH₃ | H | CH₃ |
| La283. | CCD₃ | N | CH | CH | S | CD₃ | H | CD₃ |
| La284. | 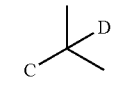 | N | CH | CH | S | CD₃ | H | CD₃ |
| La285. | 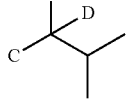 | N | CH | CH | S | CD₃ | H | CD₃ |
| La286. | 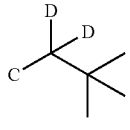 | N | CH | CH | S | CD₃ | H | CD₃ |
| La287. | 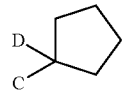 | N | CH | CH | S | CD₃ | H | CD₃ |
| La288. | 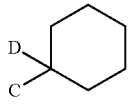 | N | CH | CH | S | CD₃ | H | CD₃ |

-continued

| Number | X₁ | X₂ | X₃ | X₄ | X | R₂₁ | R₂₂ | R₂₃ |
|---|---|---|---|---|---|---|---|---|
| La289. | 4,4-dimethylcyclohexyl-CD- | N | CH | CH | S | CD₃ | H | CD₃ |
| La290. | cyclopentyl-CD₂- | N | CH | CH | S | CD₃ | H | CD₃ |
| La291. | cyclohexyl-CD₂- | N | CH | CH | S | CD₃ | H | CD₃ |
| La292. | CH | N | CCH₃ | CH | S | H | H | H |
| La293. | CH | N | C-isopropyl | CH | S | H | H | H |
| La294. | CH | N | C-CH₂-isopropyl | CH | S | H | H | H |
| La295. | CH | N | C-CH₂-tBu | CH | S | H | H | H |
| La296. | CH | N | C-cyclopentyl | CH | S | H | H | H |
| La297. | CH | N | C-cyclohexyl | CH | S | H | H | H |
| La298. | CH | N | C-(4,4-dimethylcyclohexyl) | CH | S | H | H | H |
| La299. | CH | N | C-CH₂-cyclopentyl | CH | S | H | H | H |
| La300. | CH | N | C-CH₂-cyclohexyl | CH | S | H | H | H |
| La301. | CH | N | CCD₃ | CH | S | H | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La302. | CH | N |  | CH | S | H | H | H |
| La303. | CH | N | 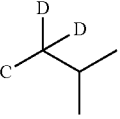 | CH | S | H | H | H |
| La304. | CH | N | 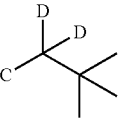 | CH | S | H | H | H |
| La305. | CH | N | 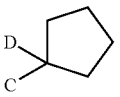 | CH | S | H | H | H |
| La306. | CH | N | 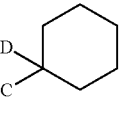 | CH | S | H | H | H |
| La307. | CH | N | 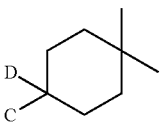 | CH | S | H | H | H |
| La308. | CH | N | 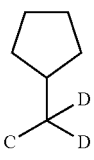 | CH | S | H | H | H |
| La309. | CH | N | 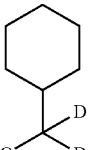 | CH | S | H | H | H |
| La310. | CH | N | CCH$_3$ | CH | S | CH$_3$ | H | H |
| La311. | CH | N |  | CH | S | CH$_3$ | H | H |
| La312. | CH | N | 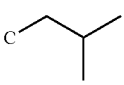 | CH | S | CH$_3$ | H | H |
| La313. | CH | N | 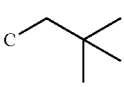 | CH | S | CH$_3$ | H | H |
| La314. | CH | N | 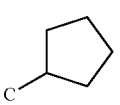 | CH | S | CH$_3$ | H | H |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La315. | CH | N | C-cyclohexyl | CH | S | $CH_3$ | H | H |
| La316. | CH | N | C-(4,4-dimethylcyclohexyl) | CH | S | $CH_3$ | H | H |
| La317. | CH | N | C-methylcyclopentyl | CH | S | $CH_3$ | H | H |
| La318. | CH | N | C-methylcyclohexyl | CH | S | $CH_3$ | H | H |
| La319. | CH | N | $CCD_3$ | CH | S | $CD_3$ | H | H |
| La320. | CH | N | C-C(CH$_3$)$_2$D | CH | S | $CD_3$ | H | H |
| La321. | CH | N | C-CD$_2$-CH(CH$_3$)D | CH | S | $CD_3$ | H | H |
| La322. | CH | N | C-CD$_2$-C(CH$_3$)$_3$ | CH | S | $CD_3$ | H | H |
| La323. | CH | N | cyclopentyl-D | CH | S | $CD_3$ | H | H |
| La324. | CH | N | cyclohexyl-D | CH | S | $CD_3$ | H | H |
| La325. | CH | N | 4,4-dimethylcyclohexyl-D | CH | S | $CD_3$ | H | H |
| La326. | CH | N | cyclopentyl-CD$_2$ | CH | S | $CD_3$ | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La327. | CH | N | 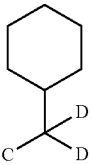 | CH | S | $CD_3$ | H | H |
| La328. | CH | N | $CCH_3$ | CH | S | $CH_3$ | H | $CH_3$ |
| La329. | CH | N |  | CH | S | $CH_3$ | H | $CH_3$ |
| La330. | CH | N | 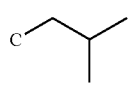 | CH | S | $CH_3$ | H | $CH_3$ |
| La331. | CH | N | 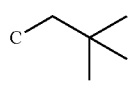 | CH | S | $CH_3$ | H | $CH_3$ |
| La332. | CH | N | 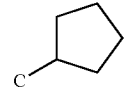 | CH | S | $CH_3$ | H | $CH_3$ |
| La333. | CH | N | 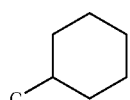 | CH | S | $CH_3$ | H | $CH_3$ |
| La334. | CH | N | 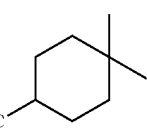 | CH | S | $CH_3$ | H | $CH_3$ |
| La335. | CH | N | 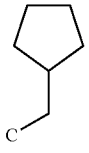 | CH | S | $CH_3$ | H | $CH_3$ |
| La336. | CH | N | 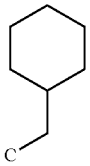 | CH | S | $CH_3$ | H | $CH_3$ |
| La337. | CH | N | $CCD_3$ | CH | S | $CD_3$ | H | $CD_3$ |
| La338. | CH | N |  | CH | S | $CD_3$ | H | $CD_3$ |
| La339. | CH | N | 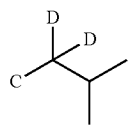 | CH | S | $CD_3$ | H | $CD_3$ |
| La340. | CH | N | 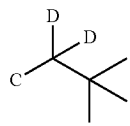 | CH | S | $CD_3$ | H | $CD_3$ |

| Number | X₁ | X₂ | X₃ | X₄ | X | R₂₁ | R₂₂ | R₂₃ |
|---|---|---|---|---|---|---|---|---|
| La341. | CH | N | 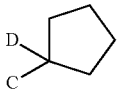 | CH | S | CD₃ | H | CD₃ |
| La342. | CH | N | 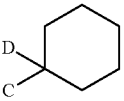 | CH | S | CD₃ | H | CD₃ |
| La343. | CH | N | 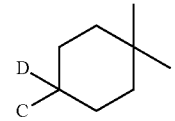 | CH | S | CD₃ | H | CD₃ |
| La344. | CH | N | 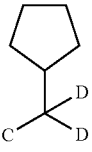 | CH | S | CD₃ | H | CD₃ |
| La345. | CH | N | 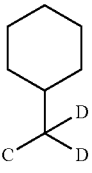 | CH | S | CD₃ | H | CD₃ |
| La346. | CH | N | CH | CH | Se | H | H | H |
| La347. | CH | N | CH | CH | Se | CH₃ | H | H |
| La348. | CH | N | CH | CH | Se | H | CH₃ | H |
| La349. | CH | N | CH | CH | Se | CH₃ | H | CH₃ |
| La350. | CH | N | CH | CH | Se | CD₃ | H | H |
| La351. | CH | N | CH | CH | Se | H | CD₃ | H |
| La352. | CH | N | CH | CH | Se | CH₃ | H | CD₃ |
| La353. | CCH₃ | N | CH | CH | Se | H | H | H |
| La354. |  | N | CH | CH | Se | H | H | H |
| La355. |  | N | CH | CH | Se | H | H | H |
| La356. |  | N | CH | CH | Se | H | H | H |
| La357. |  | N | CH | CH | Se | H | H | H |
| La358. |  | N | CH | CH | Se | H | H | H |
| La359. | 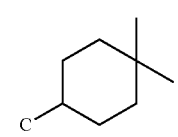 | N | CH | CH | Se | H | H | H |

-continued

| Number | X₁ | X₂ | X₃ | X₄ | X | R₂₁ | R₂₂ | R₂₃ |
|---|---|---|---|---|---|---|---|---|
| La360. | C-CH₂-cyclopentyl | N | CH | CH | Se | H | H | H |
| La361. | C-CH₂-cyclohexyl | N | CH | CH | Se | H | H | H |
| La362. | CCD₃ | N | CH | CH | Se | H | H | H |
| La363. | C-C(CH₃)₂D | N | CH | CH | Se | H | H | H |
| La364. | C-CD₂-CH(CH₃)₂ | N | CH | CH | Se | H | H | H |
| La365. | C-CD₂-C(CH₃)₃ | N | CH | CH | Se | H | H | H |
| La366. | C-CD-cyclopentyl | N | CH | CH | Se | H | H | H |
| La367. | C-CD-cyclohexyl | N | CH | CH | Se | H | H | H |
| La368. | C-CD-(4,4-dimethylcyclohexyl) | N | CH | CH | Se | H | H | H |
| La369. | C-CD₂-cyclopentyl | N | CH | CH | Se | H | H | H |
| La370. | C-CD₂-cyclohexyl | N | CH | CH | Se | H | H | H |
| La371. | CCH₃ | N | CH | CH | Se | CH₃ | H | H |
| La372. | C-CH(CH₃)₂ | N | CH | CH | Se | CH₃ | H | H |

-continued
| Number | X₁ | X₂ | X₃ | X₄ | X | R₂₁ | R₂₂ | R₂₃ |
|---|---|---|---|---|---|---|---|---|
| La373. | 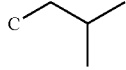 | N | CH | CH | Se | CH₃ | H | H |
| La374. | 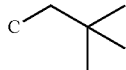 | N | CH | CH | Se | CH₃ | H | H |
| La375. | 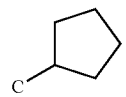 | N | CH | CH | Se | CH₃ | H | H |
| La376. | 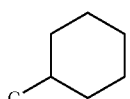 | N | CH | CH | Se | CH₃ | H | H |
| La377. | 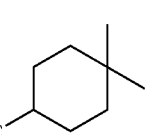 | N | CH | CH | Se | CH₃ | H | H |
| La378. | 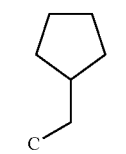 | N | CH | CH | Se | CH₃ | H | H |
| La379. | 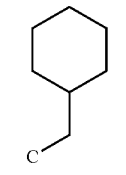 | N | CH | CH | Se | CH₃ | H | H |
| La380. | CCD₃ | N | CH | CH | Se | CD₃ | H | H |
| La381. | 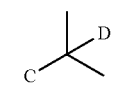 | N | CH | CH | Se | CD₃ | H | H |
| La382. | 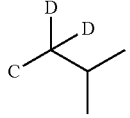 | N | CH | CH | Se | CD₃ | H | H |
| La383. | 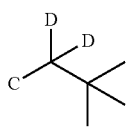 | N | CH | CH | Se | CD₃ | H | H |
| La384. | 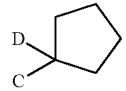 | N | CH | CH | Se | CD₃ | H | H |
| La385. | 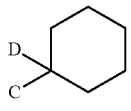 | N | CH | CH | Se | CD₃ | H | H |

-continued
| Number | X₁ | X₂ | X₃ | X₄ | X | R₂₁ | R₂₂ | R₂₃ |
|---|---|---|---|---|---|---|---|---|
| La386. | 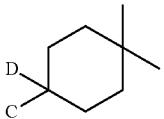 | N | CH | CH | Se | CD₃ | H | H |
| La387. | 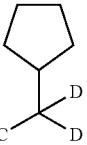 | N | CH | CH | Se | CD₃ | H | H |
| La388. | 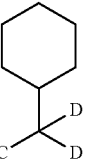 | N | CH | CH | Se | CD₃ | H | H |
| La389. | CCH₃ | N | CH | CH | Se | CH₃ | H | CH₃ |
| La390. |  | N | CH | CH | Se | CH₃ | H | CH₃ |
| La391. | 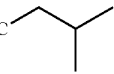 | N | CH | CH | Se | CH₃ | H | CH₃ |
| La392. | 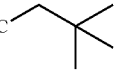 | N | CH | CH | Se | CH₃ | H | CH₃ |
| La393. | 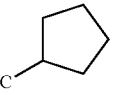 | N | CH | CH | Se | CH₃ | H | CH₃ |
| La394. | 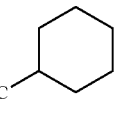 | N | CH | CH | Se | CH₃ | H | CH₃ |
| La395. | 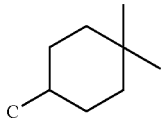 | N | CH | CH | Se | CH₃ | H | CH₃ |
| La396. | 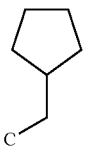 | N | CH | CH | Se | CH₃ | H | CH₃ |
| La397. | 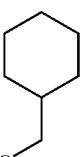 | N | CH | CH | Se | CH₃ | H | CH₃ |
| La398. | CCD₃ | N | CH | CH | Se | CD₃ | H | CD₃ |

-continued

| Number | X₁ | X₂ | X₃ | X₄ | X | R₂₁ | R₂₂ | R₂₃ |
|---|---|---|---|---|---|---|---|---|
| La399. | *tert-butyl-d1* | N | CH | CH | Se | CD₃ | H | CD₃ |
| La400. | *isobutyl-d2* | N | CH | CH | Se | CD₃ | H | CD₃ |
| La401. | *neopentyl-d2* | N | CH | CH | Se | CD₃ | H | CD₃ |
| La402. | *cyclopentyl-d1* | N | CH | CH | Se | CD₃ | H | CD₃ |
| La403. | *cyclohexyl-d1* | N | CH | CH | Se | CD₃ | H | CD₃ |
| La404. | *4,4-dimethylcyclohexyl-d1* | N | CH | CH | Se | CD₃ | H | CD₃ |
| La405. | *cyclopentylmethyl-d2* | N | CH | CH | Se | CD₃ | H | CD₃ |
| La406. | *cyclohexylmethyl-d2* | N | CH | CH | Se | CD₃ | H | CD₃ |
| La407. | CH | N | CCH₃ | CH | Se | H | H | H |
| La408. | CH | N | *isobutyl* | CH | Se | H | H | H |
| La409. | CH | N | *2-methylbutyl* | CH | Se | H | H | H |
| La410. | CH | N | *neopentyl* | CH | Se | H | H | H |
| La411. | CH | N | *cyclopentylmethyl* | CH | Se | H | H | H |
| La412. | CH | N | *cyclohexylmethyl* | CH | Se | H | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La413. | CH | N | 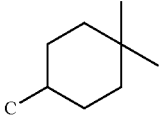 | CH | Se | H | H | H |
| La414. | CH | N | 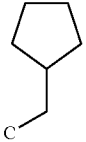 | CH | Se | H | H | H |
| La415. | CH | N | 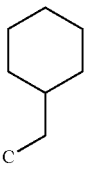 | CH | Se | H | H | H |
| La416. | CH | N | CCD$_3$ | CH | Se | H | H | H |
| La417. | CH | N |  | CH | Se | H | H | H |
| La418. | CH | N | 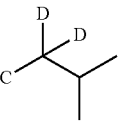 | CH | Se | H | H | H |
| La419. | CH | N | 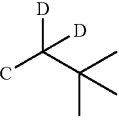 | CH | Se | H | H | H |
| La420. | CH | N | 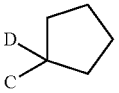 | CH | Se | H | H | H |
| La421. | CH | N | 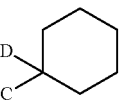 | CH | Se | H | H | H |
| La422. | CH | N | 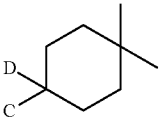 | CH | Se | H | H | H |
| L423. | CH | N | 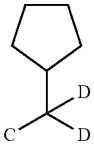 | CH | Se | H | H | H |
| La424. | CH | N | 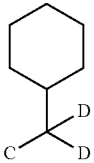 | CH | Se | H | H | H |

-continued
| Number | X₁ | X₂ | X₃ | X₄ | X | R₂₁ | R₂₂ | R₂₃ |
|---|---|---|---|---|---|---|---|---|
| La425. | CH | N | CCH₃ | CH | Se | CH₃ | H | H |
| La426. | CH | N |  | CH | Se | CH₃ | H | H |
| La427. | CH | N |  | CH | Se | CH₃ | H | H |
| La428. | CH | N |  | CH | Se | CH₃ | H | H |
| La429. | CH | N |  | CH | Se | CH₃ | H | H |
| La430. | CH | N |  | CH | Se | CH₃ | H | H |
| La431. | CH | N |  | CH | Se | CH₃ | H | H |
| La432. | CH | N |  | CH | Se | CH₃ | H | H |
| La433. | CH | N |  | CH | Se | CH₃ | H | H |
| La434. | CH | N | CCD₃ | CH | Se | CD₃ | H | H |
| La435. | CH | N |  | CH | Se | CD₃ | H | H |
| La436. | CH | N |  | CH | Se | CD₃ | H | H |
| La437. | CH | N |  | CH | Se | CD₃ | H | H |
| La438. | CH | N |  | CH | Se | CD₃ | H | H |

-continued
| Number | X₁ | X₂ | X₃ | X₄ | X | R₂₁ | R₂₂ | R₂₃ |
|---|---|---|---|---|---|---|---|---|
| La439. | CH | N | 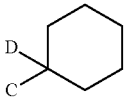 | CH | Se | CD₃ | H | H |
| La440. | CH | N | 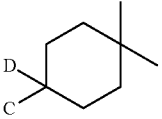 | CH | Se | CD₃ | H | H |
| La441. | CH | N | 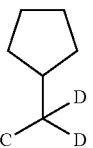 | CH | Se | CD₃ | H | H |
| La442. | CH | N | 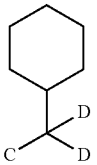 | CH | Se | CD₃ | H | H |
| La443. | CH | N | CCH₃ | CH | Se | CH₃ | H | CH₃ |
| La444. | CH | N |  | CH | Se | CH₃ | H | CH₃ |
| La445. | CH | N | 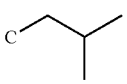 | CH | Se | CH₃ | H | CH₃ |
| La446. | CH | N | 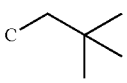 | CH | Se | CH₃ | H | CH₃ |
| La447. | CH | N | 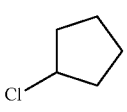 | CH | Se | CH₃ | H | CH₃ |
| La448. | CH | N | 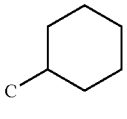 | CH | Se | CH₃ | H | CH₃ |
| La449. | CH | N | 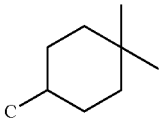 | CH | Se | CH₃ | H | CH₃ |
| La450. | CH | N | 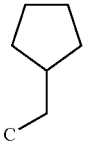 | CH | Se | CH₃ | H | CH₃ |
| La451. | CH | N | 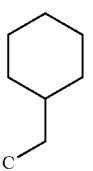 | CH | Se | CH₃ | H | CH₃ |

| Number | X₁ | X₂ | X₃ | X₄ | X | R₂₁ | R₂₂ | R₂₃ |
|---|---|---|---|---|---|---|---|---|
| La452. | CH | N | CCD₃ | CH | Se | CD₃ | H | CD₃ |
| La453. | CH | N |  | CH | Se | CD₃ | H | CD₃ |
| La454. | CH | N | 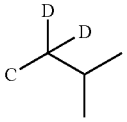 | CH | Se | CD₃ | H | CD₃ |
| La455. | CH | N | 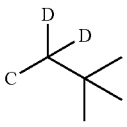 | CH | Se | CD₃ | H | CD₃ |
| La456. | CH | N | 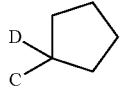 | CH | Se | CD₃ | H | CD₃ |
| La457. | CH | N | 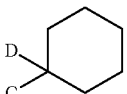 | CH | Se | CD₃ | H | CD₃ |
| La458. | CH | N | 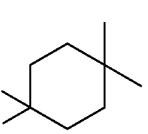 | CH | Se | CD₃ | H | CD₃ |
| La459. | CH | N | 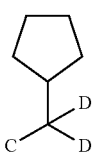 | CH | Se | CD₃ | H | CD₃ |
| La460. | CH | N | 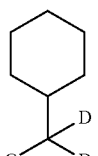 | CH | Se | CD₃ | H | CD₃ |
| La461. | CH | CH | N | CH | S | H | H | H |
| La462. | CH | CH | N | CH | S | CH₃ | H | H |
| La463. | CH | CH | N | CH | S | H | CH₃ | H |
| La464. | CH | CH | N | CH | S | CH₃ | H | CH₃ |
| La465. | CH | CH | N | CH | S | CD₃ | H | H |
| La466. | CH | CH | N | CH | S | H | CD₃ | H |
| La467. | CH | CH | N | CH | S | CH₃ | H | CD₃ |
| La468. | CH | OCH₃ | N | CH | S | H | H | H |
| La469. | CH |  | N | CH | S | H | H | H |
| La470. | CH | 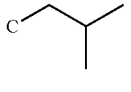 | N | CH | S | H | H | H |
| La471. | CH | 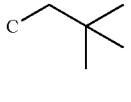 | N | CH | S | H | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La472. | CH | 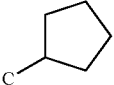 | N | CH | S | H | H | H |
| La473. | CH | 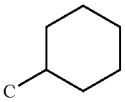 | N | CH | S | H | H | H |
| La474. | CH | 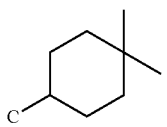 | N | CH | S | H | H | H |
| La475. | CH | 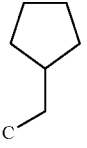 | N | CH | S | H | H | H |
| La476. | CH | 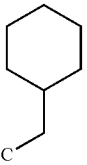 | N | CH | S | H | H | H |
| La477. | CH | $CCD_3$ | N | CH | S | H | H | H |
| La478. | CH |  | N | CH | S | H | H | H |
| La479. | CH | 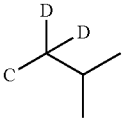 | N | CH | S | H | H | H |
| La480. | CH | 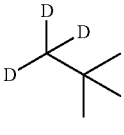 | N | CH | S | H | H | H |
| La481. | CH | 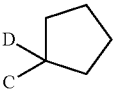 | N | CH | S | H | H | H |
| La482. | CH | 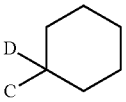 | N | CH | S | H | H | H |
| La483. | CH | 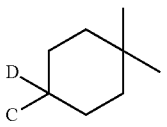 | N | CH | S | H | H | H |

-continued

| Number | X₁ | X₂ | X₃ | X₄ | X | R₂₁ | R₂₂ | R₂₃ |
|---|---|---|---|---|---|---|---|---|
| La484. | CH | cyclopentyl-CD₂- | N | CH | S | H | H | H |
| La485. | CH | cyclohexyl-CD₂- | N | CH | S | H | H | H |
| La486. | CH | CCH₃ | N | CH | S | CH₃ | H | H |
| La487. | CH | isopropyl | N | CH | S | CH₃ | H | H |
| La488. | CH | isobutyl | N | CH | S | CH₃ | H | H |
| La489. | CH | neopentyl | N | CH | S | CH₃ | H | H |
| La490. | CH | cyclopentyl | N | CH | S | CH₃ | H | H |
| La491. | CH | cyclohexyl | N | CH | S | CH₃ | H | H |
| La492. | CH | 4,4-dimethylcyclohexyl | N | CH | S | CH₃ | H | H |
| La493. | CH | cyclopentylmethyl | N | CH | S | CH₃ | H | H |
| La494. | CH | cyclohexylmethyl | N | CH | S | CH₃ | H | H |
| La495. | CH | CCD₃ | N | CH | S | CD₃ | H | H |
| La496. | CH | isopropyl-d | N | CH | S | CD₃ | H | H |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La497. | CH | (C-CD₂-CH(CH₃)₂, with two D on CH₂) | N | CH | S | $CD_3$ | H | H |
| La498. | CH | (C-CD₃-C(CH₃)₃) | N | CH | S | $CD_3$ | H | H |
| La499. | CH | (1-(CD,C)-cyclopentyl) | N | CH | S | $CD_3$ | H | H |
| La500. | CH | (1-(CD,C)-cyclohexyl) | N | CH | S | $CD_3$ | H | H |
| La501. | CH | (4,4-dimethyl-1-(CD,C)-cyclohexyl) | N | CH | S | $CD_3$ | H | H |
| La502. | CH | (cyclopentyl-CHD- with C,D) | N | CH | S | $CD_3$ | H | H |
| La503. | CH | (cyclohexyl-CHD- with C,D) | N | CH | S | $CD_3$ | H | H |
| La504. | CH | CCH₃ | N | CH | S | $CH_3$ | H | $CH_3$ |
| La505. | CH | (C-CH(CH₃)₂) | N | CH | S | $CH_3$ | H | $CH_3$ |
| La506. | CH | (C-CH₂-CH(CH₃)₂) | N | CH | S | $CH_3$ | H | $CH_3$ |
| La507. | CH | (C-CH₂-C(CH₃)₃) | N | CH | S | $CH_3$ | H | $CH_3$ |
| La508. | CH | (C-cyclopentyl) | N | CH | S | $CH_3$ | H | $CH_3$ |
| La509. | CH | (C-cyclohexyl) | N | CH | S | $CH_3$ | H | $CH_3$ |

-continued

| Number | X₁ | X₂ | X₃ | X₄ | X | R₂₁ | R₂₂ | R₂₃ |
|---|---|---|---|---|---|---|---|---|
| La510. | CH | (4,4-dimethylcyclohexyl-C) | N | CH | S | CH₃ | H | CH₃ |
| La511. | CH | (cyclopentylmethyl-C) | N | CH | S | CH₃ | H | CH₃ |
| La512. | CH | (cyclohexylmethyl-C) | N | CH | S | CH₃ | H | CH₃ |
| La513. | CH | CCD₃ | N | CH | S | CD₃ | H | CD₃ |
| La514. | CH | (C(CD)...) | N | CH | S | CD₃ | H | CD₃ |
| La515. | CH | (isobutyl-d2-C) | N | CH | S | CD₃ | H | CD₃ |
| La516. | CH | (neopentyl-d2-C) | N | CH | S | CD₃ | H | CD₃ |
| La517. | CH | (1-d-cyclopentyl-C) | N | CH | S | CD₃ | H | CD₃ |
| La518. | CH | (1-d-cyclohexyl-C) | N | CH | S | CD₃ | H | CD₃ |
| La519. | CH | (4,4-dimethyl-1-d-cyclohexyl-C) | N | CH | S | CD₃ | H | CD₃ |
| La520. | CH | (cyclopentyl-CD₂-C) | N | CH | S | CD₃ | H | CD₃ |
| La521. | CH | (cyclohexyl-CD₂-C) | N | CH | S | CD₃ | H | CD₃ |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La522. | CH | CH | N | CH | Se | H | H | H |
| La523. | CH | CH | N | CH | Se | $CH_3$ | H | H |
| La524. | CH | CH | N | CH | Se | H | $CH_3$ | H |
| La525. | CH | CH | N | CH | Se | $CH_3$ | H | $CH_3$ |
| La526. | CH | CH | N | CH | Se | $CD_3$ | H | H |
| La527. | CH | CH | N | CH | Se | H | $CD_3$ | H |
| La528. | CH | CH | N | CH | Se | $CH_3$ | H | $CD_3$ |
| La529. | CH | $CCH_3$ | N | CH | Se | H | H | H |
| La530. | H |  | N | CH | Se | H | H | H |
| La531. | CH | 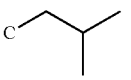 | N | CH | Se | H | H | H |
| La532. | CH | 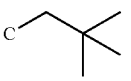 | N | CH | Se | H | H | H |
| La533. | CH | 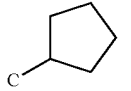 | N | CH | Se | H | H | H |
| La534. | CH | 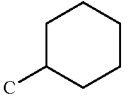 | N | CH | Se | H | H | H |
| La535. | CH | 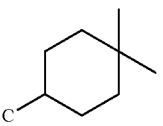 | N | CH | Se | H | H | H |
| La536. | CH | 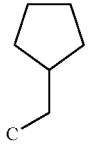 | N | CH | Se | H | H | H |
| La537. | CH | 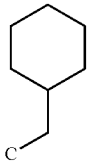 | N | CH | Se | H | H | H |
| La538. | CH | $CCD_3$ | N | CH | Se | H | H | H |
| La539. | CH |  | N | CH | Se | H | H | H |
| La540. | CH | 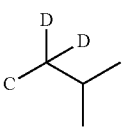 | N | CH | Se | H | H | H |
| La541. | CH | 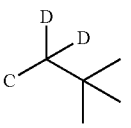 | N | CH | Se | H | H | H |

-continued
| Number | X₁ | X₂ | X₃ | X₄ | X | R₂₁ | R₂₂ | R₂₃ |
|---|---|---|---|---|---|---|---|---|
| La542. | CH | 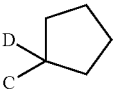 | N | CH | Se | H | H | H |
| La543. | CH | 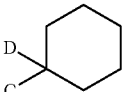 | N | CH | Se | H | H | H |
| La544. | CH | 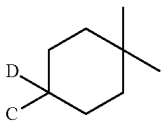 | N | CH | Se | H | H | H |
| La545. | CH | 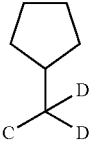 | N | CH | Se | H | H | H |
| La546. | CH | 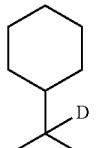 | N | CH | Se | H | H | H |
| La547. | CH | CCH₃ | N | CH | Se | CH₃ | H | H |
| La548. | CH |  | N | CH | Se | CH₃ | H | H |
| La549. | CH | 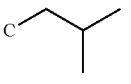 | N | CH | Se | CH₃ | H | H |
| La550. | CH | 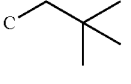 | N | CH | Se | CH₃ | H | H |
| La551. | CH | 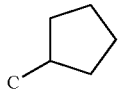 | N | CH | Se | CH₃ | H | H |
| La552. | CH | 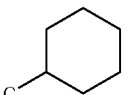 | N | CH | Se | CH₃ | H | H |
| La553. | CH | 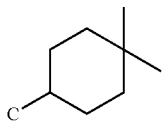 | N | CH | Se | CH₃ | H | H |
| La554. | CH | 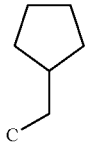 | N | CH | Se | CH₃ | H | H |

-continued

| Number | X₁ | X₂ | X₃ | X₄ | X | R₂₁ | R₂₂ | R₂₃ |
|---|---|---|---|---|---|---|---|---|
| La555. | CH | cyclohexylmethyl | N | CH | Se | CH₃ | H | H |
| La556. | CH | CCD₃ | N | CH | Se | CD₃ | H | H |
| La557. | CH | CH(CD₃)(CH₃) | N | CH | Se | CD₃ | H | H |
| La558. | CH | CD₂-CH(CH₃)₂ | N | CH | Se | CD₃ | H | H |
| La559. | CH | CD₂-C(CH₃)₃ | N | CH | Se | CD₃ | H | H |
| La560. | CH | 1-D-cyclopentyl | N | CH | Se | CD₃ | H | H |
| La561. | CH | 1-D-cyclohexyl | N | CH | Se | CD₃ | H | H |
| La562. | CH | 4,4-dimethyl-1-D-cyclohexyl | N | CH | Se | CD₃ | H | H |
| La563. | CH | cyclopentyl-CD₂ | N | CH | Se | CD₃ | H | H |
| La564. | CH | cyclohexyl-CD₂ | N | CH | Se | CD₃ | H | H |
| La565. | CH | CCH₃ | N | CH | Se | CH₃ | H | CH₃ |
| La566. | CH | CH(CH₃)₂ | N | CH | Se | CH₃ | H | CH₃ |
| La567. | CH | CH₂CH(CH₃)₂ | N | CH | Se | CH₃ | H | CH₃ |
| La568. | CH | CH₂C(CH₃)₃ | N | CH | Se | CH₃ | H | CH₃ |

-continued
| Number | X₁ | X₂ | X₃ | X₄ | X | R₂₁ | R₂₂ | R₂₃ |
|---|---|---|---|---|---|---|---|---|
| La569. | CH | 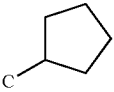 | N | CH | Se | CH₃ | H | CH₃ |
| La570. | CH | 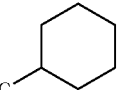 | N | CH | Se | CH₃ | H | CH₃ |
| La571. | CH | 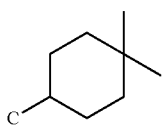 | N | CH | Se | CH₃ | H | CH₃ |
| La572. | CH | 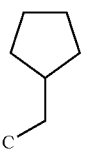 | N | CH | Se | CH₃ | H | CH₃ |
| La573. | CH | 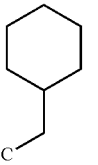 | N | CH | Se | CH₃ | H | CH₃ |
| La574. | CH | CCD₃ | N | CH | Se | CD₃ | H | CD₃ |
| La575. | CH |  | N | CH | Se | CD₃ | H | CD₃ |
| La576. | CH | 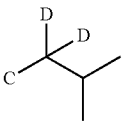 | N | CH | Se | CD₃ | H | CD₃ |
| La577. | CH | 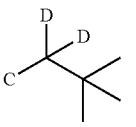 | N | CH | Se | CD₃ | H | CD₃ |
| La578. | CH | 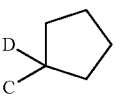 | N | CH | Se | CD₃ | H | CD₃ |
| La579. | CH | 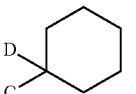 | N | CH | Se | CD₃ | H | CD₃ |
| La580. | CH | 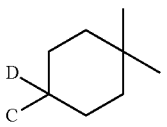 | N | CH | Se | CD₃ | H | CD₃ |

-continued
| Number | X₁ | X₂ | X₃ | X₄ | X | R₂₁ | R₂₂ | R₂₃ |
|---|---|---|---|---|---|---|---|---|
| La581. | CH | 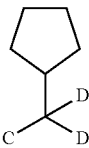 | N | CH | Se | CD₃ | H | CD₃ |
| La582. | CH | 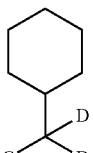 | N | CH | Se | CD₃ | H | CD₃ |
| La583. | CH | CH | CH | N | S | H | H | H |
| La584. | CH | CH | CH | N | S | CH₃ | H | H |
| La585. | CH | CH | CH | N | S | H | CH₃ | H |
| La586. | CH | CH | CH | N | S | CH₃ | H | CH₃ |
| La587. | CH | CH | CH | N | S | CD₃ | H | H |
| La588. | CH | CH | CH | N | S | H | CD₃ | H |
| La589. | CH | CH | CH | N | S | CH₃ | H | CD₃ |
| La590. | CH | CH | CCH₃ | N | S | H | H | H |
| La591. | CH | CH |  | N | S | H | H | H |
| La592. | CH | CH | 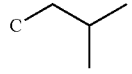 | N | S | H | H | H |
| La593. | CH | CH | 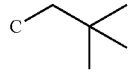 | N | S | H | H | H |
| La594. | CH | CH | 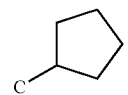 | N | S | H | H | H |
| La595. | CH | CH | 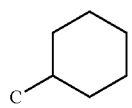 | N | S | H | H | H |
| La596. | CH | CH | 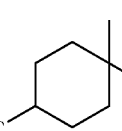 | N | S | H | H | H |
| La597. | CH | CH | 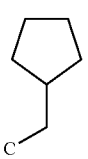 | N | S | H | H | H |
| La598. | CH | CH | 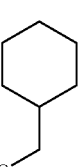 | N | S | H | H | H |
| La599. | CH | CH | CCD₃ | N | S | H | H | H |

-continued

| Number | X₁ | X₂ | X₃ | X₄ | X | R₂₁ | R₂₂ | R₂₃ |
|---|---|---|---|---|---|---|---|---|
| La600. | CH | CH | C-C(D)(CH₃)₂ | N | S | H | H | H |
| La601. | CH | CH | C-C(D)₂-CH(CH₃)₂ | N | S | H | H | H |
| La602. | CH | CH | C-C(D)₂-C(CH₃)₃ | N | S | H | H | H |
| La603. | CH | CH | C-C(D)(cyclopentyl) | N | S | H | H | H |
| La604. | CH | CH | C-C(D)(cyclohexyl) | N | S | H | H | H |
| La605. | CH | CH | C-C(D)(4,4-dimethylcyclohexyl) | N | S | H | H | H |
| La606. | CH | CH | C-CD₂-cyclopentyl | N | S | H | H | H |
| La607. | CH | CH | C-CD₂-cyclohexyl | N | S | H | H | H |
| La608. | CH | CH | CCH₃ | N | S | CH₃ | H | H |
| La609. | CH | CH | C-CH(CH₃)₂ | N | S | CH₃ | H | H |
| La610. | CH | CH | C-CH₂-CH(CH₃)₂ | N | S | CH₃ | H | H |
| La611. | CH | CH | C-CH₂-C(CH₃)₃ | N | S | CH₃ | H | H |
| La612. | CH | CH | C-cyclopentyl | N | S | CH₃ | H | H |
| La613. | CH | CH | C-cyclohexyl | N | S | CH₃ | H | H |

-continued
| Number | X₁ | X₂ | X₃ | X₄ | X | R₂₁ | R₂₂ | R₂₃ |
|---|---|---|---|---|---|---|---|---|
| La614. | CH | CH | 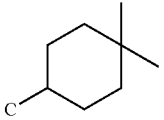 | N | S | CH₃ | H | H |
| La615. | CH | CH | 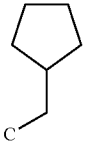 | N | S | CH₃ | H | H |
| La616. | CH | CH | 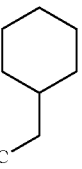 | N | S | CH₃ | H | H |
| La617. | CH | CH | CCD₃ | N | S | CD₃ | H | H |
| La618. | CH | CH |  | N | S | CD₃ | H | H |
| La619. | CH | CH | 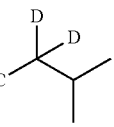 | N | S | CD₃ | H | H |
| La620. | CH | CH | 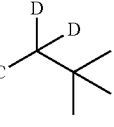 | N | S | CD₃ | H | H |
| La621. | CH | CH | 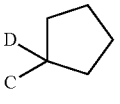 | N | S | CD₃ | H | H |
| La622. | CH | CH | 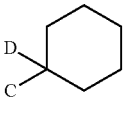 | N | S | CD₃ | H | H |
| La623. | CH | CH | 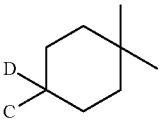 | N | S | CD₃ | H | H |
| La624. | CH | CH | 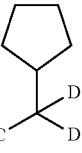 | N | S | CD₃ | H | H |
| La625. | CH | CH | 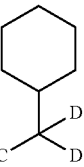 | N | S | CD₃ | H | H |

| Number | X₁ | X₂ | X₃ | X₄ | X | R₂₁ | R₂₂ | R₂₃ |
|---|---|---|---|---|---|---|---|---|
| La626. | CH | CH | CCH₃ | N | S | CH₃ | H | CH₃ |
| La627. | CH | CH |  | N | S | CH₃ | H | CH₃ |
| La628. | CH | CH | 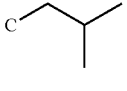 | N | S | CH₃ | H | CH₃ |
| La629. | CH | CH | 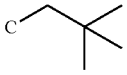 | N | S | CH₃ | H | CH₃ |
| La630. | CH | CH | 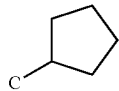 | N | S | CH₃ | H | CH₃ |
| La631. | CH | CH | 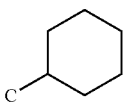 | N | S | CH₃ | H | CH₃ |
| La632. | CH | CH | 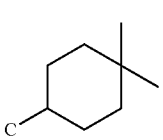 | N | S | CH₃ | H | CH₃ |
| La633. | CH | CH | 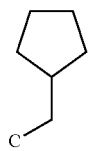 | N | S | CH₃ | H | CH₃ |
| La634. | CH | CH | 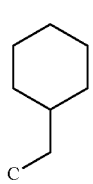 | N | S | CH₃ | H | CH₃ |
| La635. | CH | CH | CCD₃ | N | S | CD₃ | H | CD₃ |
| La636. | CH | CH |  | N | S | CD₃ | H | CD₃ |
| La637. | CH | CH | 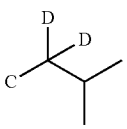 | N | S | CD₃ | H | CD₃ |
| La638. | CH | CH | 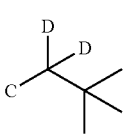 | N | S | CD₃ | H | CD₃ |
| La639. | CH | CH | 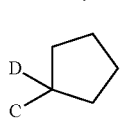 | N | S | CD₃ | H | CD₃ |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La640. | CH | CH | 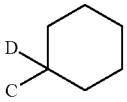 | N | S | $CD_3$ | H | $CD_3$ |
| La641. | CH | CH | 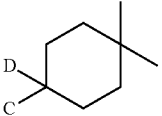 | N | S | $CD_3$ | H | $CD_3$ |
| La642. | CH | CH | 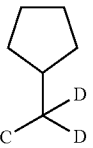 | N | S | $CD_3$ | H | $CD_3$ |
| La643. | CH | CH | 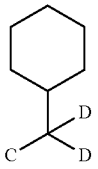 | N | S | $CD_3$ | H | $CD_3$ |
| La644. | CH | CH | CH | N | Se | H | H | H |
| La645. | CH | CH | CH | N | Se | $CH_3$ | H | H |
| La646. | CH | CH | CH | N | Se | H | $CH_3$ | H |
| La647. | CH | CH | CH | N | Se | $CH_3$ | H | $CH_3$ |
| La648. | CH | CH | CH | N | Se | $CD_3$ | H | H |
| La649. | CH | CH | CH | N | Se | H | $CD_3$ | H |
| La650. | CH | CH | CH | N | Se | $CH_3$ | H | $CD_3$ |
| La651. | CH | CH | $CCH_3$ | N | Se | H | H | H |
| La652. | CH | CH |  | N | Se | H | H | H |
| La653. | CH | CH | 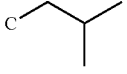 | N | Se | H | H | H |
| La654. | CH | CH | 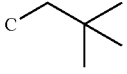 | N | Se | H | H | H |
| La655. | CH | CH | 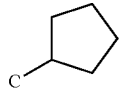 | N | Se | H | H | H |
| La656. | CH | CH | 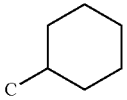 | N | Se | H | H | H |
| La657. | CH | CH | 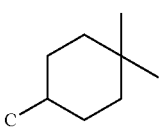 | N | Se | H | H | H |
| La658. | CH | CH | 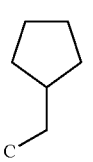 | N | Se | H | H | H |

-continued
| Number | X₁ | X₂ | X₃ | X₄ | X | R₂₁ | R₂₂ | R₂₃ |
|---|---|---|---|---|---|---|---|---|
| La659. | CH | CH | 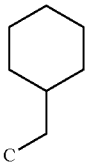 | N | Se | H | H | H |
| La660. | CH | CH | CCD₃ | N | Se | H | H | H |
| La661. | CH | CH |  | N | Se | H | H | H |
| La662. | CH | CH | 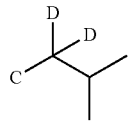 | N | Se | H | H | H |
| La663. | CH | CH | 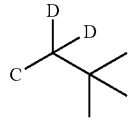 | N | Se | H | H | H |
| La664. | CH | CH | 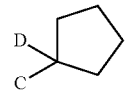 | N | Se | H | H | H |
| La665. | CH | CH | 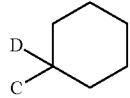 | N | Se | H | H | H |
| La666. | CH | CH | 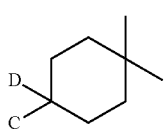 | N | Se | H | H | H |
| La667. | CH | CH | 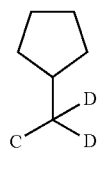 | N | Se | H | H | H |
| La668. | CH | CH | 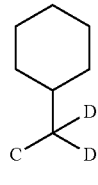 | N | Se | H | H | H |
| La669. | CH | CH | CCH₃ | N | Se | CH₃ | H | H |
| La670. | CH | CH |  | N | Se | CH₃ | H | H |
| La671. | CH | CH | 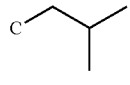 | N | Se | CH₃ | H | H |
| La672. | CH | CH | 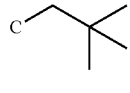 | N | Se | CH₃ | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La673. | CH | CH | 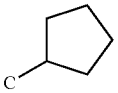 | N | Se | $CH_3$ | H | H |
| La674. | CH | CH | 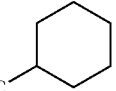 | N | Se | $CH_3$ | H | H |
| La675. | CH | CH | 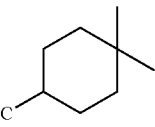 | N | Se | $CH_3$ | H | H |
| La676. | CH | CH | 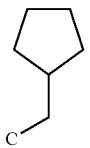 | N | Se | $CH_3$ | H | H |
| La677. | CH | CH | 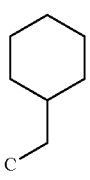 | N | Se | $CH_3$ | H | H |
| La678. | CH | CH | $CCD_3$ | N | Se | $CD_3$ | H | H |
| La679. | CH | CH |  | N | Se | $CD_3$ | H | H |
| La680. | CH | CH | 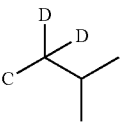 | N | Se | $CD_3$ | H | H |
| La681. | CH | CH | 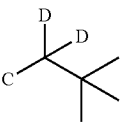 | N | Se | $CD_3$ | H | H |
| La682. | CH | CH | 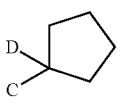 | N | Se | $CD_3$ | H | H |
| La683. | CH | CH | 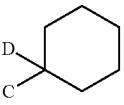 | N | Se | $CD_3$ | H | H |
| La684. | CH | CH | 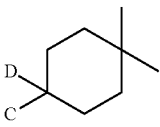 | N | Se | $CD_3$ | H | H |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La685. | CH | CH | cyclopentyl-CD$_2$- | N | Se | CD$_3$ | H | H |
| La686. | CH | CH | cyclohexyl-CD$_2$- | N | Se | CD$_3$ | H | H |
| La687. | CH | CH | CCH$_3$ | N | Se | CH$_3$ | H | CH$_3$ |
| La688. | CH | CH | isopropyl | N | Se | CH$_3$ | H | CH$_3$ |
| La689. | CH | CH | isobutyl | N | Se | CH$_3$ | H | CH$_3$ |
| La690. | CH | CH | neopentyl | N | Se | CH$_3$ | H | CH$_3$ |
| La691. | CH | CH | cyclopentyl | N | Se | CH$_3$ | H | CH$_3$ |
| La692. | CH | CH | cyclohexyl | N | Se | CH$_3$ | H | CH$_3$ |
| La693. | CH | CH | 4,4-dimethylcyclohexyl | N | Se | CH$_3$ | H | CH$_3$ |
| La694. | CH | CH | cyclopentylmethyl | N | Se | CH$_3$ | H | CH$_3$ |
| La695. | CH | CH | cyclohexylmethyl | N | Se | CH$_3$ | H | CH$_3$ |
| La696. | CH | CH | CCD$_3$ | N | Se | CD$_3$ | H | CD$_3$ |
| La697. | CH | CH | C(CH$_3$)$_2$D | N | Se | CD$_3$ | H | CD$_3$ |

-continued

| Number | X₁ | X₂ | X₃ | X₄ | X | R₂₁ | R₂₂ | R₂₃ |
|---|---|---|---|---|---|---|---|---|
| La698. | CH | CH | ![isopropyl-d2] | N | Se | CD₃ | H | CD₃ |
| La699. | CH | CH | ![neopentyl-d2] | N | Se | CD₃ | H | CD₃ |
| La700. | CH | CH | ![cyclopentyl-d] | N | Se | CD₃ | H | CD₃ |
| La701. | CH | CH | ![cyclohexyl-d] | N | Se | CD₃ | H | CD₃ |
| La702. | CH | CH | ![4,4-dimethylcyclohexyl-d] | N | Se | CD₃ | H | CD₃ |
| La703. | CH | CH | ![cyclopentylmethyl-d2] | N | Se | CD₃ | H | CD₃ |
| La704. | CH | CH | ![cyclohexylmethyl-d2] | N | Se | CD₃ | H | CD₃ |
| La705. | N | CH | N | CH | S | H | H | H |
| La706. | N | CH | N | CH | S | CH₃ | H | H |
| La707. | N | CH | N | CH | S | H | CH₃ | H |
| La708. | N | CH | N | CH | S | CH₃ | H | CH₃ |
| La709. | N | CH | N | CH | S | CD₃ | H | H |
| La710. | N | CH | N | CH | S | H | CD₃ | H |
| La711. | N | CH | N | CH | S | CH₃ | H | CD₃ |
| La712. | N | CCH₃ | N | CH | S | H | H | H |
| La713. | N | ![isopropyl] | N | CH | S | H | H | H |
| La714. | N | ![isobutyl] | N | CH | S | H | H | H |
| La715. | N | ![neopentyl] | N | CH | S | H | H | H |
| La716. | N | ![cyclopentyl] | N | CH | S | H | H | H |

-continued
| Number | X$_1$ | X$_2$ | X$_3$ | X$_4$ | X | R$_{21}$ | R$_{22}$ | R$_{23}$ |
|---|---|---|---|---|---|---|---|---|
| La717. | N | 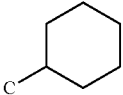 | N | CH | S | H | H | H |
| La718. | N | 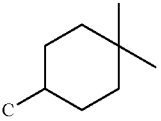 | N | CH | S | H | H | H |
| La719. | N | 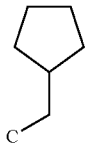 | N | CH | S | H | H | H |
| La720. | N | 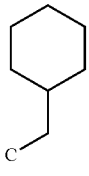 | N | CH | S | H | H | H |
| La721. | N | CCD$_3$ | N | CH | S | H | H | H |
| La722. | N |  | N | CH | S | H | H | H |
| La723. | N | 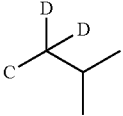 | N | CH | S | H | H | H |
| La724. | N | 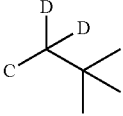 | N | CH | S | H | H | H |
| La725. | N | 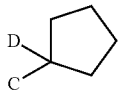 | N | CH | S | H | H | H |
| La726. | N | 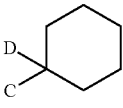 | N | CH | S | H | H | H |
| La727. | N | 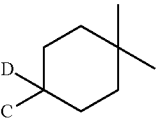 | N | CH | S | H | H | H |
| La728. | N | 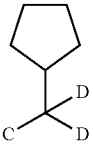 | N | CH | S | H | H | H |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La729. | N | cyclohexyl-CD$_2$- | N | CH | S | H | H | H |
| La730. | N | CCH$_3$ | N | CH | S | CH$_3$ | H | H |
| La731. | N | isopropyl | N | CH | S | CH$_3$ | H | H |
| La732. | N | isobutyl | N | CH | S | CH$_3$ | H | H |
| La733. | N | neopentyl | N | CH | S | CH$_3$ | H | H |
| La734. | N | cyclopentyl | N | CH | S | CH$_3$ | H | H |
| La735. | N | cyclohexyl | N | CH | S | CH$_3$ | H | H |
| La736. | N | 4,4-dimethylcyclohexyl | N | CH | S | CH$_3$ | H | H |
| La737. | N | cyclopentylmethyl | N | CH | S | CH$_3$ | H | H |
| La738. | N | cyclohexylmethyl | N | CH | S | CH$_3$ | H | H |
| La739. | N | CCD$_3$ | N | CH | S | CD$_3$ | H | H |
| La740. | N | C(CD)(CH$_3$)$_2$ | N | CH | S | CD$_3$ | H | H |
| La741. | N | CD$_2$CH(CH$_3$)$_2$ | N | CH | S | CD$_3$ | H | H |
| La742. | N | CD$_2$C(CH$_3$)$_3$ | N | CH | S | CD$_3$ | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La743. | N | 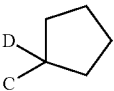 | N | CH | S | $CD_3$ | H | H |
| La744. | N | 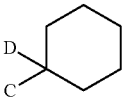 | N | CH | S | $CD_3$ | H | H |
| La745. | N | 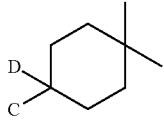 | N | CH | S | $CD_3$ | H | H |
| La746. | N | 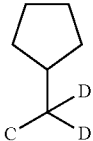 | N | CH | S | $CD_3$ | H | H |
| La747. | N | 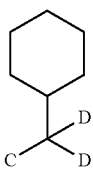 | N | CH | S | $CD_3$ | H | H |
| La748. | N | $CCH_3$ | N | CH | S | $CH_3$ | H | $CH_3$ |
| La749. | N |  | N | CH | S | $CH_3$ | H | $CH_3$ |
| La750. | N | 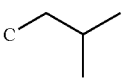 | N | CH | S | $CH_3$ | H | $CH_3$ |
| La751. | N | 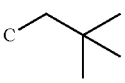 | N | CH | S | $CH_3$ | H | $CH_3$ |
| La752. | N | 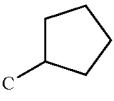 | N | CH | S | $CH_3$ | H | $CH_3$ |
| La753. | N | 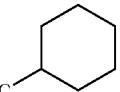 | N | CH | S | $CH_3$ | H | $CH_3$ |
| La754. | N | 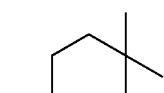 | N | CH | S | $CH_3$ | H | $CH_3$ |
| La755. | N | 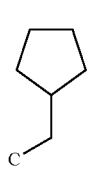 | N | CH | S | $CH_3$ | H | $CH_3$ |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La756. | N | 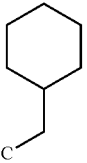 | N | CH | S | $CH_3$ | H | $CH_3$ |
| La757. | N | $CD_3$ | N | CH | S | $CD_3$ | H | $CD_3$ |
| La758. | N |  | N | CH | S | $CD_3$ | H | $CD_3$ |
| La759. | N | 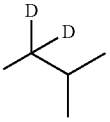 | N | CH | S | $CD_3$ | H | $CD_3$ |
| La760. | N | 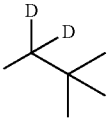 | N | CH | S | $CD_3$ | H | $CD_3$ |
| La761. | N |  | N | CH | S | $CD_3$ | H | $CD_3$ |
| La762. | N |  | N | CH | S | $CD_3$ | H | $CD_3$ |
| La763. | N | 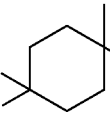 | N | CH | S | $CD_3$ | H | $CD_3$ |
| La764. | N | 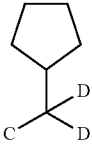 | N | CH | S | $CD_3$ | H | $CD_3$ |
| La765. | N | 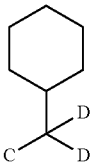 | N | CH | S | $CD_3$ | H | $CD_3$ |
| La766. | N | CH | N | CH | Se | H | H | H |
| La767. | N | CH | N | CH | Se | $CH_3$ | H | H |
| La768. | N | CH | N | CH | Se | H | $CH_3$ | H |
| La769. | N | CH | N | CH | Se | $CH_3$ | H | $CH_3$ |
| La770. | N | CH | N | CH | Se | $CD_3$ | H | H |
| La771. | N | CH | N | CH | Se | H | $CD_3$ | H |
| La772. | N | CH | N | CH | Se | $CH_3$ | H | $CD_3$ |
| La773. | N | $CCH_3$ | N | CH | Se | H | H | H |
| La774. | N |  | N | CH | Se | H | H | H |

| Number | X₁ | X₂ | X₃ | X₄ | X | R₂₁ | R₂₂ | R₂₃ |
|---|---|---|---|---|---|---|---|---|
| La775. | N | C-CH₂-CH(CH₃)₂ (isobutyl) | N | CH | Se | H | H | H |
| La776. | N | C-CH₂-C(CH₃)₃ (neopentyl) | N | CH | Se | H | H | H |
| La777. | N | C-cyclopentyl | N | CH | Se | H | H | H |
| La778. | N | C-cyclohexyl | N | CH | Se | H | H | H |
| La779. | N | C-(4,4-dimethylcyclohexyl) | N | CH | Se | H | H | H |
| La780. | N | C-CH₂-cyclopentyl | N | CH | Se | H | H | H |
| La781. | N | C-CH₂-cyclohexyl | N | CH | Se | H | H | H |
| La782. | N | CCD₃ | N | CH | Se | H | H | H |
| La783. | N | C-C(CH₃)₂D | N | CH | Se | H | H | H |
| La784. | N | C-CD₂-CH(CH₃)₂ | N | CH | Se | H | H | H |
| La785. | N | C-CD₂-C(CH₃)₃ | N | CH | Se | H | H | H |
| La786. | N | C-cyclopentyl (1-D) | N | CH | Se | H | H | H |
| La787. | N | C-cyclohexyl (1-D) | N | CH | Se | H | H | H |

-continued
| Number | X₁ | X₂ | X₃ | X₄ | X | R₂₁ | R₂₂ | R₂₃ |
|---|---|---|---|---|---|---|---|---|
| La788. | N | 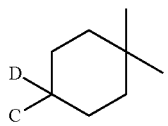 | N | CH | Se | H | H | H |
| La789. | N | 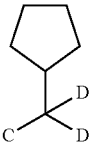 | N | CH | Se | H | H | H |
| La790. | N | 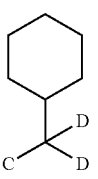 | N | CH | Se | H | H | H |
| La791. | N | CCH₃ | N | CH | Se | CH₃ | H | H |
| La792. | N |  | N | CH | Se | CH₃ | H | H |
| La793. | N | 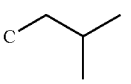 | N | CH | Se | CH₃ | H | H |
| La794. | N | 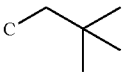 | N | CH | Se | CH₃ | H | H |
| La795. | N | 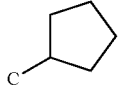 | N | CH | Se | CH₃ | H | H |
| La796. | N | 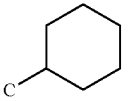 | N | CH | Se | CH₃ | H | H |
| La797. | N | 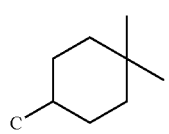 | N | CH | Se | CH₃ | H | H |
| La798. | N | 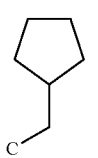 | N | CH | Se | CH₃ | H | H |
| La799. | N | 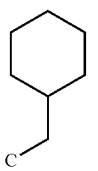 | N | CH | Se | CH₃ | H | H |
| La800. | N | CCD₃ | N | CH | Se | CD₃ | H | H |

-continued
| Number | X₁ | X₂ | X₃ | X₄ | X | R₂₁ | R₂₂ | R₂₃ |
|---|---|---|---|---|---|---|---|---|
| La801. | N |  | N | CH | Se | CD₃ | H | H |
| La802. | N | 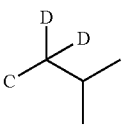 | N | CH | Se | CD₃ | H | H |
| La803. | N | 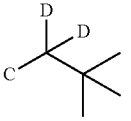 | N | CH | Se | CD₃ | H | H |
| La804. | N | 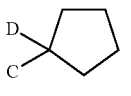 | N | CH | Se | CD₃ | H | H |
| La805. | N | 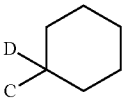 | N | CH | Se | CD₃ | H | H |
| La806. | N | 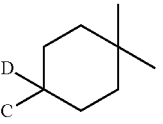 | N | CH | Se | CD₃ | H | H |
| La807. | N | 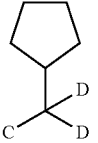 | N | CH | Se | CD₃ | H | H |
| La808. | N | 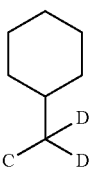 | N | CH | Se | CD₃ | H | H |
| La809. | N | CCH₃ | N | CH | Se | CH₃ | H | CH₃ |
| La810. | N |  | N | CH | Se | CH₃ | H | CH₃ |
| La811. | N | 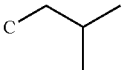 | N | CH | Se | CH₃ | H | CH₃ |
| La812. | N | 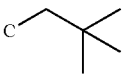 | N | CH | Se | CH₃ | H | CH₃ |
| La813. | N | 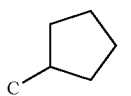 | N | CH | Se | CH₃ | H | CH₃ |
| La814. | N | 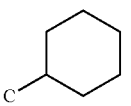 | N | CH | Se | CH₃ | H | CH₃ |

-continued

| Number | X₁ | X₂ | X₃ | X₄ | X | R₂₁ | R₂₂ | R₂₃ |
|---|---|---|---|---|---|---|---|---|
| La815. | N | 4,4-dimethylcyclohexyl-CH₂- | N | CH | Se | CH₃ | H | CH₃ |
| La816. | N | cyclopentyl-CH₂- | N | CH | Se | CH₃ | H | CH₃ |
| La817. | N | cyclohexyl-CH₂- | N | CH | Se | CH₃ | H | CH₃ |
| La818. | N | CCD₃ | N | CH | Se | CD₃ | H | CD₃ |
| La819. | N | -C(CH₃)₂D | N | CH | Se | CD₃ | H | CD₃ |
| La820. | N | -CD₂-CH(CH₃)₂ | N | CH | Se | CD₃ | H | CD₃ |
| La821. | N | -CD₂-C(CH₃)₃ | N | CH | Se | CD₃ | H | CD₃ |
| La822. | N | 1-D-cyclopentyl- | N | CH | Se | CD₃ | H | CD₃ |
| La823. | N | 1-D-cyclohexyl- | N | CH | Se | CD₃ | H | CD₃ |
| La824. | N | 4-D-4-methylcyclohexyl- | N | CH | Se | CD₃ | H | CD₃ |
| La825. | N | cyclopentyl-CD₂- | N | CH | Se | CD₃ | H | CD₃ |
| La826. | N | cyclohexyl-CD₂- | N | CH | Se | CD₃ | H | CD₃ |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La827. | N | CH | CH | N | S | H | H | H |
| La828. | N | CH | CH | N | S | $CH_3$ | H | H |
| La829. | N | CH | CH | N | S | H | $CH_3$ | H |
| La830. | N | CH | CH | N | S | $CH_3$ | H | $CH_3$ |
| La831. | N | CH | CH | N | S | $CD_3$ | H | H |
| La832. | N | CH | CH | N | S | H | $CD_3$ | H |
| La833. | N | CH | CH | N | S | $CH_3$ | H | $CD_3$ |
| La834. | N | $CCH_3$ | CH | N | S | H | H | H |
| La835. | N | C-isopropyl | CH | N | S | H | H | H |
| La836. | N | C-CH2-isopropyl | CH | N | S | H | H | H |
| La837. | N | C-CH2-tBu | CH | N | S | H | H | H |
| La838. | N | C-cyclopentyl | CH | N | S | H | H | H |
| La839. | N | C-cyclohexyl | CH | N | S | H | H | H |
| La840. | N | C-(4,4-dimethylcyclohexyl) | CH | N | S | H | H | H |
| La841. | N | C-CH2-cyclopentyl | CH | N | S | H | H | H |
| La842. | N | C-CH2-cyclohexyl | CH | N | S | H | H | H |
| La843. | N | $CCD_3$ | CH | N | S | H | H | H |
| La844. | N | C-CD(CH3)2 | CH | N | S | H | H | H |
| La845. | N | C-CD2-CH(CH3)2 | CH | N | S | H | H | H |
| La846. | N | C-CD2-C(CH3)3 | CH | N | S | H | H | H |

-continued
| Number | X₁ | X₂ | X₃ | X₄ | X | R₂₁ | R₂₂ | R₂₃ |
|---|---|---|---|---|---|---|---|---|
| La847. | N | 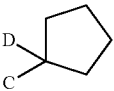 | CH | N | S | H | H | H |
| La848. | N | 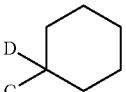 | CH | N | S | H | H | H |
| La849. | N | 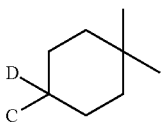 | CH | N | S | H | H | H |
| La850. | N | 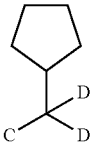 | CH | N | S | H | H | H |
| La851. | N | 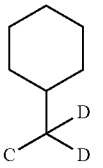 | CH | N | S | H | H | H |
| La852. | N | CCH₃ | CH | N | S | CH₃ | H | H |
| La853. | N |  | CH | N | S | CH₃ | H | H |
| La854. | N | 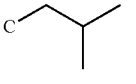 | CH | N | S | CH₃ | H | H |
| La855. | N | 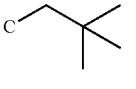 | CH | N | S | CH₃ | H | H |
| La856. | N | 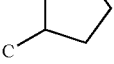 | CH | N | S | CH₃ | H | H |
| La857. | N | 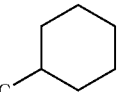 | CH | N | S | CH₃ | H | H |
| La858. | N | 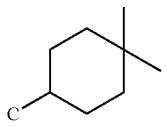 | CH | N | S | CH₃ | H | H |
| La859. | N | 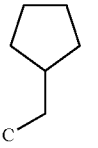 | CH | N | S | CH₃ | H | H |

-continued

| Number | X$_1$ | X$_2$ | X$_3$ | X$_4$ | X | R$_{21}$ | R$_{22}$ | R$_{23}$ |
|---|---|---|---|---|---|---|---|---|
| La860. | N | cyclohexylmethyl | CH | N | S | CH$_3$ | H | H |
| La861. | N | CCD$_3$ | CH | N | S | CD$_3$ | H | H |
| La862. | N | C(D)(CH$_3$)$_2$ | CH | N | S | CD$_3$ | H | H |
| La863. | N | CD$_2$-CH(CH$_3$)$_2$ | CH | N | S | CD$_3$ | H | H |
| La864. | N | CD$_2$-C(CH$_3$)$_3$ | CH | N | S | CD$_3$ | H | H |
| La865. | N | 1-D-cyclopentyl | CH | N | S | CD$_3$ | H | H |
| La866. | N | 1-D-cyclohexyl | CH | N | S | CD$_3$ | H | H |
| La867. | N | D-dimethylcyclohexyl | CH | N | S | CD$_3$ | H | H |
| La868. | N | cyclopentyl-CD$_2$ | CH | N | S | CD$_3$ | H | H |
| La869. | N | cyclohexyl-CD$_2$ | CH | N | S | CD$_3$ | H | H |
| La870. | N | CCH$_3$ | CH | N | S | CH$_3$ | H | CH$_3$ |
| La871. | N | CH(CH$_3$)$_2$ | CH | N | S | CH$_3$ | H | CH$_3$ |
| La872. | N | CH$_2$-CH(CH$_3$)$_2$ | CH | N | S | CH$_3$ | H | CH$_3$ |
| La873. | N | CH$_2$-C(CH$_3$)$_3$ | CH | N | S | CH$_3$ | H | CH$_3$ |

-continued
| Number | X$_1$ | X$_2$ | X$_3$ | X$_4$ | X | R$_{21}$ | R$_{22}$ | R$_{23}$ |
|---|---|---|---|---|---|---|---|---|
| La874. | N | 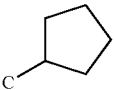 | CH | N | S | CH$_3$ | H | CH$_3$ |
| La875. | N | 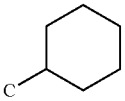 | CH | N | S | CH$_3$ | H | CH$_3$ |
| La876. | N | 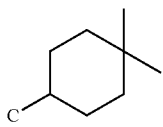 | CH | N | S | CH$_3$ | H | CH$_3$ |
| La877. | N | 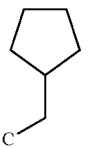 | CH | N | S | CH$_3$ | H | CH$_3$ |
| La878. | N | 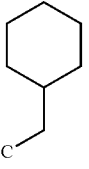 | CH | N | S | CH$_3$ | H | CH$_3$ |
| La879. | N | CCD$_3$ | CH | N | S | CD$_3$ | H | CD$_3$ |
| La880. | N |  | CH | N | S | CD$_3$ | H | CD$_3$ |
| La881. | N | 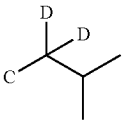 | CH | N | S | CD$_3$ | H | CD$_3$ |
| La882. | N | 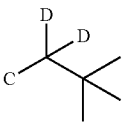 | CH | N | S | CD$_3$ | H | CD$_3$ |
| La883. | N | 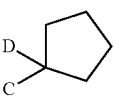 | CH | N | S | CD$_3$ | H | CD$_3$ |
| La884. | N | 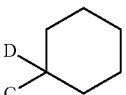 | CH | N | S | CD$_3$ | H | CD$_3$ |
| La885. | N | 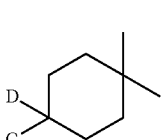 | CH | N | S | CD$_3$ | H | CD$_3$ |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La886. | N | cyclopentyl-CD$_2$- | CH | N | S | $CD_3$ | H | $CD_3$ |
| La887. | N | cyclohexyl-CD$_2$- | CH | N | S | $CD_3$ | H | $CD_3$ |
| La888. | N | CH | CH | N | Se | H | H | H |
| La889. | N | CH | CH | N | Se | $CH_3$ | H | H |
| La890. | N | CH | CH | N | Se | H | $CH_3$ | H |
| La891. | N | CH | CH | N | Se | $CH_3$ | H | $CH_3$ |
| La892. | N | CH | CH | N | Se | $CD_3$ | H | H |
| La893. | N | CH | CH | N | Se | H | $CD_3$ | H |
| La894. | N | CH | CH | N | Se | $CH_3$ | H | $CD_3$ |
| La895. | N | $CCH_3$ | CH | N | Se | H | H | H |
| La896. | N | isopropyl | CH | N | Se | H | H | H |
| La897. | N | isobutyl | CH | N | Se | H | H | H |
| La898. | N | neopentyl | CH | N | Se | H | H | H |
| La899. | N | cyclopentyl-CH$_2$- | CH | N | Se | H | H | H |
| La900. | N | cyclohexyl-CH$_2$- | CH | N | Se | H | H | H |
| La901. | N | 4,4-dimethylcyclohexyl-CH$_2$- | CH | N | Se | H | H | H |
| La902. | N | cyclopentyl-CH$_2$CH$_2$- | CH | N | Se | H | H | H |
| La903. | N | cyclohexyl-CH$_2$CH$_2$- | CH | N | Se | H | H | H |
| La904. | N | $CCD_3$ | CH | N | Se | H | H | H |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La905. | N | (C-C(D)(CH₃)₂) | CH | N | Se | H | H | H |
| La906. | N | (C-C(D)₂-C(CH₃)₃) | CH | N | Se | H | H | H |
| La907. | N | (C-C(D)₂-C(CH₃)₃) | CH | N | Se | H | H | H |
| La908. | N | (cyclopentyl with D, C substituents) | CH | N | Se | H | H | H |
| La909. | N | (cyclohexyl with D, C substituents) | CH | N | Se | H | H | H |
| La910. | N | (dimethylcyclohexyl with D, C) | CH | N | Se | H | H | H |
| La911. | N | (cyclopentyl-CD₂-C) | CH | N | Se | H | H | H |
| La912. | N | (cyclohexyl-CD₂-C) | CH | N | Se | H | H | H |
| La913. | N | CCH₃ | CH | N | Se | CH₃ | H | H |
| La914. | N | (isopropyl-C) | CH | N | Se | CH₃ | H | H |
| La915. | N | (C-CH₂-CH(CH₃)₂) | CH | N | Se | CH₃ | H | H |
| La916. | N | (C-CH₂-C(CH₃)₃) | CH | N | Se | CH₃ | H | H |
| La917. | N | (cyclopentyl-C) | CH | N | Se | CH₃ | H | H |
| La918. | N | (cyclohexyl-C) | CH | N | Se | CH₃ | H | H |

-continued
| Number | X₁ | X₂ | X₃ | X₄ | X | R₂₁ | R₂₂ | R₂₃ |
|---|---|---|---|---|---|---|---|---|
| La919. | N | 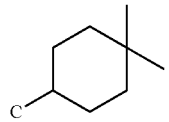 | CH | N | Se | CH₃ | H | H |
| La920. | N | 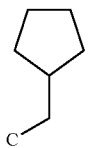 | CH | N | Se | CH₃ | H | H |
| La921. | N | 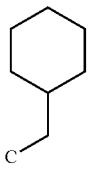 | CH | N | Se | CH₃ | H | H |
| La922. | N | CCD₃ | CH | N | Se | CD₃ | H | H |
| La923. | N |  | CH | N | Se | CD₃ | H | H |
| La924. | N | 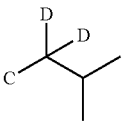 | CH | N | Se | CD₃ | H | H |
| La925. | N | 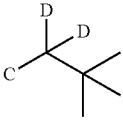 | CH | N | Se | CD₃ | H | H |
| La926. | N | 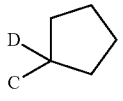 | CH | N | Se | CD₃ | H | H |
| La927. | N | 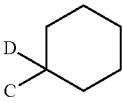 | CH | N | Se | CD₃ | H | H |
| La928. | N | 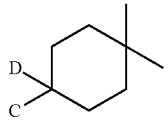 | CH | N | Se | CD₃ | H | H |
| La929. | N | 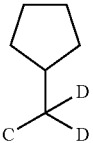 | CH | N | Se | CD₃ | H | H |
| La930. | N | 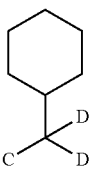 | CH | N | Se | CD₃ | H | H |

-continued
| Number | X₁ | X₂ | X₃ | X₄ | X | R₂₁ | R₂₂ | R₂₃ |
|---|---|---|---|---|---|---|---|---|
| La931. | N | CCH₃ | CH | N | Se | CH₃ | H | CH₃ |
| La932. | N |  | CH | N | Se | CH₃ | H | CH₃ |
| La933. | N | 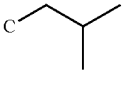 | CH | N | Se | CH₃ | H | CH₃ |
| La934. | N | 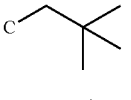 | CH | N | Se | CH₃ | H | CH₃ |
| La935. | N | 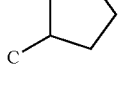 | CH | N | Se | CH₃ | H | CH₃ |
| La936. | N | 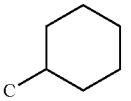 | CH | N | Se | CH₃ | H | CH₃ |
| La937. | N | 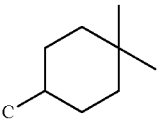 | CH | N | Se | CH₃ | H | CH₃ |
| La938. | N | 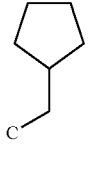 | CH | N | Se | CH₃ | H | CH₃ |
| La939. | N | 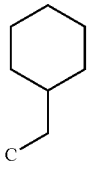 | CH | N | Se | CH₃ | H | CH₃ |
| La940. | N | CCD₃ | CH | N | Se | CD₃ | H | CD₃ |
| La941. | N |  | CH | N | Se | CD₃ | H | CD₃ |
| La942. | N | 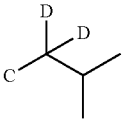 | CH | N | Se | CD₃ | H | CD₃ |
| La943. | N | 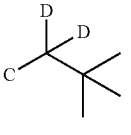 | CH | N | Se | CD₃ | H | CD₃ |
| La944. | N | 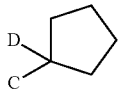 | CH | N | Se | CD₃ | H | CD₃ |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La945. | N | 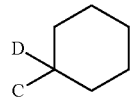 | CH | N | Se | $CD_3$ | H | $CD_3$ |
| La946. | N | 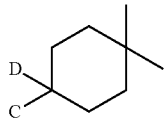 | CH | N | Se | $CD_3$ | H | $CD_3$ |
| La947. | N | 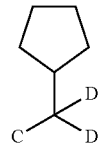 | CH | N | Se | $CD_3$ | H | $CD_3$ |
| La948. | N | 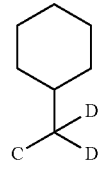 | CH | N | Se | $CD_3$ | H | $CD_3$ |
| La949. | CH | N | CH | N | S | H | H | H |
| La950. | CH | N | CH | N | S | $CH_3$ | H | H |
| La951. | CH | N | CH | N | S | H | $CH_3$ | H |
| La952. | CH | N | CH | N | S | $CH_3$ | H | $CH_3$ |
| La953. | CH | N | CH | N | S | $CD_3$ | H | H |
| La954. | CH | N | CH | N | S | H | $CD_3$ | H |
| La955. | CH | N | CH | N | S | $CH_3$ | H | $CD_3$ |
| La956. | CH | N | $CCH_3$ | N | S | H | H | H |
| La957. | CH | N |  | N | S | H | H | H |
| La958. | CH | N | 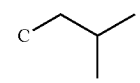 | N | S | H | H | H |
| La959. | CH | N | 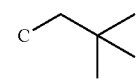 | N | S | H | H | H |
| La960. | CH | N | 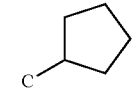 | N | S | H | H | H |
| La961. | CH | N | 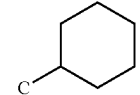 | N | S | H | H | H |
| La962. | CH | N | 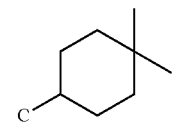 | N | S | H | H | H |
| La963. | CH | N |  | N | S | H | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La964. | CH | N | 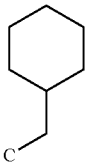 | N | S | H | H | H |
| La965. | CH | N | CCD$_3$ | N | S | H | H | H |
| La966. | CH | N |  | N | S | H | H | H |
| La967. | CH | N | 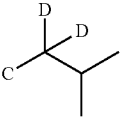 | N | S | H | H | H |
| La968. | CH | N | 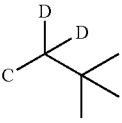 | N | S | H | H | H |
| La969. | CH | N | 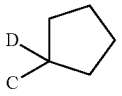 | N | S | H | H | H |
| La970. | CH | N | 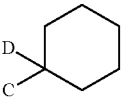 | N | S | H | H | H |
| La971. | CH | N | 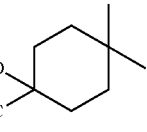 | N | S | H | H | H |
| La972. | CH | N | 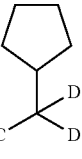 | N | S | H | H | H |
| La973. | CH | N | 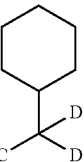 | N | S | H | H | H |
| La974. | CH | N | CCH$_3$ | N | S | CH$_3$ | H | H |
| La975. | CH | N |  | N | S | CH$_3$ | H | H |
| La976. | CH | N | 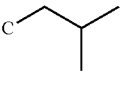 | N | S | CH$_3$ | H | H |
| La977. | CH | N | 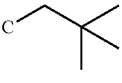 | N | S | CH$_3$ | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La978. | CH | N | 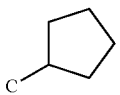 | N | S | $CH_3$ | H | H |
| La979. | CH | N | 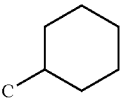 | N | S | $CH_3$ | H | H |
| La980. | CH | N | 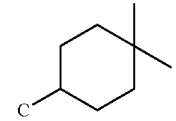 | N | S | $CH_3$ | H | H |
| La981. | CH | N | 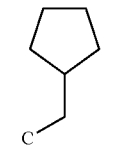 | N | S | $CH_3$ | H | H |
| La982. | CH | N | 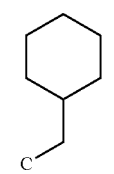 | N | S | $CH_3$ | H | H |
| La983. | CH | N | $CCD_3$ | N | S | $CD_3$ | H | H |
| La984. | CH | N | 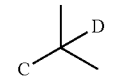 | N | S | $CD_3$ | H | H |
| La985. | CH | N | 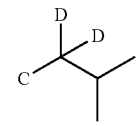 | N | S | $CD_3$ | H | H |
| La986. | CH | N | 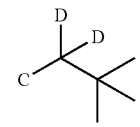 | N | S | $CD_3$ | H | H |
| La987. | CH | N | 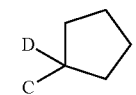 | N | S | $CD_3$ | H | H |
| La988. | CH | N | 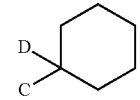 | N | S | $CD_3$ | H | H |
| La989. | CH | N | 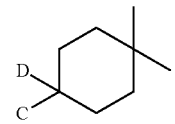 | N | S | $CD_3$ | H | H |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La990. | CH | N | cyclopentyl-CD$_2$- | N | S | CD$_3$ | H | H |
| La991. | CH | N | cyclohexyl-CD$_2$- | N | S | CD$_3$ | H | H |
| La992. | CH | N | CCH$_3$ | N | S | CH$_3$ | H | CH$_3$ |
| La993. | CH | N | isopropyl-C- | N | S | CH$_3$ | H | CH$_3$ |
| La994. | CH | N | isobutyl-C- | N | S | CH$_3$ | H | CH$_3$ |
| La995. | CH | N | neopentyl-C- | N | S | CH$_3$ | H | CH$_3$ |
| La996. | CH | N | cyclopentyl-C- | N | S | CH$_3$ | H | CH$_3$ |
| La997. | CH | N | cyclohexyl-C- | N | S | CH$_3$ | H | CH$_3$ |
| La998. | CH | N | 4,4-dimethylcyclohexyl-C- | N | S | CH$_3$ | H | CH$_3$ |
| La999. | CH | N | cyclopentyl-CH$_2$- | N | S | CH$_3$ | H | CH$_3$ |
| La1000. | CH | N | cyclohexyl-CH$_2$- | N | S | CH$_3$ | H | CH$_3$ |
| La1001. | CH | N | CCD$_3$ | N | S | CD$_3$ | H | CD$_3$ |
| La1002. | CH | N | C(CH$_3$)$_2$D | N | S | CD$_3$ | H | CD$_3$ |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La1003. | CH | N | isopropyl-d2 (C-CD2-CH(CH3)) | N | S | $CD_3$ | H | $CD_3$ |
| La1004. | CH | N | neopentyl-d2 (C-CD2-C(CH3)3) | N | S | $CD_3$ | H | $CD_3$ |
| La1005. | CH | N | 1-D-cyclopentyl | N | S | $CD_3$ | H | $CD_3$ |
| La1006. | CH | N | 1-D-cyclohexyl | N | S | $CD_3$ | H | $CD_3$ |
| La1007. | CH | N | 4,4-dimethyl-1-D-cyclohexyl | N | S | $CD_3$ | H | $CD_3$ |
| La1008. | CH | N | cyclopentyl-CD2- | N | S | $CD_3$ | H | $CD_3$ |
| La1009. | CH | N | cyclohexyl-CD2- | N | S | $CD_3$ | H | $CD_3$ |
| La1010. | CH | N | CH | N | Se | H | H | H |
| La1011. | CH | N | CH | N | Se | $CH_3$ | H | H |
| La1012. | CH | N | CH | N | Se | H | $CH_3$ | H |
| La1013. | CH | N | CH | N | Se | $CH_3$ | H | $CH_3$ |
| La1014. | CH | N | CH | N | Se | $CD_3$ | H | H |
| La1015. | CH | N | CH | N | Se | H | $CD_3$ | H |
| La1016. | CH | N | CH | N | Se | $CH_3$ | H | $CD_3$ |
| La1017. | CH | N | $CCH_3$ | N | Se | H | H | H |
| La1018. | CH | N | isobutyl (C-CH(CH3)2) | N | Se | H | H | H |
| La1019. | CH | N | isobutyl (C-CH2-CH(CH3)) | N | Se | H | H | H |
| La1020. | CH | N | neopentyl (C-CH2-C(CH3)3) | N | Se | H | H | H |
| La1021. | CH | N | cyclopentyl | N | Se | H | H | H |

| Number | $X_1$ | $X_2$ | $X_3$ | $X_4$ | X | $R_{21}$ | $R_{22}$ | $R_{23}$ |
|---|---|---|---|---|---|---|---|---|
| La1022. | CH | N | 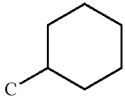 | N | Se | H | H | H |
| La1023. | CH | N | 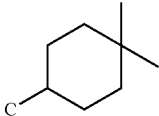 | N | Se | H | H | H |
| La1024. | CH | N | 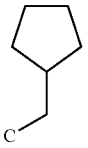 | N | Se | H | H | H |
| La1025. | CH | N | 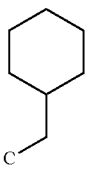 | N | Se | H | H | H |
| La1026. | CH | N | CCD$_3$ | N | Se | H | H | H |
| La1027. | CH | N |  | N | Se | H | H | H |
| La1028. | CH | N | 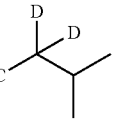 | N | Se | H | H | H |
| La1029. | CH | N | 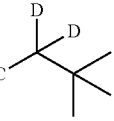 | N | Se | H | H | H |
| La1030. | CH | N | 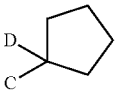 | N | Se | H | H | H |
| La1031. | CH | N | 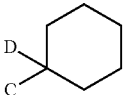 | N | Se | H | H | H |
| La1032. | CH | N | 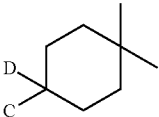 | N | Se | H | H | H |
| La1033. | CH | N | 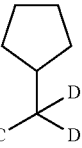 | N | Se | H | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| la1034. | CH | N | 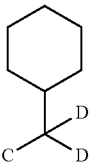 | N | Se | H | H | H |
| La1035. | CH | N | $CCH_3$ | N | Se | $CH_3$ | H | H |
| La1036. | CH | N |  | N | Se | $CH_3$ | H | H |
| La1037. | CH | N | 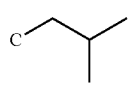 | N | Se | $CH_3$ | H | H |
| La1038. | CH | N | 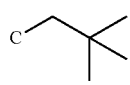 | N | Se | $CH_3$ | H | H |
| La1039. | CH | N | 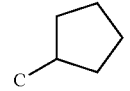 | N | Se | $CH_3$ | H | H |
| La1040. | CH | N | 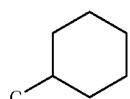 | N | Se | $CH_3$ | H | H |
| La1041. | CH | N | 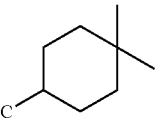 | N | Se | $CH_3$ | H | H |
| La1042. | CH | N | 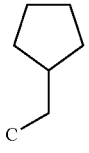 | N | Se | $CH_3$ | H | H |
| La1043. | CH | N | 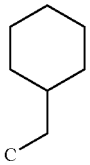 | N | Se | $CH_3$ | H | H |
| La1044. | CH | N | $CCD_3$ | N | Se | $CD_3$ | H | H |
| La1045. | CH | N |  | N | Se | $CD_3$ | H | H |
| La1046. | CH | N | 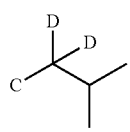 | N | Se | $CD_3$ | H | H |
| La1047. | CH | N | 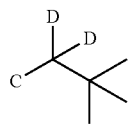 | N | Se | $CD_3$ | H | H |

-continued
| Number | X₁ | X₂ | X₃ | X₄ | X | R₂₁ | R₂₂ | R₂₃ |
|---|---|---|---|---|---|---|---|---|
| La1048. | CH | N | 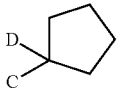 | N | Se | CD₃ | H | H |
| La1049. | CH | N | 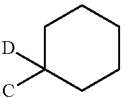 | N | Se | CD₃ | H | H |
| La1050. | CH | N | 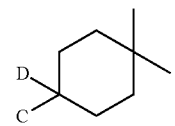 | N | Se | CD₃ | H | H |
| La1051. | CH | N | 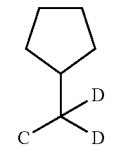 | N | Se | CD₃ | H | H |
| La1052. | CH | N | 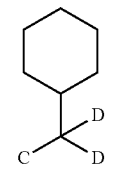 | N | Se | CD₃ | H | H |
| La1053. | CH | N | CCH₃ | N | Se | CH₃ | H | CH₃ |
| La1054. | CH | N | 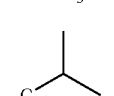 | N | Se | CH₃ | H | CH₃ |
| La1055. | CH | N | 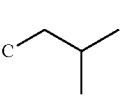 | N | Se | CH₃ | H | CH₃ |
| La1056. | CH | N | 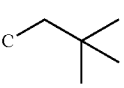 | N | Se | CH₃ | H | CH₃ |
| La1057. | CH | N | 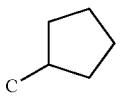 | N | Se | CH₃ | H | CH₃ |
| La1058. | CH | N | 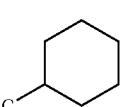 | N | Se | CH₃ | H | CH₃ |
| La1059. | CH | N | 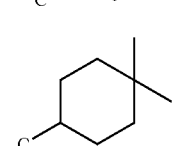 | N | Se | CH₃ | H | CH₃ |
| La1060. | CH | N |  | N | Se | CH₃ | H | CH₃ |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La1061. | CH | N | 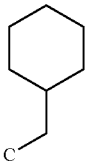 | N | Se | $CH_3$ | H | $CH_3$ |
| La1062. | CH | N | $CCD_3$ | N | Se | $CD_3$ | H | $CD_3$ |
| La1063. | CH | N |  | N | Se | $CD_3$ | H | $CD_3$ |
| La1064. | CH | N | 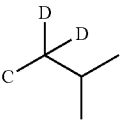 | N | Se | $CD_3$ | H | $CD_3$ |
| La1065. | CH | N | 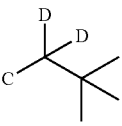 | N | Se | $CD_3$ | H | $CD_3$ |
| La1066. | CH | N | 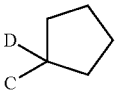 | N | Se | $CD_3$ | H | $CD_3$ |
| La1067. | CH | N | 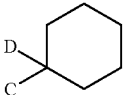 | N | Se | $CD_3$ | H | $CD_3$ |
| La1068. | CH | N | 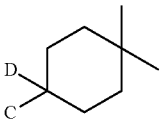 | N | Se | $CD_3$ | H | $CD_3$ |
| La1069. | CH | N | 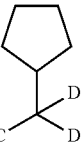 | N | Se | $CD_3$ | H | $CD_3$ |
| La1070. | CH | N | 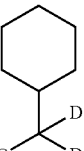 | N | Se | $CD_3$ | H | $CD_3$ |

In one embodiment, wherein $L_a$ is selected from the group consisting of $L_{a1}$ to $L_{a1070}$. The specific structures of $L_{a1}$ to $L_{a1070}$ are listed above.
In one embodiment, wherein the metal complex has the formula of $IrL_a(L_b)_2$, $L_a$ is selected from anyone of $L_{a1}$ to $L_{a1070}$ and $L_b$ is selected from anyone or both of the group consisting of:
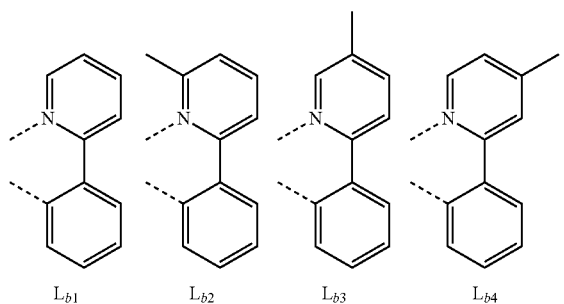
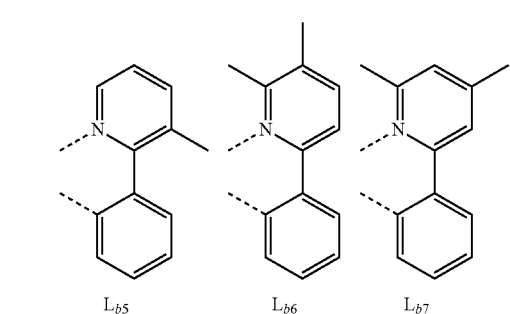
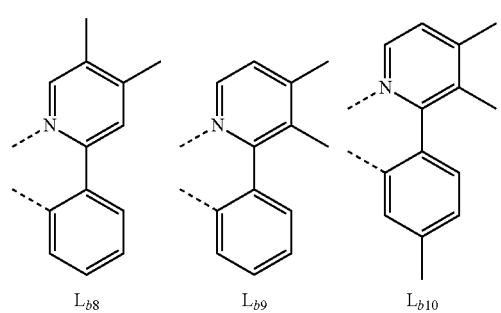
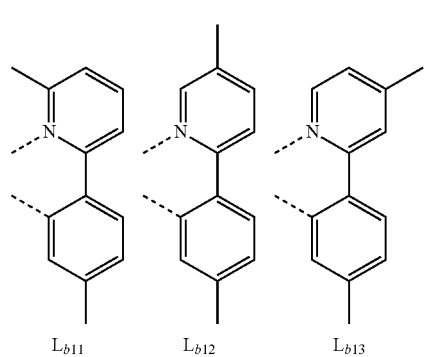
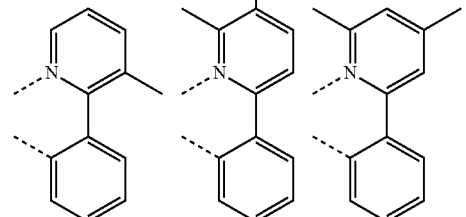
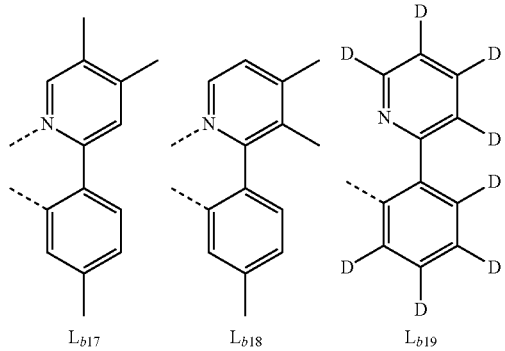
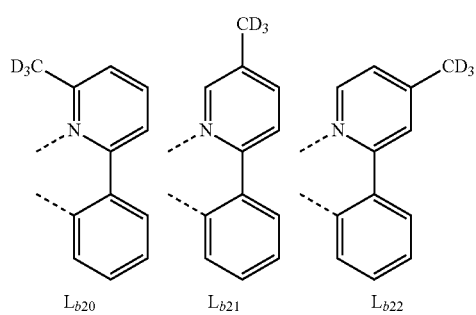
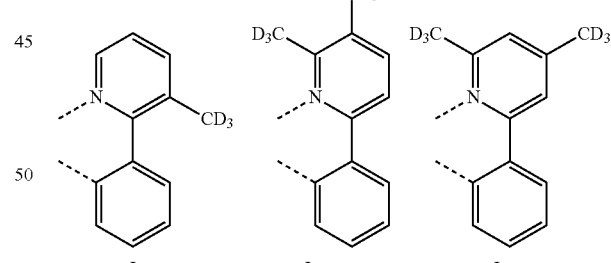
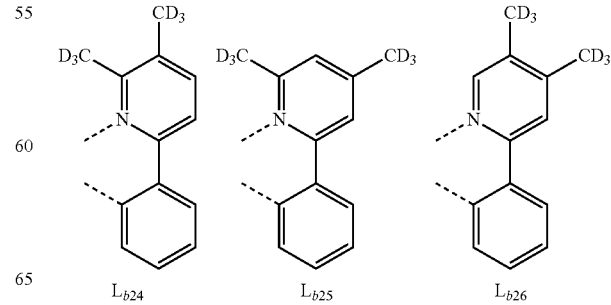

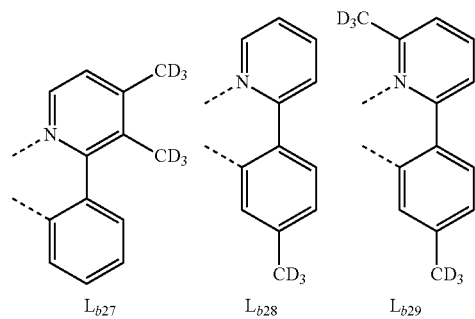
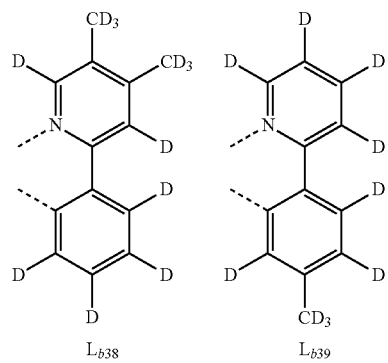
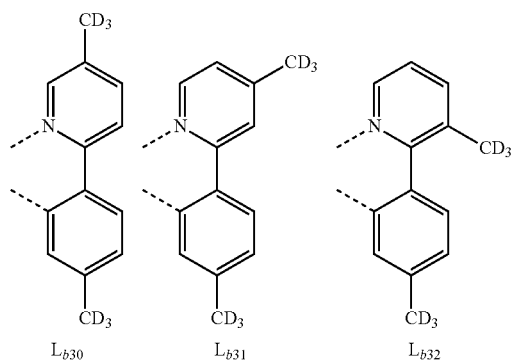
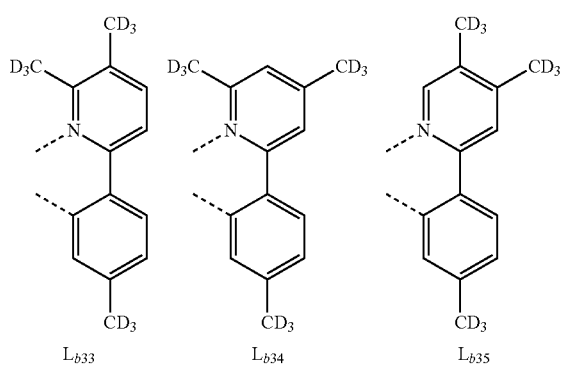
In one embodiment, wherein the metal complex has the formula of $Ir(L_a)_2L_c$, $L_a$ is selected from anyone or both of $L_{a1}$ to $L_{a1070}$ and $L_c$ is selected from anyone of the group consisting of:
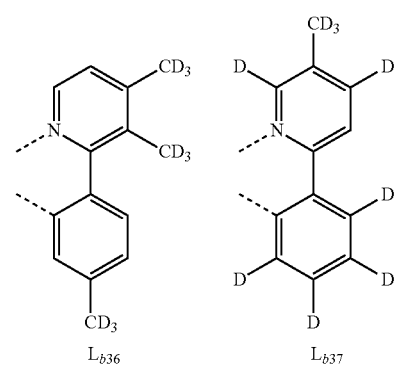
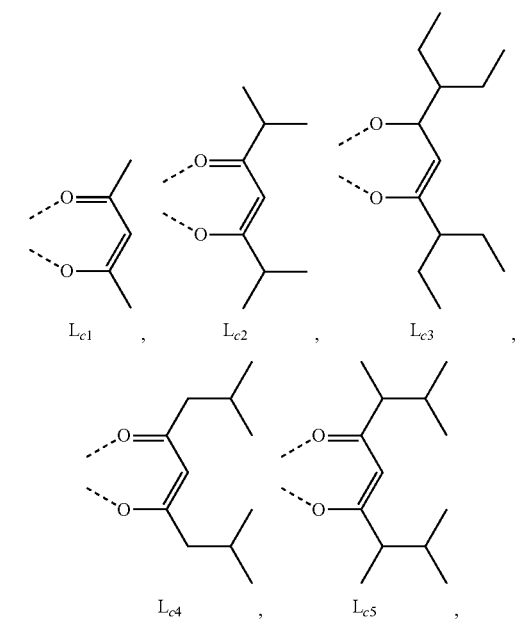

-continued

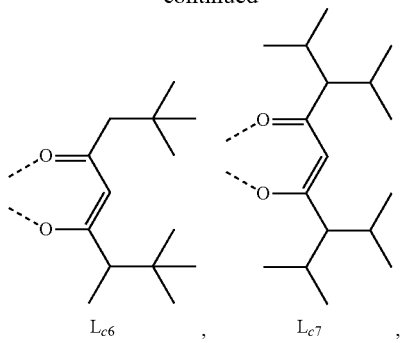

$L_{c6}$, $L_{c7}$,

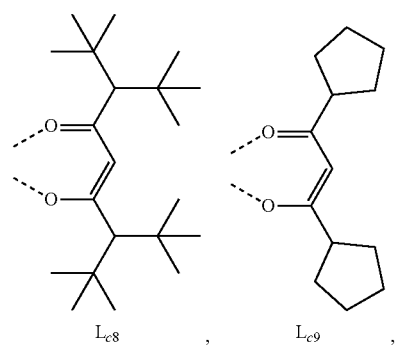

$L_{c8}$, $L_{c9}$,

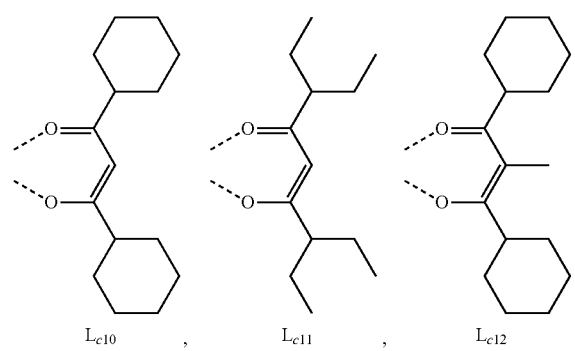

$L_{c10}$, $L_{c11}$, $L_{c12}$,

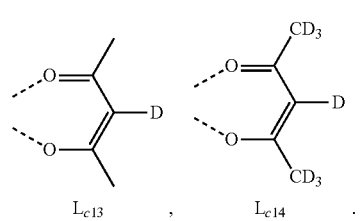

$L_{c13}$, $L_{c14}$.

According to another embodiment, an electroluminescent device is disclosed. The electroluminescent device comprises:
an anode,
a cathode,
and an organic layer, disposed between the anode and the cathode, comprising a metal complex having a partial structure represented by Formula 1:

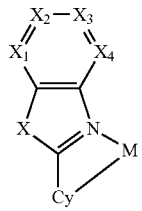

Formula 1

Wherein Cy is a substituted or unsubstituted aryl or heteroaryl group having 5 to 24 aromatic ring atoms;
Cy is bonded to M via a carbon atom;
M is selected from the group consisting of Cu, Ag, Au, Ru, Rh, Pd, Os, Ir, and Pt;
X is selected from the group consisting of O, S, and Se;
$X_1$, $X_2$, $X_3$, and $X_4$ are independently selected from N or CR;
at least one of $X_1$, $X_2$, $X_3$, and $X_4$ is N;
wherein R is selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;
two adjacent substituents are optionally joined to form a ring.

In one embodiment, wherein the organic layer is an emissive layer and the metal complex is an emitter.

In one embodiment, wherein the organic layer further comprises a host.

In one embodiment, wherein the organic layer comprises at least two hosts.

In one embodiment, wherein the host compound comprises at least one the chemical groups selected from the group consisting of: benzene, biphenyl, carbazole, azacarbazole, indolocarbazole, dibenzothiophene, dibenzofuran, dibenzoselenophene, triphenylene, fluorene, silafluorene, naphthalene, phenanthrene, pyridine, pyrimidine, triazine, quinazoline, quinoxaline, azadibenzothiophene, azadibenzofuran, azadibenzoselenophene, azatriphenylene, azaphenanthrene and the combinations thereof.

In one embodiment, wherein the electroluminescent device is incorporated into another device selected from the group consisting of: a consumer product, an electronic component module, an organic light-emitting device, and a lighting panel.

According to yet another embodiment, a formulation comprising a metal complex is also disclosed. The specific structure of the metal complex is described in any of the above embodiments.

Combination with Other Materials

The materials described herein as useful for a particular layer in an organic light emitting device may be used in combination with a wide variety of other materials present in the device. The combinations of these materials are described in more detail in U.S. Pat. App. No. 20160359122 at paragraphs 0132-0161, which are incorporated by reference in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, emissive dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which are incorporated by reference in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatography-mass spectrometer produced by SHIMADZU, gas chromatography-mass spectrometer produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

Material Synthesis Example

The method for preparing the compounds of the present invention is not limited. The following compounds is exemplified as a typical but non-limiting example, and its synthesis route and preparation method are as follows:

Synthesis of Compound A

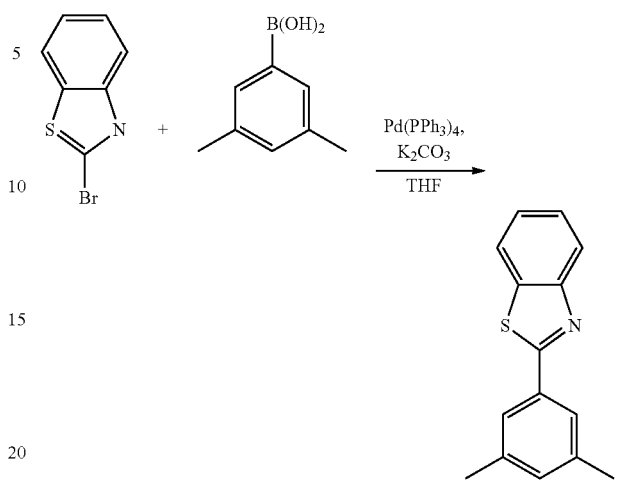

Synthesis of 2-(3,5-dimethylphenyl)benzo[d]thiazole. 2-bromobenzo[d]thiazole (40 g, 186 mmol), (3,5-dimethylphenyl)boronic acid (33.6 g, 224 mmol), tetrakis(triphenylphosphine)palladium(0) (10.8 g, 9 mmol) and potassium carbonate (77.2 g, 560 mmol) were added to 800 mL THF in a 2 L three-neck round bottom flask under room temperature. The resulting mixture was purged with nitrogen for 5 min and refluxed overnight under nitrogen. After cooling to room temperature, the reaction mixture was filtrated through Celite and The Celite was washed with water and ethyl acetate. The layers were separated and aqueous layer was extracted with ethyl acetate. The combined organic layer was dried over anhydrous $Na_2SO_4$ and evaporated to residue. The residue was purified by flash chromatography (eluent: ethyl acetate/petroleum ether=1/200, v/v) to give 2-(3,5-dimethylphenyl)benzo[d]thiazole as white solid (6.0 g, 13.5%).

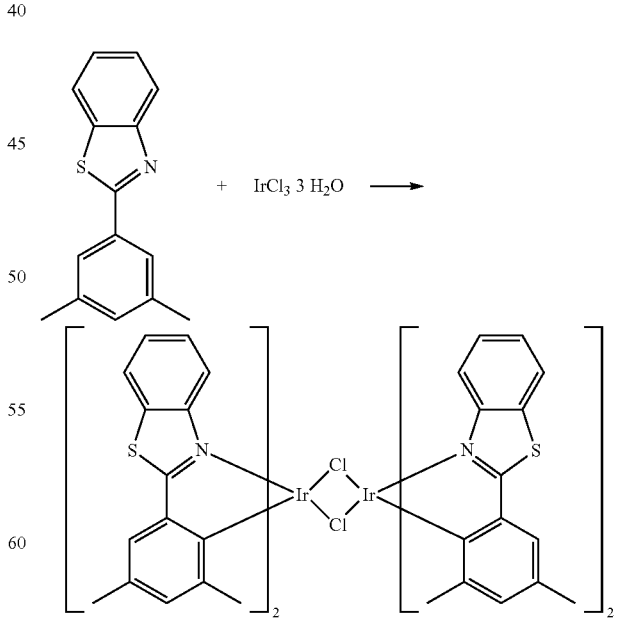

Synthesis of iridium dimer. A mixture of 2-(3,5-dimethylphenyl)benzo[d]thiazole (3.0 g, 12.5 mmol), $IrCl_3 \cdot 3H_2O$ (883 mg, 2.506 mmol), 2-ethoxyethanol (60 mL) and water (20 mL) was refluxed under nitrogen for 24 h. After cooling to room temperature, the solvent was removed under reduced pressure to give the iridium dimer that was used in next step without further purification.

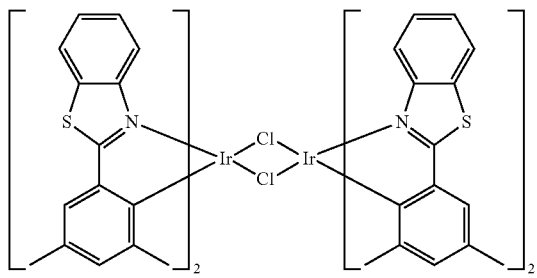

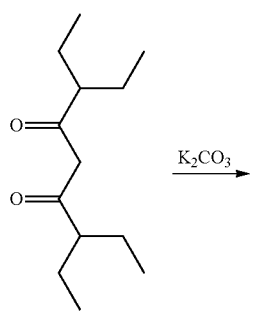

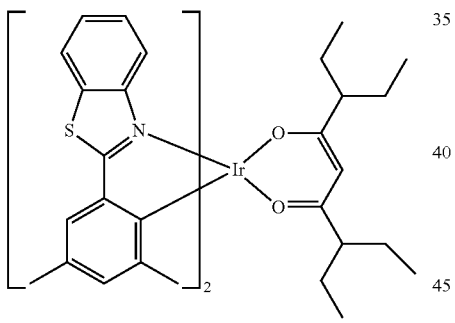

Synthesis of Compound A. Dimer (1.25 mmol), 3,7-diethylnonane-4,6-dione (1.73 g, 8.16 mmol), K$_2$CO$_3$ (1.6 g, 12.05 mmol), and 2-ethoxyethanol (20 mL) was stirred at room temperature under nitrogen for 24 h. The precipitate was filtrated through Celite and washed with ethanol. Dichloromethane was added to the solid and the filtrate was collected. Then ethanol was added and the resulting solution was concentrated, but not to dryness. 2.0 g product was obtained after filtration. The molecular weight of the product was 880, which was confirmed as the target product.

Synthesis of Compound Ir(L$_{a46}$)$_2$(L$_{c3}$)

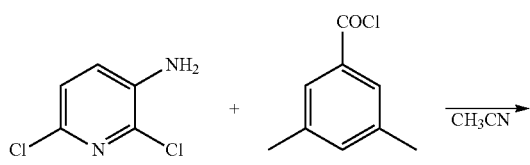

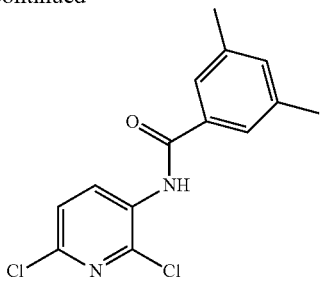

Synthesis of N-(2,6-dichloropyridin-3-yl)-3,5-dimethylbenzamide. 3,5-dimethylbenzoyl chloride (45.5 g, 269 mmol) was dissolved in 600 mL CH$_3$CN in a 2 L two-neck round bottom flask. The solution was purged with nitrogen for 5 min and then 2,6-dichloropyridin-3-amine (40 g, 245 mmol) was added portion wise. The resulting mixture was heated at 70° C. for 12 h. After cooling to room temperature, precipitate formed in the reaction solution and was collected by filtration and washed with MeOH which gave N-(2,6-dichloropyridin-3-yl)-3,5-dimethylbenzamide as white solid (24 g, 33.2%).

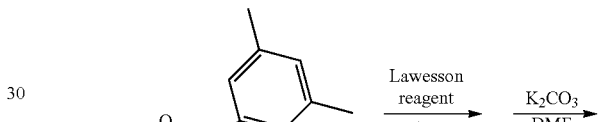

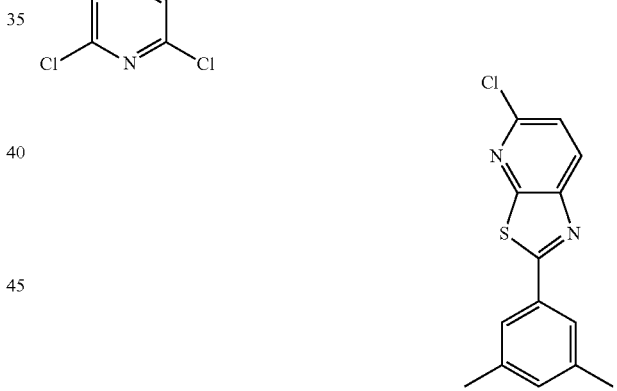

Synthesis of 5-chloro-2-(3,5-dimethylphenyl)thiazolo[5,4-b]pyridine. A mixture of N-(2,6-dichloropyridin-3-yl)-3,5-dimethylbenzamide (24 g, 81.6 mmol), Lawesson reagent (49 g, 122.5 mmol) and toluene (1 L) was refluxed under nitrogen for 5 h. After cooling to room temperature, the solvent was removed under reduced pressure. Then K$_2$CO$_3$ (33.7 g, 244.8 mmol) and DMF (1 L) was added to the residue and the resulting mixture was heated at 160° C. After TLC showed the completion of the reaction, the reaction solution was cooled to room temperature and 1 L water was added. The layers were separated and aqueous layer was extracted with ethyl acetate. The organic layer was combined, dried over anhydrous Na$_2$SO$_4$ and evaporated to residue. The residue was purified by flash chromatography (eluent: ethyl acetate/petroleum ether=1/50, v/v) to give 5-chloro-2-(3,5-dimethylphenyl)thiazolo[5,4-b]pyridine as white solid (10 g, 44.6%).

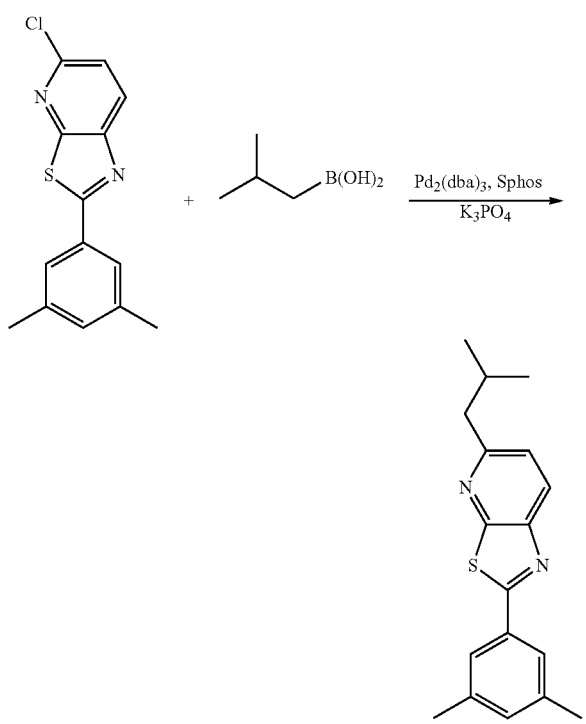
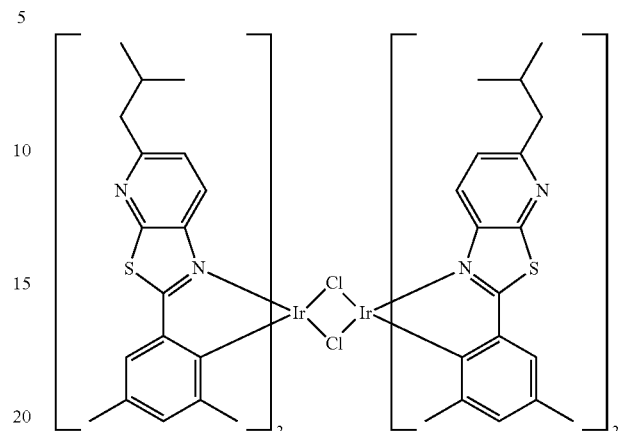

Synthesis of 2-(3,5-dimethylphenyl)-5-isobutylthiazolo[5,4-b]pyridine. 5-chloro-2-(3,5-dimethylphenyl)thiazolo[5,4-b]pyridine (5.5 g, 18.5 mmol), isobutylboronic acid (3.78 g, 37.1 mmol), tris(dibenzylideneacetone)dipalladium(0) (847 mg, 0.925 mmol), 2-dicyclohexylphosphino-2',6'-dimethoxy-1,1'-biphenyl (1.52 mg, 3.7 mmol) and potassium phosphate (11.7 g, 55.5 mmol) were added to 100 mL toluene in a 250 mL three-neck round bottom flask under room temperature. The resulting mixture was purged with nitrogen for 5 min and refluxed overnight under nitrogen. After cooling to room temperature, the reaction mixture was filtrated through Celite and The Celite was washed with water and ethyl acetate. The layers were separated and aqueous layer was extracted with ethyl acetate. The organic layer was then collected, dried over anhydrous $Na_2SO_4$ and evaporated to residue. The residue was purified by flash chromatography (eluent: ethyl acetate/petroleum ether=1/25, v/v) to give 2-(3,5-dimethylphenyl)-5-isobutylthiazolo[5,4-b]pyridine as colorless oil (3 g, 54.8%).

Synthesis of iridium dimer. A mixture of 2-(3,5-dimethylphenyl)-5-isobutylthiazolo[5,4-b]pyridine (1.6 g, 5.4 mmol), $IrCl_3 \cdot 3H_2O$ (635 mg, 1.8 mmol), 2-ethoxyethanol (35 mL) and water (10 mL) was refluxed under nitrogen for 24 h. After cooling to room temperature, the solvent was removed under reduced pressure to give the iridium dimer that was used in next step without further purification.

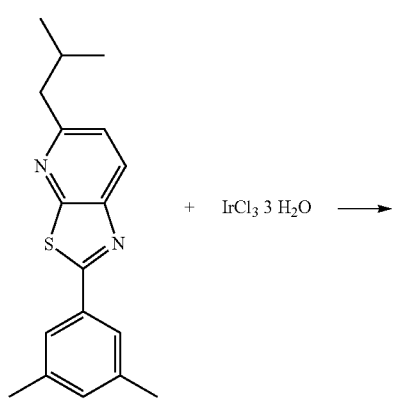
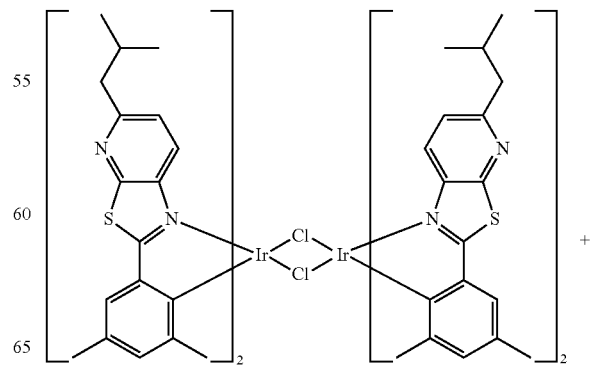

-continued

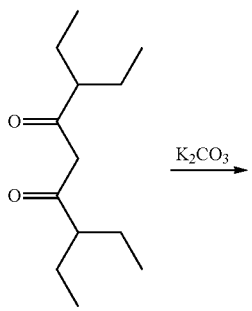

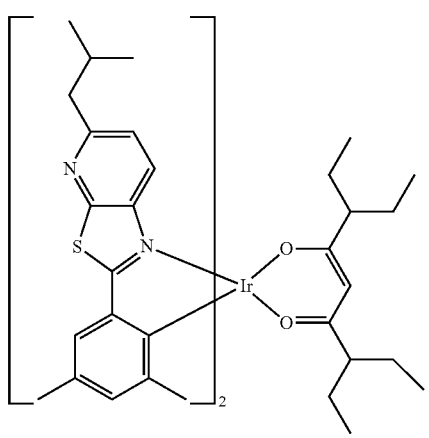

Synthesis of Compound Ir(L$_{a46}$)$_2$(L$_{c3}$). Dimer (0.9 mmol), 3,7-diethylnonane-4,6-dione (1.9 g, 9 mmol), K$_2$CO$_3$ (1.24 g, 9 mmol), and 2-ethoxyethanol (50 mL) was stirred at room temperature under nitrogen for 24 h. The precipitate was filtrated through Celite and washed with ethanol. Dichloromethane was added to the solid and the filtrate was collected. Then ethanol was added and the resulting solution was concentrated, but not to dryness. 1.0 g product was obtained after filtration. The molecular weight of the product was 994, which was confirmed as the target product.

The persons skilled in the art should know that the above preparation method is only an illustrative example, and the persons skilled in the art can obtain the structure of other compounds of the present invention by modifying the above preparation method.

Device Examples:

A glass substrate with 120 nm thick indium-tin-oxide (ITO) anode was first cleaned and then treated with oxygen plasma and UV ozone. After the treatments, the substrate was baked dry in a glovebox to remove moisture. The substrate was then mounted on a substrate holder and loaded into a vacuum chamber. The organic layers specified below were deposited in sequence by thermal vacuum deposition on the ITO anode at a rate of 0.2-2 Å/s at a vacuum of around $10^{-8}$ torr. Compound HI was used as the hole injection layer (HIL). Compound HT was used as the hole transporting layer (HTL). Compound EB was used as the electron blocking layer (EBL). Then the inventive compound or the comparative compound was doped in the host Compound RH as the emitting layer (EML). On the emitting layer, a mixture of Compound ET and 8-Hydroxyquinolinolato-lithium (Liq) was deposited as the electron transporting layer (ETL). Finally, 1 nm-thick Liq was deposited as the electron injection layer and 100 nm of Al was deposited as the cathode. The device was then transferred back to the glovebox and encapsulated with a glass lid and a moisture getter to complete the device.

The detailed device layer structure and thicknesses are shown in the table below. In the layers in which more than one materials were used, they were obtained by doping different compounds in the weight ratios described therein.

TABLE 1

Device structure of device examples

| Device ID | HIL | HTL | EBL | EML | ETL |
|---|---|---|---|---|---|
| Example 1 | Compound HI (100 Å) | Compound HT (400 Å) | Compound EB (50 Å) | Compound RH:Compound Ir(L$_{a46}$)$_2$(L$_{c3}$) (93:7) (400 Å) | Compound ET:Liq (35:65) (350 Å) |
| Comparative Example 1 | Compound HI (100 Å) | Compound HT (400 Å) | Compound EB (50 Å) | Compound RH:Compound A (93:7) (400 Å) | Compound ET:Liq (35:65) (350 Å) |

The structures of the materials used in the devices are shown below:

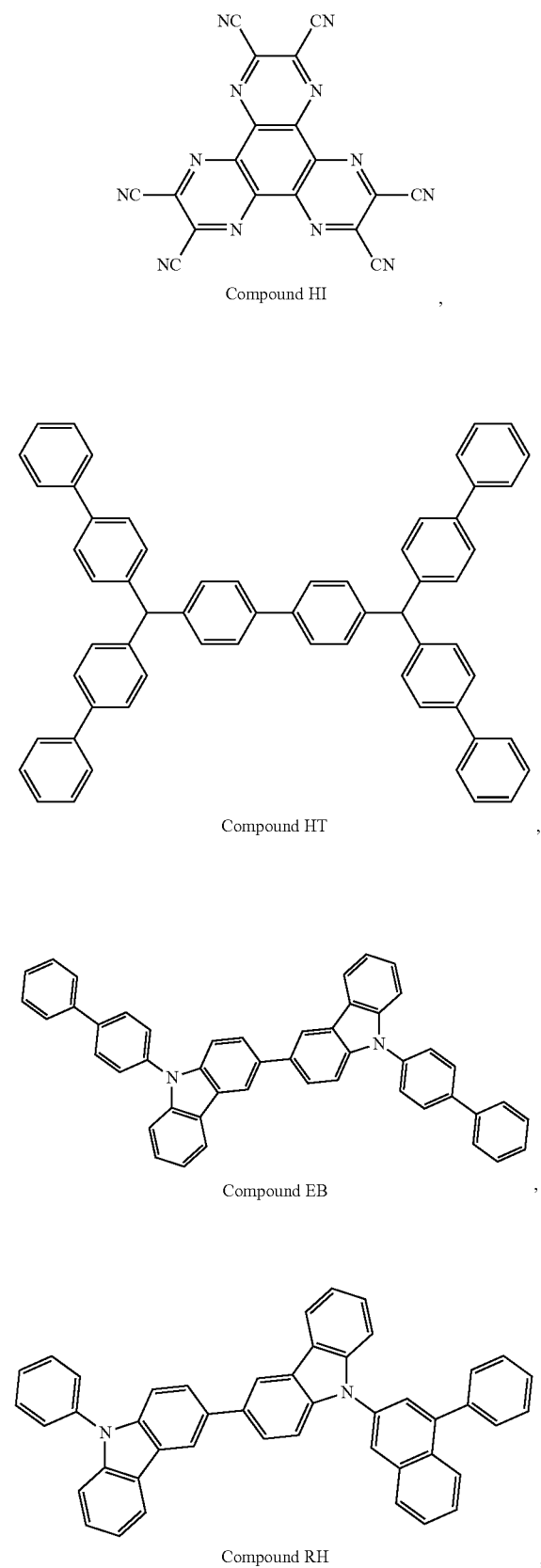

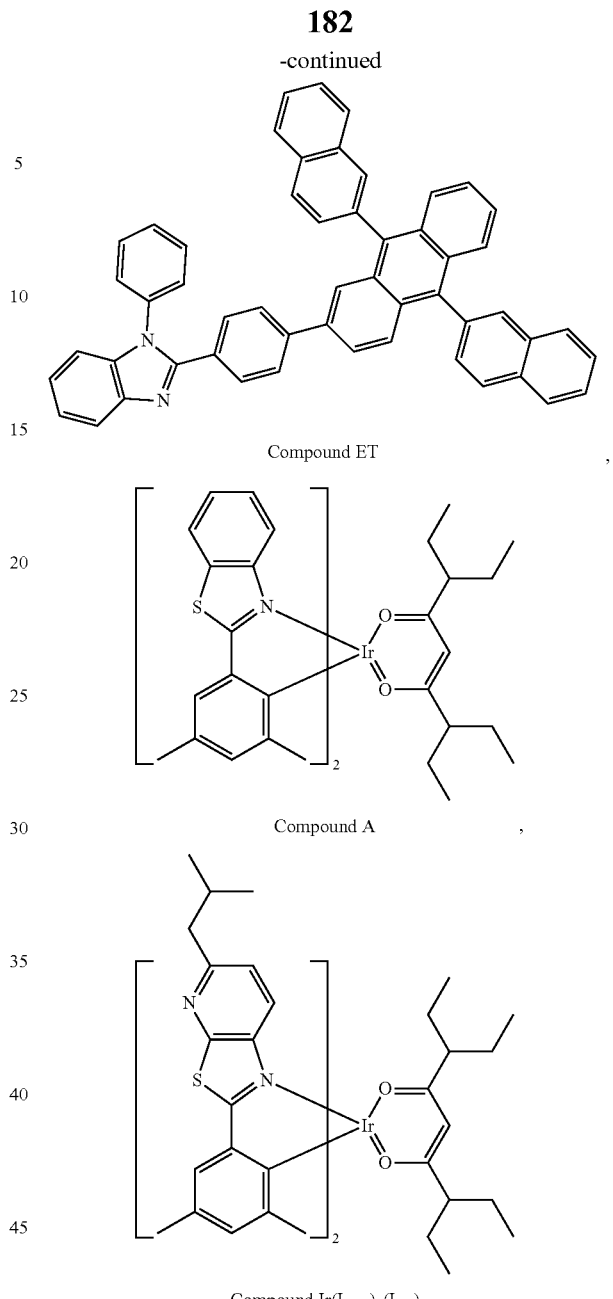

The IVL and lifetime characteristics of the devices were measured at various current densities and voltages. The external quantum efficiency (EQE), λ max, full width at half maximum (FWHM), and CIE data were measured at 1000 nits. The lifetime was tested at a constant current from an initial brightness of 7500 nits.

TABLE 2

Device data

| Device ID | CIE (x, y) | λ max (nm) | FWHM (nm) | EQE (%) | LT95 (h) |
| --- | --- | --- | --- | --- | --- |
| Example 1 | (0.561, 0.436) | 581 | 45 | 17 | 51 |
| Comparative Example 1 | (0.516, 0.482) | 567 | 59 | 15 | 18 |

Discussion:

From the data in table 2, it can be clearly seen that the device performance of inventive compound is superior than the comparative compound. The inventive compound showed more saturated color. The FWHM of the inventive compound is much narrower than that of the comparative compound (45 nm vs. 59 nm). In addition, the inventive compound had higher EQE than the comparative compound (17% vs. 15%). The inventive compound also showed much longer device lifetime than the comparative compound (51 h vs. 18 h). Therefore, by introducing a nitrogen atom to the top benzene ring of the ligand in the current invention significantly improved the device performance, making the compounds more suitable for commercial applications.

It is understood that the various embodiments described herein are by way of example only and are not intended to limit the scope of the invention. The present invention as claimed may therefore include variations from the particular examples and preferred embodiments described herein, as will be apparent to one of skill in the art. Many of the materials and structures described herein may be substituted with other materials and structures without deviating from the spirit of the invention. It is understood that various theories as to why the invention works are not intended to be limiting.

What is claimed is:

1. A metal complex having a partial structure represented by Formula 1:

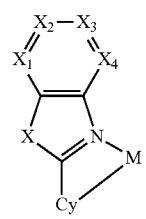

Formula 1 wherein

Cy is a substituted or unsubstituted aryl or heteroaryl group having 5 to 24 aromatic ring atoms;

Cy is bonded to M via a carbon atom;

M is selected from the group consisting of Cu, Ag, Au, Ru, Rh, Pd, Os, and Ir;

X is selected from the group consisting of O, S, and Se;

$X_1$, $X_2$, $X_3$, and $X_4$ are independently selected from N or CR;

at least one of $X_1$, $X_2$, $X_3$, and $X_4$ is N;

wherein R is selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof; and two adjacent substituents are optionally joined to form a ring.

2. The metal complex of claim 1, wherein the metal is Ir.

3. The metal complex of claim 1, wherein Cy has a partial structure selected from the group consisting of:

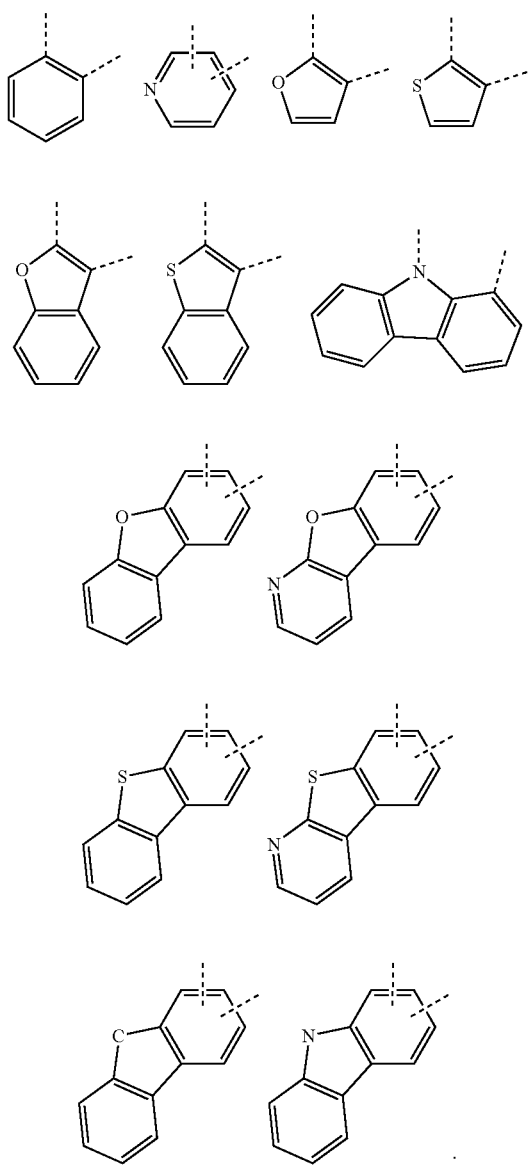

4. The metal complex of claim 1, wherein the complex has the formula of $M(L_a)_m(L_b)_n(L_c)_q$, wherein $L_b$ and $L_c$ are the second and third ligand coordinating to M, $L_b$ and $L_c$ can be the same or different;

$L_a$, $L_b$, and $L_c$ can be optionally joined to form a tetradentate or hexadentate ligand;

wherein m is 1, 2, or 3, n is 0, 1, or 2, q is 0, 1, or 2; m+n+q is the oxidation state of M;

wherein $L_a$ is independently selected from the group consisting of:
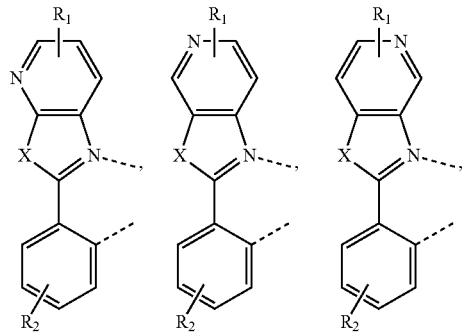
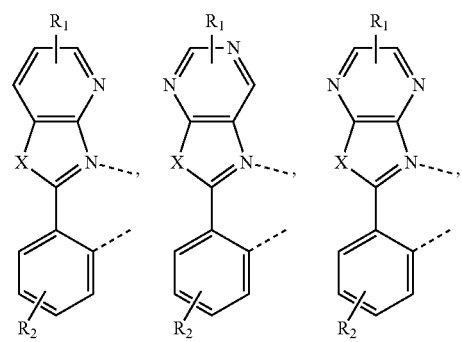
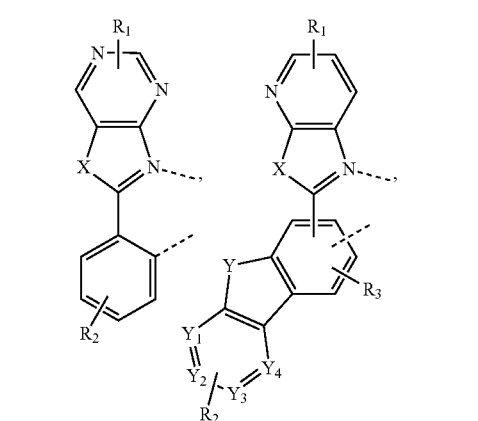
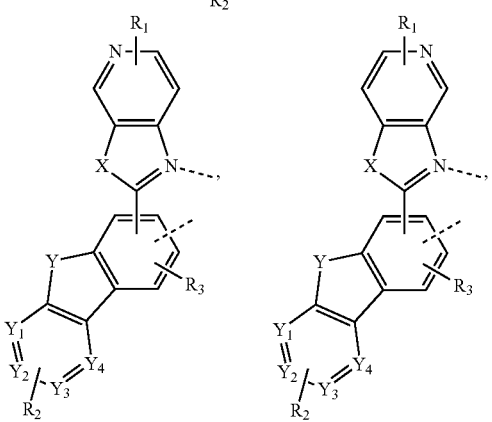
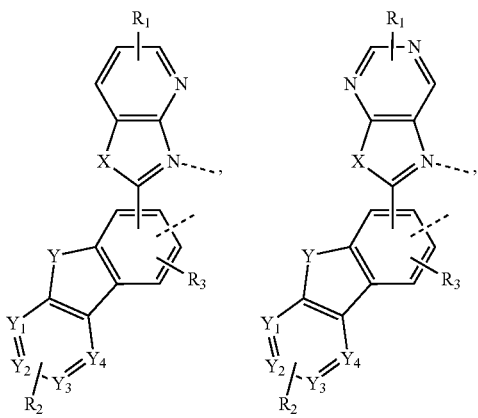
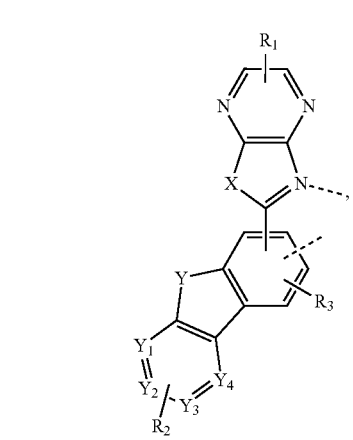
wherein $L_b$ and $L_c$ are independently selected from the group consisting of:
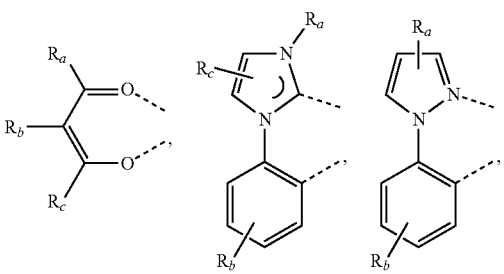
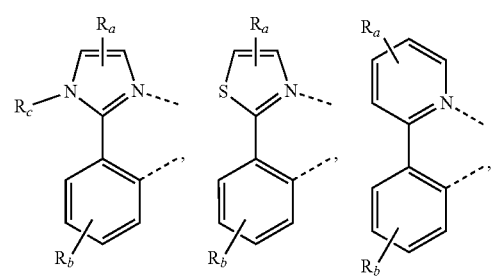

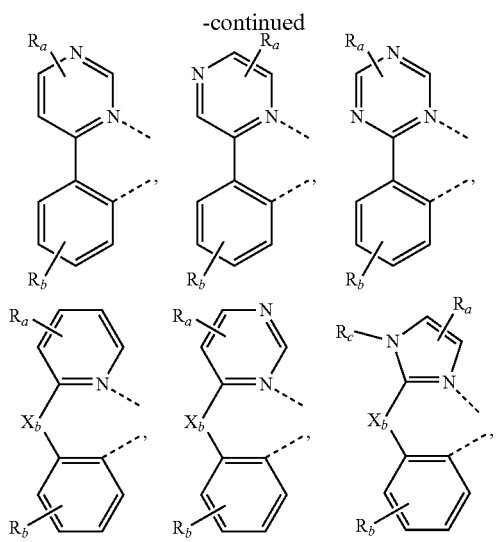

-continued wherein Y is selected from the group consisting of O, S, Se, NR', CR"R'";

$Y_1$, $Y_2$, $Y_3$, and $Y_4$ are independently selected from the group consisting of N and CR"";

$X_b$ is selected from the group consisting of O, S, Se, $NR_{N1}$, and $CR_{C1}R_{C2}$;

$R_1$, $R_2$, $R_3$, $R_a$, $R_b$, and $R_c$ can represent mono, di, tri, or tetra substitution or no substitution;

R', R", R'", R"", $R_1$, $R_2$, $R_3$, $R_a$, $R_b$, $R_c$, $R_{N1}$, $R_{C1}$, and $R_{C2}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof; and two adjacent substituents are optionally joined to form a ring.

5. The metal complex of claim 4, wherein $L_a$ has the structure represented by Formula 2:

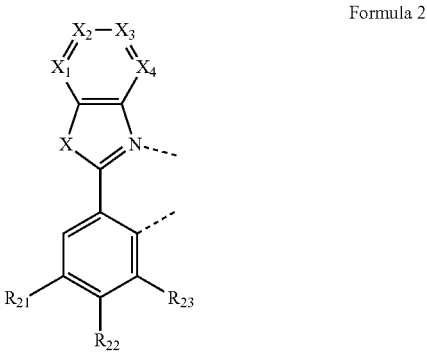

Formula 2 wherein $X_1$, $X_2$, $X_3$, $X_4$, X, $R_{21}$, $R_{22}$, and $R_{23}$ of Formula 2 are each selected from the group or the atom shown in the following table:

| Number | $X_1$ | $X_2$ | $X_3$ | $X_4$ | X | $R_{21}$ | $R_{22}$ | $R_{23}$ |
|---|---|---|---|---|---|---|---|---|
| La1. | N | CH | CH | CH | S | H | H | H |
| La2. | N | CH | CH | CH | S | $CH_3$ | H | H |
| La3. | N | CH | CH | CH | S | H | $CH_3$ | H |
| La4. | N | CH | CH | CH | S | $CH_3$ | H | $CH_3$ |
| La5. | N | CH | CH | CH | S | $CD_3$ | H | H |
| La6. | N | CH | CH | CH | S | H | $CD_3$ | H |
| La7. | N | CH | CH | CH | S | $CH_3$ | H | $CD_3$ |
| La8. | N | $CCH_3$ | CH | CH | S | H | H | H |
| La9. | N | ![isopropyl] | CH | CH | S | H | H | H |
| La10. | N | ![isobutyl] | CH | CH | S | H | H | H |
| La11. | N | ![t-butyl/neopentyl] | CH | CH | S | H | H | H |
| La12. | N | ![cyclopentyl] | CH | CH | S | H | H | H |

-continued
| Number | X₁ | X₂ | X₃ | X₄ | X | R₂₁ | R₂₂ | R₂₃ |
|---|---|---|---|---|---|---|---|---|
| La13. | N | 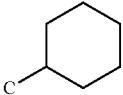 | CH | CH | S | H | H | H |
| La14. | N | 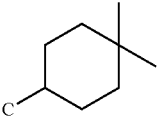 | CH | CH | S | H | H | H |
| La15. | N | 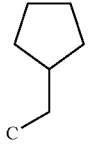 | CH | CH | S | H | H | H |
| La16. | N | 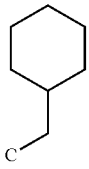 | CH | CH | S | H | H | H |
| La17. | N | CCD₃ | CH | CH | S | H | H | H |
| La18. | N |  | CH | CH | S | H | H | H |
| La19. | N | 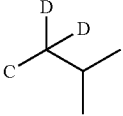 | CH | CH | S | H | H | H |
| La20. | N | 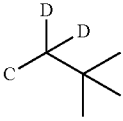 | CH | CH | S | H | H | H |
| La21. | N | 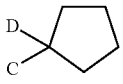 | CH | CH | S | H | H | H |
| La22. | N | 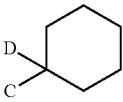 | CH | CH | S | H | H | H |
| La23. | N | 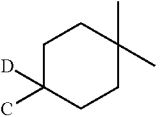 | CH | CH | S | H | H | H |
| La24. | N | 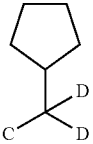 | CH | CH | S | H | H | H |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La25. | N | cyclohexyl-CD$_2$- | CH | CH | S | H | H | H |
| La26. | N | CCH$_3$ | CH | CH | S | CH$_3$ | H | H |
| La27. | N | isopropyl | CH | CH | S | CH$_3$ | H | H |
| La28. | N | isobutyl | CH | CH | S | CH$_3$ | H | H |
| La29. | N | neopentyl | CH | CH | S | CH$_3$ | H | H |
| La30. | N | cyclopentyl | CH | CH | S | CH$_3$ | H | H |
| La31. | N | cyclohexyl | CH | CH | S | CH$_3$ | H | H |
| La32. | N | 4,4-dimethylcyclohexyl | CH | CH | S | CH$_3$ | H | H |
| La33. | N | cyclopentylmethyl | CH | CH | S | CH$_3$ | H | H |
| La34. | N | cyclohexylmethyl | CH | CH | S | CH$_3$ | H | H |
| La35. | N | CCD$_3$ | CH | CH | S | CD$_3$ | H | H |
| La36. | N | isopropyl-d | CH | CH | S | CD$_3$ | H | H |
| La37. | N | isobutyl-d$_2$ | CH | CH | S | CD$_3$ | H | H |
| La38. | N | neopentyl-d$_2$ | CH | CH | S | CD$_3$ | H | H |

-continued
| Number | X₁ | X₂ | X₃ | X₄ | X | R₂₁ | R₂₂ | R₂₃ |
|---|---|---|---|---|---|---|---|---|
| La39. | N | 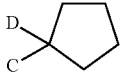 | CH | CH | S | CD₃ | H | H |
| La40. | N | 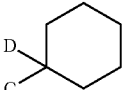 | CH | CH | S | CD₃ | H | H |
| La41. | N | 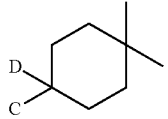 | CH | CH | S | CD₃ | H | H |
| La42. | N | 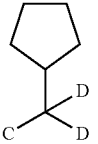 | CH | CH | S | CD₃ | H | H |
| La43. | N | 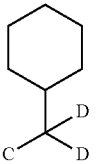 | CH | CH | S | CD₃ | H | H |
| La44. | N | CCH₃ | CH | CH | S | CH₃ | H | CH₃ |
| La45. | N |  | CH | CH | S | CH₃ | H | CH₃ |
| La46. | N | 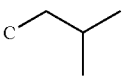 | CH | CH | S | CH₃ | H | CH₃ |
| La47. | N | 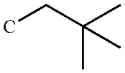 | CH | CH | S | CH₃ | H | CH₃ |
| La48. | N | 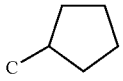 | CH | CH | S | CH₃ | H | CH₃ |
| La49. | N | 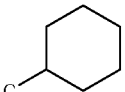 | CH | CH | S | CH₃ | H | CH₃ |
| La50. | N | 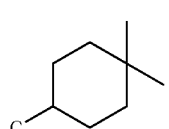 | CH | CH | S | CH₃ | H | CH₃ |
| La51. | N | 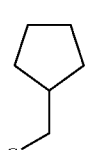 | CH | CH | S | CH₃ | H | CH₃ |

-continued

| Number | X₁ | X₂ | X₃ | X₄ | X | R₂₁ | R₂₂ | R₂₃ |
|---|---|---|---|---|---|---|---|---|
| La52. | N | cyclohexylmethyl-C | CH | CH | S | CH₃ | H | CH₃ |
| La53. | N | CCD₃ | CH | CH | S | CD₃ | H | CD₃ |
| La54. | N | C(CD)(D) | CH | CH | S | CD₃ | H | CD₃ |
| La55. | N | CD₂-CH(CH₃)- | CH | CH | S | CD₃ | H | CD₃ |
| La56. | N | CD₂-C(CH₃)₃ | CH | CH | S | CD₃ | H | CD₃ |
| La57. | N | 1-D-cyclopentyl-C | CH | CH | S | CD₃ | H | CD₃ |
| La58. | N | 1-D-cyclohexyl-C | CH | CH | S | CD₃ | H | CD₃ |
| La59. | N | 4,4-dimethyl-1-D-cyclohexyl-C | CH | CH | S | CD₃ | H | CD₃ |
| La60. | N | cyclopentyl-CD₂-C | CH | CH | S | CD₃ | H | CD₃ |
| La61. | N | cyclohexyl-CD₂-C | CH | CH | S | CD₃ | H | CD₃ |
| La62. | N | CH | CCH₃ | CH | S | H | H | H |
| La63. | N | CH | C-iPr | CH | S | H | H | H |
| La64. | N | CH | C-CH₂CH(CH₃)₂ | CH | S | H | H | H |
| La65. | N | CH | C-CH₂C(CH₃)₃ | CH | S | H | H | H |

-continued
| Number | X₁ | X₂ | X₃ | X₄ | X | R₂₁ | R₂₂ | R₂₃ |
|---|---|---|---|---|---|---|---|---|
| La66. | N | CH | 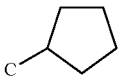 | CH | S | H | H | H |
| La67. | N | CH | 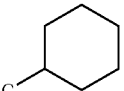 | CH | S | H | H | H |
| La68. | N | CH | 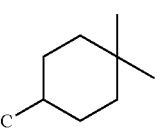 | CH | S | H | H | H |
| La69. | N | CH |  | CH | S | H | H | H |
| La70. | N | CH | 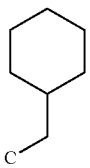 | CH | S | H | H | H |
| La71. | N | CH | CCD₃ | CH | S | H | H | H |
| La72. | N | CH |  | CH | S | H | H | H |
| La73. | N | CH | 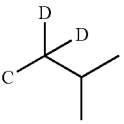 | CH | S | H | H | H |
| La74. | N | CH | 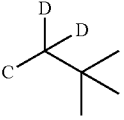 | CH | S | H | H | H |
| La75. | N | CH |  | CH | S | H | H | H |
| La76. | N | CH | 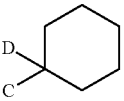 | CH | S | H | H | H |
| La77. | N | CH | 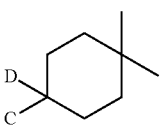 | CH | S | H | H | H |
| La78. | N | CH | 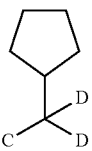 | CH | S | H | H | H |

-continued

| Number | X₁ | X₂ | X₃ | X₄ | X | R₂₁ | R₂₂ | R₂₃ |
|---|---|---|---|---|---|---|---|---|
| La79. | N | CH | C-CHD₂-cyclohexyl | CH | S | H | H | H |
| La80. | N | CH | CCH₃ | CH | S | CH₃ | H | H |
| La81. | N | CH | C-CH(CH₃)₂ | CH | S | CH₃ | H | H |
| La82. | N | CH | C-CH₂-CH(CH₃)₂ | CH | S | CH₃ | H | H |
| La83. | N | CH | C-CH₂-C(CH₃)₃ | CH | S | CH₃ | H | H |
| La84. | N | CH | C-cyclopentyl | CH | S | CH₃ | H | H |
| La85. | N | CH | C-cyclohexyl | CH | S | CH₃ | H | H |
| La86. | N | CH | C-(4,4-dimethylcyclohexyl) | CH | S | CH₃ | H | H |
| La87. | N | CH | C-CH₂-cyclopentyl | CH | S | CH₃ | H | H |
| La88. | N | CH | C-CH₂-cyclohexyl | CH | S | CH₃ | H | H |
| La89. | N | CH | CCD₃ | CH | S | CD₃ | H | H |
| La90. | N | CH | C-C(CH₃)₂D | CH | S | CD₃ | H | H |
| La91. | N | CH | C-CD₂-CH(CH₃)₂ | CH | S | CD₃ | H | H |
| La92. | N | CH | C-CD₂-C(CH₃)₃ | CH | S | CD₃ | H | H |

-continued
| Number | X₁ | X₂ | X₃ | X₄ | X | R₂₁ | R₂₂ | R₂₃ |
|---|---|---|---|---|---|---|---|---|
| La93. | N | CH |  | CH | S | CD₃ | H | H |
| La94. | N | CH | 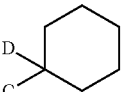 | CH | S | CD₃ | H | H |
| La95. | N | CH | 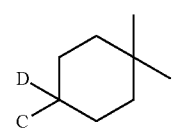 | CH | S | CD₃ | H | H |
| La96. | N | CH | 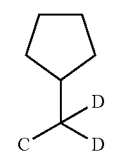 | CH | S | CD₃ | H | H |
| La97. | N | CH | 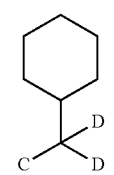 | CH | S | CD₃ | H | H |
| La98. | N | CH | CCH₃ | CH | S | CH₃ | H | CH₃ |
| La99. | N | CH | 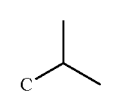 | CH | S | CH₃ | H | CH₃ |
| La100. | N | CH | 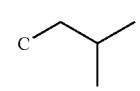 | CH | S | CH₃ | H | CH₃ |
| La101. | N | CH | 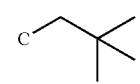 | CH | S | CH₃ | H | CH₃ |
| La102. | N | CH | 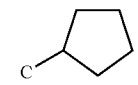 | CH | S | CH₃ | H | CH₃ |
| La103. | N | CH | 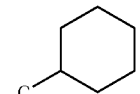 | CH | S | CH₃ | H | CH₃ |
| La104. | N | CH | 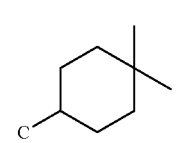 | CH | S | CH₃ | H | CH₃ |
| La105. | N | CH | 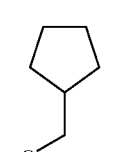 | CH | S | CH₃ | H | CH₃ |

-continued

| Number | X₁ | X₂ | X₃ | X₄ | X | R₂₁ | R₂₂ | R₂₃ |
|---|---|---|---|---|---|---|---|---|
| La106. | N | CH | 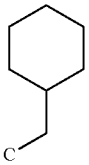 | CH | S | CH₃ | H | CH₃ |
| La107. | N | CH | CCD₃ | CH | S | CD₃ | H | CD₃ |
| La108. | N | CH |  | CH | S | CD₃ | H | CD₃ |
| La109. | N | CH | 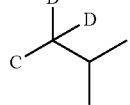 | CH | S | CD₃ | H | CD₃ |
| La110. | N | CH | 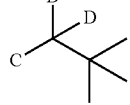 | CH | S | CD₃ | H | CD₃ |
| La111. | N | CH |  | CH | S | CD₃ | H | CD₃ |
| La112. | N | CH | 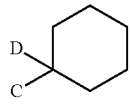 | CH | S | CD₃ | H | CD₃ |
| La113. | N | CH | 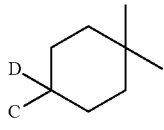 | CH | S | CD₃ | H | CD₃ |
| La114. | N | CH | 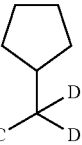 | CH | S | CD₃ | H | CD₃ |
| La115. | N | CH | 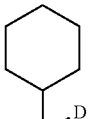 | CH | S | CD₃ | H | CD₃ |
| La116. | N | CH | CH | CH | Se | H | H | H |
| La117. | N | CH | CH | CH | Se | CH₃ | H | H |
| La118. | N | CH | CH | CH | Se | H | CH₃ | H |
| La119. | N | CH | CH | CH | Se | CH₃ | H | CH₃ |
| La120. | N | CH | CH | CH | Se | CD₃ | H | H |
| La121. | N | CH | CH | CH | Se | H | CD₃ | H |
| La122. | N | CH | CH | CH | Se | CH₃ | H | CD₃ |
| La123. | N | CCH₃ | CH | CH | Se | H | H | H |
| La124. | N |  | CH | CH | Se | H | H | H |

-continued
| Number | X₁ | X₂ | X₃ | X₄ | X | R₂₁ | R₂₂ | R₂₃ |
|---|---|---|---|---|---|---|---|---|
| La125. | N | 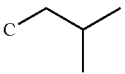 | CH | CH | Se | H | H | H |
| La126. | N | 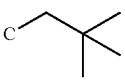 | CH | CH | Se | H | H | H |
| La127. | N | 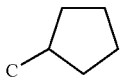 | CH | CH | Se | H | H | H |
| La128. | N | 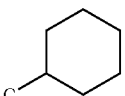 | CH | CH | Se | H | H | H |
| La129. | N | 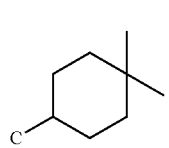 | CH | CH | Se | H | H | H |
| La130. | N |  | CH | CH | Se | H | H | H |
| La131. | N | 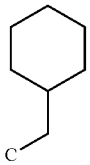 | CH | CH | Se | H | H | H |
| La132. | N | CCD₃ | CH | CH | Se | H | H | H |
| La133. | N |  | CH | CH | Se | H | H | H |
| La134. | N | 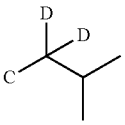 | CH | CH | Se | H | H | H |
| La135. | N | 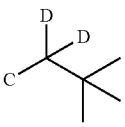 | CH | CH | Se | H | H | H |
| La136. | N | 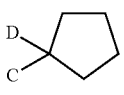 | CH | CH | Se | H | H | H |
| La137. | N | 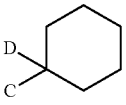 | CH | CH | Se | H | H | H |

-continued
| Number | X₁ | X₂ | X₃ | X₄ | X | R₂₁ | R₂₂ | R₂₃ |
|---|---|---|---|---|---|---|---|---|
| La138. | N | 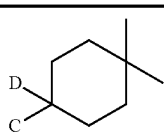 | CH | CH | Se | H | H | H |
| La139. | N | 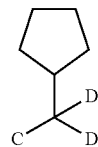 | CH | CH | Se | H | H | H |
| La140. | N | 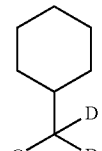 | CH | CH | Se | H | H | H |
| La141. | N | CCH₃ | CH | CH | Se | CH₃ | H | H |
| La142. | N |  | CH | CH | Se | CH₃ | H | H |
| La143. | N | 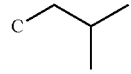 | CH | CH | Se | CH₃ | H | H |
| La144. | N | 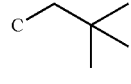 | CH | CH | Se | CH₃ | H | H |
| La145. | N | 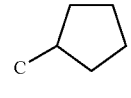 | CH | CH | Se | CH₃ | H | H |
| La146. | N | 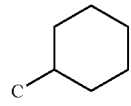 | CH | CH | Se | CH₃ | H | H |
| La147. | N | 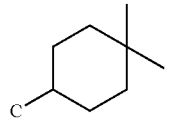 | CH | CH | Se | CH₃ | H | H |
| La148. | N | 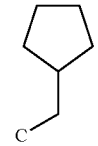 | CH | CH | Se | CH₃ | H | H |
| La149. | N | 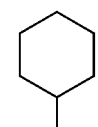 | CH | CH | Se | CH₃ | H | H |
| La150. | N | CCD₃ | CH | CH | Se | CD₃ | H | H |
| La151. | N |  | CH | CH | Se | CD₃ | H | H |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La152. | N | (CH₂D-CD(CH₃)- attached via C) | CH | CH | Se | $CD_3$ | H | H |
| La153. | N | (CH₂D-C(CH₃)₂- with one D) | CH | CH | Se | $CD_3$ | H | H |
| La154. | N | (1-deutero-cyclopentyl via C) | CH | CH | Se | $CD_3$ | H | H |
| La155. | N | (1-deutero-cyclohexyl via C) | CH | CH | Se | $CD_3$ | H | H |
| La156. | N | (4,4-dimethyl-1-deutero-cyclohexyl) | CH | CH | Se | $CD_3$ | H | H |
| La157. | N | (cyclopentyl-CD₂-) | CH | CH | Se | $CD_3$ | H | H |
| La158. | N | (cyclohexyl-CD₂-) | CH | CH | Se | $CD_3$ | H | H |
| La159. | N | $CCH_3$ | CH | CH | Se | $CH_3$ | H | $CH_3$ |
| La160. | N | (isopropyl via C) | CH | CH | Se | $CH_3$ | H | $CH_3$ |
| La161. | N | (isobutyl via C) | CH | CH | Se | $CH_3$ | H | $CH_3$ |
| La162. | N | (neopentyl via C) | CH | CH | Se | $CH_3$ | H | $CH_3$ |
| La163. | N | (cyclopentyl via C) | CH | CH | Se | $CH_3$ | H | $CH_3$ |
| La164. | N | (cyclohexyl via C) | CH | CH | Se | $CH_3$ | H | $CH_3$ |

-continued

| Number | X₁ | X₂ | X₃ | X₄ | X | R₂₁ | R₂₂ | R₂₃ |
|---|---|---|---|---|---|---|---|---|
| La165. | N | (4,4-dimethylcyclohexyl-C) | CH | CH | Se | CH₃ | H | CH₃ |
| La166. | N | (cyclopentylmethyl-C) | CH | CH | Se | CH₃ | H | CH₃ |
| La167. | N | (cyclohexylmethyl-C) | CH | CH | Se | CH₃ | H | CH₃ |
| La168. | N | CCD₃ | CH | CH | Se | CD₃ | H | CD₃ |
| La169. | N | (C(CD₃)-) | CH | CH | Se | CD₃ | H | CD₃ |
| La170. | N | (CD₂-iPr with D) | CH | CH | Se | CD₃ | H | CD₃ |
| La171. | N | (CD₂-tBu) | CH | CH | Se | CD₃ | H | CD₃ |
| La172. | N | (1-D-cyclopentyl-C) | CH | CH | Se | CD₃ | H | CD₃ |
| La173. | N | (1-D-cyclohexyl-C) | CH | CH | Se | CD₃ | H | CD₃ |
| La174. | N | (D-dimethylcyclohexyl-C) | CH | CH | Se | CD₃ | H | CD₃ |
| La175. | N | (cyclopentyl-CD₂-C) | CH | CH | Se | CD₃ | H | CD₃ |
| La176. | N | (cyclohexyl-CD₂-C) | CH | CH | Se | CD₃ | H | CD₃ |

-continued
| Number | X₁ | X₂ | X₃ | X₄ | X | R₂₁ | R₂₂ | R₂₃ |
|---|---|---|---|---|---|---|---|---|
| La177. | N | CH | CCH₃ | CH | Se | H | H | H |
| La178. | N | CH |  | CH | Se | H | H | H |
| La179. | N | CH | 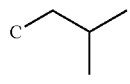 | CH | Se | H | H | H |
| La180. | N | CH | 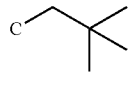 | CH | Se | H | H | H |
| La181. | N | CH | 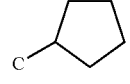 | CH | Se | H | H | H |
| La182. | N | CH | 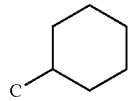 | CH | Se | H | H | H |
| La183. | N | CH | 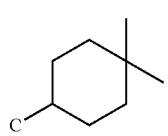 | CH | Se | H | H | H |
| La184. | N | CH |  | CH | Se | H | H | H |
| La185. | N | CH | 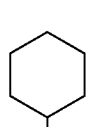 | CH | Se | H | H | H |
| La186. | N | CH | CCD₃ | CH | Se | H | H | H |
| La187. | N | CH |  | CH | Se | H | H | H |
| La188. | N | CH | 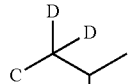 | CH | Se | H | H | H |
| La189. | N | CH | 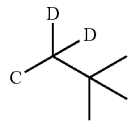 | CH | Se | H | H | H |
| La190. | N | CH | 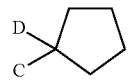 | CH | Se | H | H | H |

-continued
| Number | X₁ | X₂ | X₃ | X₄ | X | R₂₁ | R₂₂ | R₂₃ |
|---|---|---|---|---|---|---|---|---|
| La191. | N | CH | 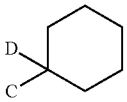 | CH | Se | H | H | H |
| La192. | N | CH | 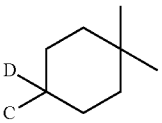 | CH | Se | H | H | H |
| La193. | N | CH | 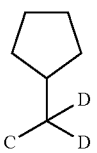 | CH | Se | H | H | H |
| La194. | N | CH | 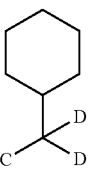 | CH | Se | H | H | H |
| La195. | N | CH | CCH₃ | CH | Se | CH₃ | H | H |
| La196. | N | CH |  | CH | Se | CH₃ | H | H |
| La197. | N | CH |  | CH | Se | CH₃ | H | H |
| La198. | N | CH | 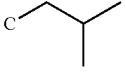 | CH | Se | CH₃ | H | H |
| La199. | N | CH | 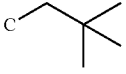 | CH | Se | CH₃ | H | H |
| La200. | N | CH | 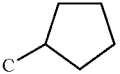 | CH | Se | CH₃ | H | H |
| La201. | N | CH | 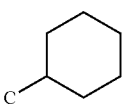 | CH | Se | CH₃ | H | H |
| La202. | N | CH | 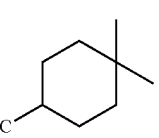 | CH | Se | CH₃ | H | H |
| La203. | N | CH | 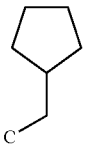 | CH | Se | CH₃ | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La204. | N | CH | CCD$_3$ | CH | Se | CD$_3$ | H | H |
| La205. | N | CH |  | CH | Se | CD$_3$ | H | H |
| La206. | N | CH | 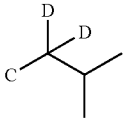 | CH | Se | CD$_3$ | H | H |
| La207. | N | CH | 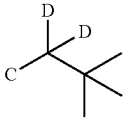 | CH | Se | CD$_3$ | H | H |
| La208. | N | CH | 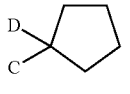 | CH | Se | CD$_3$ | H | H |
| La209. | N | CH | 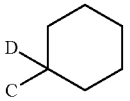 | CH | Se | CD$_3$ | H | H |
| La210. | N | CH | 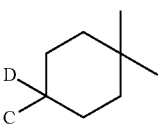 | CH | Se | CD$_3$ | H | H |
| La211. | N | CH | 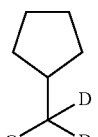 | CH | Se | CD$_3$ | H | H |
| La212. | N | CH | 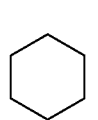 | CH | Se | CD$_3$ | H | H |
| La213. | N | CH | CCH$_3$ | CH | Se | CH$_3$ | H | CH$_3$ |
| La214. | N | CH |  | CH | Se | CH$_3$ | H | CH$_3$ |
| La215. | N | CH | 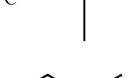 | CH | Se | CH$_3$ | H | CH$_3$ |
| La216. | N | CH |  | CH | Se | CH$_3$ | H | CH$_3$ |
| La217. | N | CH | 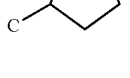 | CH | Se | CH$_3$ | H | CH$_3$ |

-continued
| Number | X₁ | X₂ | X₃ | X₄ | X | R₂₁ | R₂₂ | R₂₃ |
|---|---|---|---|---|---|---|---|---|
| La218. | N | CH | 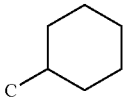 | CH | Se | CH₃ | H | CH₃ |
| La219. | N | CH | 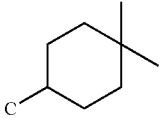 | CH | Se | CH₃ | H | CH₃ |
| La220. | N | CH | 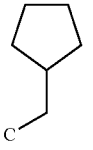 | CH | Se | CH₃ | H | CH₃ |
| La221. | N | CH | 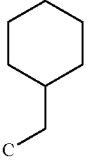 | CH | Se | CH₃ | H | CH₃ |
| La222. | N | CH | CCD₃ | CH | Se | CD₃ | H | CD₃ |
| La223. | N | CH |  | CH | Se | CD₃ | H | CD₃ |
| La224. | N | CH | 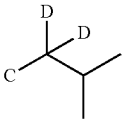 | CH | Se | CD₃ | H | CD₃ |
| La225. | N | CH | 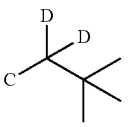 | CH | Se | CD₃ | H | CD₃ |
| La226. | N | CH | 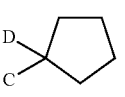 | CH | Se | CD₃ | H | CD₃ |
| La227. | N | CH | 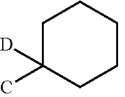 | CH | Se | CD₃ | H | CD₃ |
| La228. | N | CH | 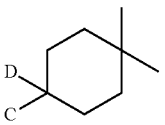 | CH | Se | CD₃ | H | CD₃ |
| La229. | N | CH | 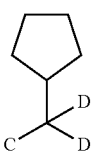 | CH | Se | CD₃ | H | CD₃ |

-continued
| Number | X₁ | X₂ | X₃ | X₄ | X | R₂₁ | R₂₂ | R₂₃ |
|---|---|---|---|---|---|---|---|---|
| La230. | N | CH | 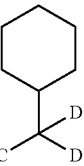 | CH | Se | CD₃ | H | CD₃ |
| La231. | CH | N | CH | CH | S | H | H | H |
| La232. | CH | N | CH | CH | S | CH₃ | H | H |
| La233. | CH | N | CH | CH | S | H | CH₃ | H |
| La234. | CH | N | CH | CH | S | CH₃ | H | CH₃ |
| La235. | CH | N | CH | CH | S | CD₃ | H | H |
| La236. | CH | N | CH | CH | S | H | CD₃ | H |
| La237. | CH | N | CH | CH | S | CH₃ | H | CD₃ |
| La238. | CCH₃ | N | CH | CH | S | H | H | H |
| La239. |  | N | CH | CH | S | H | H | H |
| La240. | 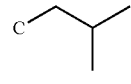 | N | CH | CH | S | H | H | H |
| La241. | 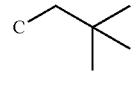 | N | CH | CH | S | H | H | H |
| La242. | 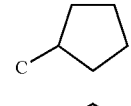 | N | CH | CH | S | H | H | H |
| La243. | 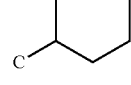 | N | CH | CH | S | H | H | H |
| La244. | 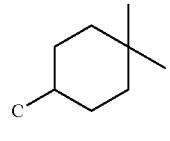 | N | CH | CH | S | H | H | H |
| La245. | 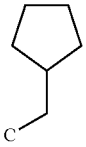 | N | CH | CH | S | H | H | H |
| La246. | 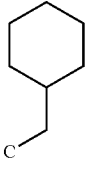 | N | CH | CH | S | H | H | H |
| La247. | CCD₃ | N | CH | CH | S | H | H | H |
| La248. |  | N | CH | CH | S | H | H | H |
| La249. | 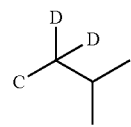 | N | CH | CH | S | H | H | H |

-continued

| Number | X₁ | X₂ | X₃ | X₄ | X | R₂₁ | R₂₂ | R₂₃ |
|---|---|---|---|---|---|---|---|---|
| La250. | C(D)(D)C(CH₃)₃ | N | CH | CH | S | H | H | H |
| La251. | 1-D-cyclopentyl-C | N | CH | CH | S | H | H | H |
| La252. | 1-D-cyclohexyl-C | N | CH | CH | S | H | H | H |
| La253. | 4-methyl-1-D-cyclohexyl-C | N | CH | CH | S | H | H | H |
| La254. | cyclopentyl-CD₂-C | N | CH | CH | S | H | H | H |
| La255. | cyclohexyl-CD₂-C | N | CH | CH | S | H | H | H |
| La256. | CCH₃ | N | CH | CH | S | CH₃ | H | H |
| La257. | CH(CH₃)₂-C | N | CH | CH | S | CH₃ | H | H |
| La258. | isobutyl-C | N | CH | CH | S | CH₃ | H | H |
| La259. | neopentyl-C | N | CH | CH | S | CH₃ | H | H |
| La260. | cyclopentyl-C | N | CH | CH | S | CH₃ | H | H |
| La261. | cyclohexyl-C | N | CH | CH | S | CH₃ | H | H |
| La262. | 4-methylcyclohexyl-C | N | CH | CH | S | CH₃ | H | H |

-continued
| Number | X₁ | X₂ | X₃ | X₄ | X | R₂₁ | R₂₂ | R₂₃ |
|---|---|---|---|---|---|---|---|---|
| La263. | 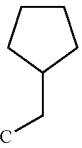 | N | CH | CH | S | CH₃ | H | H |
| La264. | 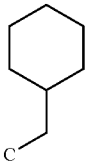 | N | CH | CH | S | CH₃ | H | H |
| La265. | CCD₃ | N | CH | CH | S | CD₃ | H | H |
| La266. |  | N | CH | CH | S | CD₃ | H | H |
| La267. | 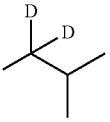 | N | CH | CH | S | CD₃ | H | H |
| La268. | 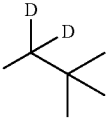 | N | CH | CH | S | CD₃ | H | H |
| La269. |  | N | CH | CH | S | CD₃ | H | H |
| La270. | 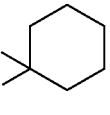 | N | CH | CH | S | CD₃ | H | H |
| La271. | 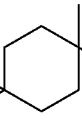 | N | CH | CH | S | CD₃ | H | H |
| La272. | 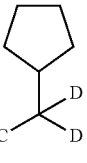 | N | CH | CH | S | CD₃ | H | H |
| La273. | 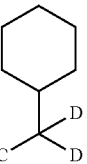 | N | CH | CH | S | CD₃ | H | H |
| La274. | CCH₃ | N | CH | CH | S | CH₃ | H | CH₃ |
| La275. |  | N | CH | CH | S | CH₃ | H | CH₃ |

-continued
| Number | X₁ | X₂ | X₃ | X₄ | X | R₂₁ | R₂₂ | R₂₃ |
|---|---|---|---|---|---|---|---|---|
| La276. | 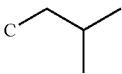 | N | CH | CH | S | CH₃ | H | CH₃ |
| La277. | 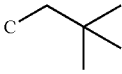 | N | CH | CH | S | CH₃ | H | CH₃ |
| La278. | 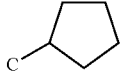 | N | CH | CH | S | CH₃ | H | CH₃ |
| La279. | 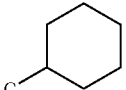 | N | CH | CH | S | CH₃ | H | CH₃ |
| La280. | 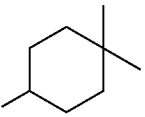 | N | CH | CH | S | CH₃ | H | CH₃ |
| La281. | 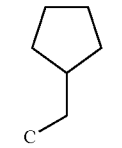 | N | CH | CH | S | CH₃ | H | CH₃ |
| La282. | 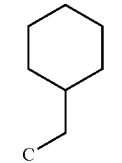 | N | CH | CH | S | CH₃ | H | CH₃ |
| La283. | CCD₃ | N | CH | CH | S | CD₃ | H | CD₃ |
| La284. | 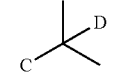 | N | CH | CH | S | CD₃ | H | CD₃ |
| La285. | 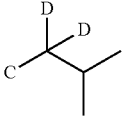 | N | CH | CH | S | CD₃ | H | CD₃ |
| La286. | 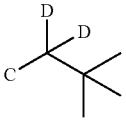 | N | CH | CH | S | CD₃ | H | CD₃ |
| La287. |  | N | CH | CH | S | CD₃ | H | CD₃ |
| La288. | 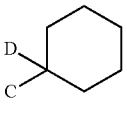 | N | CH | CH | S | CD₃ | H | CD₃ |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La289. | 4,4-dimethylcyclohexyl-CD< (CH) | N | CH | CH | S | $CD_3$ | H | $CD_3$ |
| La290. | cyclopentyl-CD$_2$- (CH) | N | CH | CH | S | $CD_3$ | H | $CD_3$ |
| La291. | cyclohexyl-CD$_2$- (CH) | N | CH | CH | S | $CD_3$ | H | $CD_3$ |
| La292. | CH | N | $CCH_3$ | CH | S | H | H | H |
| La293. | CH | N | C-iPr | CH | S | H | H | H |
| La294. | CH | N | C-CH$_2$CH(CH$_3$)$_2$ | CH | S | H | H | H |
| La295. | CH | N | C-CH$_2$C(CH$_3$)$_3$ | CH | S | H | H | H |
| La296. | CH | N | C-cyclopentyl | CH | S | H | H | H |
| La297. | CH | N | C-cyclohexyl | CH | S | H | H | H |
| La298. | CH | N | C-(4,4-dimethylcyclohexyl) | CH | S | H | H | H |
| La299. | CH | N | C-CH$_2$-cyclopentyl | CH | S | H | H | H |
| La300. | CH | N | C-CH$_2$-cyclohexyl | CH | S | H | H | H |
| La301. | CH | N | $CCD_3$ | CH | S | H | H | H |
| La302. | CH | N | C-C(CH$_3$)$_2$D | CH | S | H | H | H |

-continued

| Number | X₁ | X₂ | X₃ | X₄ | X | R₂₁ | R₂₂ | R₂₃ |
|---|---|---|---|---|---|---|---|---|
| La303. | CH | N | C-CD₂-CH(CH₃)₂ (CD₂ isopropyl) | CH | S | H | H | H |
| La304. | CH | N | C-CD₂-C(CH₃)₃ (CD₂ tert-butyl) | CH | S | H | H | H |
| La305. | CH | N | C-CD- cyclopentyl | CH | S | H | H | H |
| La306. | CH | N | C-CD- cyclohexyl | CH | S | H | H | H |
| La307. | CH | N | C-CD- 4,4-dimethylcyclohexyl | CH | S | H | H | H |
| La308. | CH | N | C-CD₂- cyclopentyl | CH | S | H | H | H |
| La309. | CH | N | C-CD₂- cyclohexyl | CH | S | H | H | H |
| La310. | CH | N | CCH₃ | CH | S | CH₃ | H | H |
| La311. | CH | N | C-CH(CH₃)₂ | CH | S | CH₃ | H | H |
| La312. | CH | N | C-CH₂-CH(CH₃)₂ | CH | S | CH₃ | H | H |
| La313. | CH | N | C-CH₂-C(CH₃)₃ | CH | S | CH₃ | H | H |
| La314. | CH | N | C-cyclopentyl | CH | S | CH₃ | H | H |
| La315. | CH | N | C-cyclohexyl | CH | S | CH₃ | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La316. | CH | N | 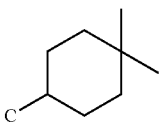 | CH | S | $CH_3$ | H | H |
| La317. | CH | N | 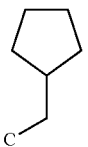 | CH | S | $CH_3$ | H | H |
| La318. | CH | N | 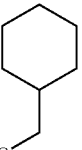 | CH | S | $CH_3$ | H | H |
| La319. | CH | N | $CCD_3$ | CH | S | $CD_3$ | H | H |
| La320. | CH | N |  | CH | S | $CD_3$ | H | H |
| La321. | CH | N | 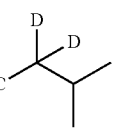 | CH | S | $CD_3$ | H | H |
| La322. | CH | N | 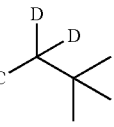 | CH | S | $CD_3$ | H | H |
| La323. | CH | N | 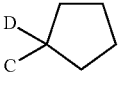 | CH | S | $CD_3$ | H | H |
| La324. | CH | N | 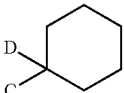 | CH | S | $CD_3$ | H | H |
| La325. | CH | N | 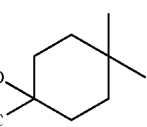 | CH | S | $CD_3$ | H | H |
| La326. | CH | N | 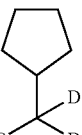 | CH | S | $CD_3$ | H | H |
| La327. | CH | N | 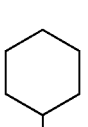 | CH | S | $CD_3$ | H | H |
| La328. | CH | N | $CCH_3$ | CH | S | $CH_3$ | H | $CH_3$ |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La329. | CH | N |  | CH | S | $CH_3$ | H | $CH_3$ |
| La330. | CH | N | 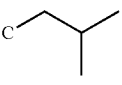 | CH | S | $CH_3$ | H | $CH_3$ |
| La331. | CH | N | 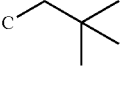 | CH | S | $CH_3$ | H | $CH_3$ |
| La332. | CH | N | 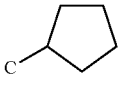 | CH | S | $CH_3$ | H | $CH_3$ |
| La333. | CH | N | 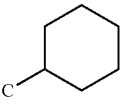 | CH | S | $CH_3$ | H | $CH_3$ |
| La334. | CH | N | 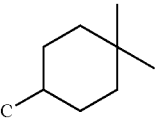 | CH | S | $CH_3$ | H | $CH_3$ |
| La335. | CH | N | 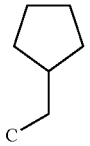 | CH | S | $CH_3$ | H | $CH_3$ |
| La336. | CH | N | 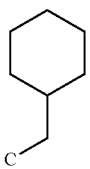 | CH | S | $CH_3$ | H | $CH_3$ |
| La337. | CH | N | $CCD_3$ | CH | S | $CD_3$ | H | $CD_3$ |
| La338. | CH | N |  | CH | S | $CD_3$ | H | $CD_3$ |
| La339. | CH | N | 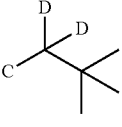 | CH | S | $CD_3$ | H | $CD_3$ |
| La340. | CH | N | 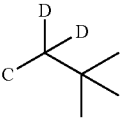 | CH | S | $CD_3$ | H | $CD_3$ |
| La341. | CH | N | 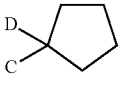 | CH | S | $CD_3$ | H | $CD_3$ |
| La342. | CH | N | 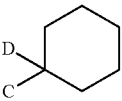 | CH | S | $CD_3$ | H | $CD_3$ |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La343. | CH | N | 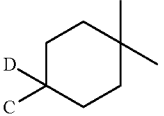 | CH | S | $CD_3$ | H | $CD_3$ |
| La344. | CH | N | 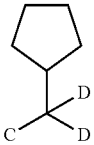 | CH | S | $CD_3$ | H | $CD_3$ |
| La345. | CH | N | 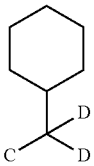 | CH | S | $CD_3$ | H | $CD_3$ |
| La346. | CH | N | CH | CH | Se | H | H | H |
| La347. | CH | N | CH | CH | Se | $CH_3$ | H | H |
| La348. | CH | N | CH | CH | Se | H | $CH_3$ | H |
| La349. | CH | N | CH | CH | Se | $CH_3$ | H | $CH_3$ |
| La350. | CH | N | CH | CH | Se | $CD_3$ | H | H |
| La351. | CH | N | CH | CH | Se | H | $CD_3$ | H |
| La352. | CH | N | CH | CH | Se | $CH_3$ | H | $CD_3$ |
| La353. | $CCH_3$ | N | CH | CH | Se | H | H | H |
| La354. |  | N | CH | CH | Se | H | H | H |
| La355. | 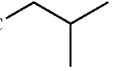 | N | CH | CH | Se | H | H | H |
| La356. | 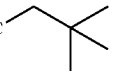 | N | CH | CH | Se | H | H | H |
| La357. | 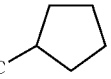 | N | CH | CH | Se | H | H | H |
| La358. | 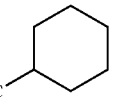 | N | CH | CH | Se | H | H | H |
| La359. | 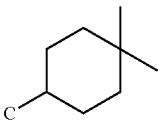 | N | CH | CH | Se | H | H | H |
| La360. | 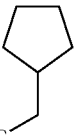 | N | CH | CH | Se | H | H | H |

-continued
| Number | X₁ | X₂ | X₃ | X₄ | X | R₂₁ | R₂₂ | R₂₃ |
|---|---|---|---|---|---|---|---|---|
| La361. | 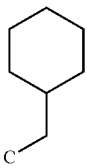 | N | CH | CH | Se | H | H | H |
| La362. | CCD₃ | N | CH | CH | Se | H | H | H |
| La363. |  | N | CH | CH | Se | H | H | H |
| La364. | 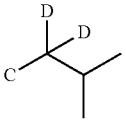 | N | CH | CH | Se | H | H | H |
| La365. | 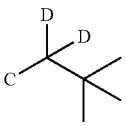 | N | CH | CH | Se | H | H | H |
| La366. | 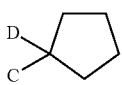 | N | CH | CH | Se | H | H | H |
| La367. | 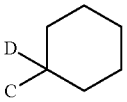 | N | CH | CH | Se | H | H | H |
| La368. | 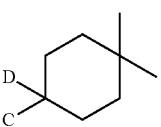 | N | CH | CH | Se | H | H | H |
| La369. | 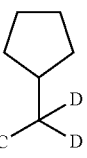 | N | CH | CH | Se | H | H | H |
| La370. | 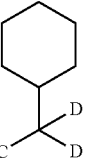 | N | CH | CH | Se | H | H | H |
| La371. | CCH₃ | N | CH | CH | Se | CH₃ | H | H |
| La372. |  | N | CH | CH | Se | CH₃ | H | H |
| La373. | 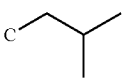 | N | CH | CH | Se | CH₃ | H | H |
| La374. | 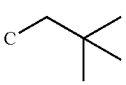 | N | CH | CH | Se | CH₃ | H | H |

| Number | X₁ | X₂ | X₃ | X₄ | X | R₂₁ | R₂₂ | R₂₃ |
|---|---|---|---|---|---|---|---|---|
| La375. | 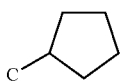 | N | CH | CH | Se | CH₃ | H | H |
| La376. | 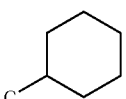 | N | CH | CH | Se | CH₃ | H | H |
| La377. | 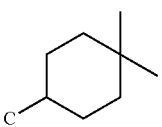 | N | CH | CH | Se | CH₃ | H | H |
| La378. | 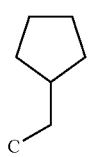 | N | CH | CH | Se | CH₃ | H | H |
| La379. | 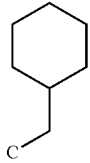 | N | CH | CH | Se | CH₃ | H | H |
| La380. | CCD₃ | N | CH | CH | Se | CD₃ | H | H |
| La381. |  | N | CH | CH | Se | CD₃ | H | H |
| La382. | 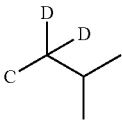 | N | CH | CH | Se | CD₃ | H | H |
| La383. | 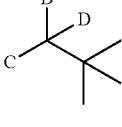 | N | CH | CH | Se | CD₃ | H | H |
| La384. | 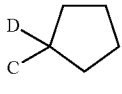 | N | CH | CH | Se | CD₃ | H | H |
| La385. | 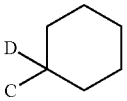 | N | CH | CH | Se | CD₃ | H | H |
| La386. | 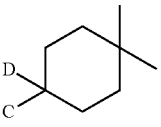 | N | CH | CH | Se | CD₃ | H | H |

-continued

| Number | X₁ | X₂ | X₃ | X₄ | X | R₂₁ | R₂₂ | R₂₃ |
|---|---|---|---|---|---|---|---|---|
| La387. | cyclopentyl-CD₂- | N | CH | CH | Se | CD₃ | H | H |
| La388. | cyclohexyl-CD₂- | N | CH | CH | Se | CD₃ | H | H |
| La389. | CCH₃ | N | CH | CH | Se | CH₃ | H | CH₃ |
| La390. | CH(CH₃)₂ (isopropyl) | N | CH | CH | Se | CH₃ | H | CH₃ |
| La391. | CH₂CH(CH₃)₂ (isobutyl) | N | CH | CH | Se | CH₃ | H | CH₃ |
| La392. | CH₂C(CH₃)₃ (neopentyl) | N | CH | CH | Se | CH₃ | H | CH₃ |
| La393. | cyclopentyl | N | CH | CH | Se | CH₃ | H | CH₃ |
| La394. | cyclohexyl | N | CH | CH | Se | CH₃ | H | CH₃ |
| La395. | 4-(1-methyl)cyclohexyl | N | CH | CH | Se | CH₃ | H | CH₃ |
| La396. | cyclopentyl-CH₂- | N | CH | CH | Se | CH₃ | H | CH₃ |
| La397. | cyclohexyl-CH₂- | N | CH | CH | Se | CH₃ | H | CH₃ |
| La398. | CCD₃ | N | CH | CH | Se | CD₃ | H | CD₃ |
| La399. | CD(CH₃)₂ | N | CH | CH | Se | CD₃ | H | CD₃ |
| La400. | CD₂CH(CH₃)₂ | N | CH | CH | Se | CD₃ | H | CD₃ |

-continued

| Number | X₁ | X₂ | X₃ | X₄ | X | R₂₁ | R₂₂ | R₂₃ |
|---|---|---|---|---|---|---|---|---|
| La401. | (CD₂-C(CH₃)₃) | N | CH | CH | Se | CD₃ | H | CD₃ |
| La402. | (1-D-cyclopentyl at C) | N | CH | CH | Se | CD₃ | H | CD₃ |
| La403. | (1-D-cyclohexyl at C) | N | CH | CH | Se | CD₃ | H | CD₃ |
| La404. | (4-methyl-1-D-cyclohexyl) | N | CH | CH | Se | CD₃ | H | CD₃ |
| La405. | (cyclopentyl-CD₂-) | N | CH | CH | Se | CD₃ | H | CD₃ |
| La406. | (cyclohexyl-CD₂-) | N | CH | CH | Se | CD₃ | H | CD₃ |
| La407. | CH | N | CCH₃ | CH | Se | H | H | H |
| La408. | CH | N | isopropyl | CH | Se | H | H | H |
| La409. | CH | N | isobutyl | CH | Se | H | H | H |
| La410. | CH | N | neopentyl | CH | Se | H | H | H |
| La411. | CH | N | cyclopentyl | CH | Se | H | H | H |
| La412. | CH | N | cyclohexyl | CH | Se | H | H | H |
| La413. | CH | N | (4,4-dimethylcyclohexyl) | CH | Se | H | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La414. | CH | N | 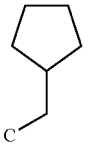 | CH | Se | H | H | H |
| La415. | CH | N | 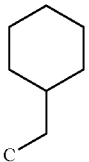 | CH | Se | H | H | H |
| La416. | CH | N | $CCD_3$ | CH | Se | H | H | H |
| La417. | CH | N |  | CH | Se | H | H | H |
| La418. | CH | N | 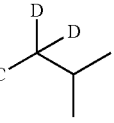 | CH | Se | H | H | H |
| La419. | CH | N | 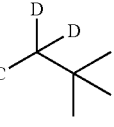 | CH | Se | H | H | H |
| La420. | CH | N | 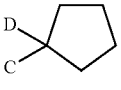 | CH | Se | H | H | H |
| La421. | CH | N | 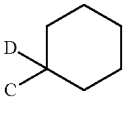 | CH | Se | H | H | H |
| La422. | CH | N | 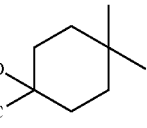 | CH | Se | H | H | H |
| La423. | CH | N | 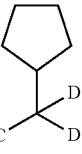 | CH | Se | H | H | H |
| La424. | CH | N | 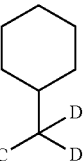 | CH | Se | H | H | H |
| La425. | CH | N | $CCH_3$ | CH | Se | $CH_3$ | H | H |
| La426. | CH | N |  | CH | Se | $CH_3$ | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La427. | CH | N |  | CH | Se | $CH_3$ | H | H |
| La428. | CH | N |  | CH | Se | $CH_3$ | H | H |
| La429. | CH | N |  | CH | Se | $CH_3$ | H | H |
| La430. | CH | N |  | CH | Se | $CH_3$ | H | H |
| La431. | CH | N | 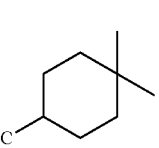 | CH | Se | $CH_3$ | H | H |
| La432. | CH | N | 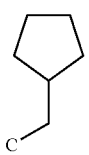 | CH | Se | $CH_3$ | H | H |
| La433. | CH | N | 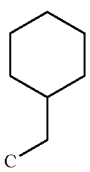 | CH | Se | $CH_3$ | H | H |
| La434. | CH | N | $CCD_3$ | CH | Se | $CD_3$ | H | H |
| La435. | CH | N |  | CH | Se | $CD_3$ | H | H |
| La436. | CH | N | 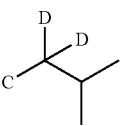 | CH | Se | $CD_3$ | H | H |
| La437. | CH | N | 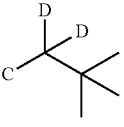 | CH | Se | $CD_3$ | H | H |
| La438. | CH | N |  | CH | Se | $CD_3$ | H | H |
| La439. | CH | N |  | CH | Se | $CD_3$ | H | H |

-continued
| Number | X₁ | X₂ | X₃ | X₄ | X | R₂₁ | R₂₂ | R₂₃ |
|---|---|---|---|---|---|---|---|---|
| La440. | CH | N | 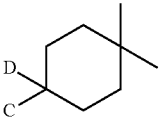 | CH | Se | CD₃ | H | H |
| La441. | CH | N | 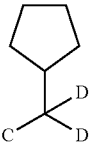 | CH | Se | CD₃ | H | H |
| La442. | CH | N | 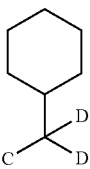 | CH | Se | CD₃ | H | H |
| La443. | CH | N | CCH₃ | CH | Se | CH₃ | H | CH₃ |
| La444. | CH | N |  | CH | Se | CH₃ | H | CH₃ |
| La445. | CH | N | 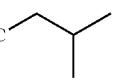 | CH | Se | CH₃ | H | CH₃ |
| La446. | CH | N | 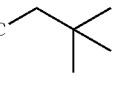 | CH | Se | CH₃ | H | CH₃ |
| La447. | CH | N | 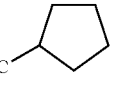 | CH | Se | CH₃ | H | CH₃ |
| La448. | CH | N | 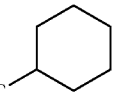 | CH | Se | CH₃ | H | CH₃ |
| La449. | CH | N | 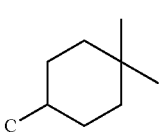 | CH | Se | CH₃ | H | CH₃ |
| La450. | CH | N | 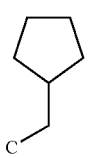 | CH | Se | CH₃ | H | CH₃ |
| La451. | CH | N | 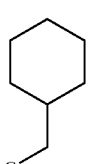 | CH | Se | CH₃ | H | CH₃ |
| La452. | CH | N | CCD₃ | CH | Se | CD₃ | H | CD₃ |

-continued

| Number | X₁ | X₂ | X₃ | X₄ | X | R₂₁ | R₂₂ | R₂₃ |
|---|---|---|---|---|---|---|---|---|
| La453. | CH | N | (CD₂-CH(CH₃)₂) | CH | Se | CD₃ | H | CD₃ |
| La454. | CH | N | (CD₂-C(CH₃)₃) | CH | Se | CD₃ | H | CD₃ |
| La455. | CH | N | (1-D-cyclopentyl) | CH | Se | CD₃ | H | CD₃ |
| La456. | CH | N | (1-D-cyclohexyl) | CH | Se | CD₃ | H | CD₃ |
| La457. | CH | N | (1-D-4,4-dimethylcyclohexyl) | CH | Se | CD₃ | H | CD₃ |
| La458. | CH | N | (cyclopentyl-CD₂) | CH | Se | CD₃ | H | CD₃ |
| La459. | CH | N | (cyclopentyl-CD₂) | CH | Se | CD₃ | H | CD₃ |
| La460. | CH | N | (cyclohexyl-CD₂) | CH | Se | CD₃ | H | CD₃ |
| La461. | CH | CH | N | CH | S | H | H | H |
| La462. | CH | CH | N | CH | S | CH₃ | H | H |
| La463. | CH | CH | N | CH | S | H | CH₃ | H |
| La464. | CH | CH | N | CH | S | CH₃ | H | CH₃ |
| La465. | CH | CH | N | CH | S | CD₃ | H | H |
| La466. | CH | CH | N | CH | S | H | CD₃ | H |
| La467. | CH | CH | N | CH | S | CH₃ | H | CD₃ |
| La468. | CH | CCH₃ | N | CH | S | H | H | H |
| La469. | CH | (CH(CH₃)₂) | N | CH | S | H | H | H |
| La470. | CH | (CH₂CH(CH₃)₂) | N | CH | S | H | H | H |
| La471. | CH | (CH₂C(CH₃)₃) | N | CH | S | H | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La472. | CH | 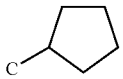 | N | CH | S | H | H | H |
| La473. | CH | 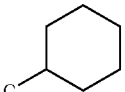 | N | CH | S | H | H | H |
| La474. | CH | 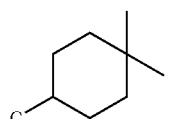 | N | CH | S | H | H | H |
| La475. | CH | 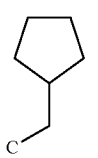 | N | CH | S | H | H | H |
| La476. | CH | 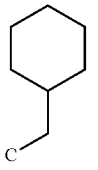 | N | CH | S | H | H | H |
| La477. | CH | CCD$_3$ | N | CH | S | H | H | H |
| La478. | CH |  | N | CH | S | H | H | H |
| La479. | CH | 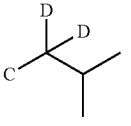 | N | CH | S | H | H | H |
| La480. | CH | 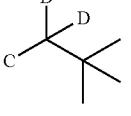 | N | CH | S | H | H | H |
| La481. | CH |  | N | CH | S | H | H | H |
| La482. | CH | 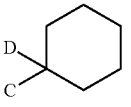 | N | CH | S | H | H | H |
| La483. | CH | 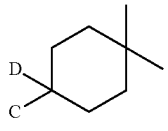 | N | CH | S | H | H | H |
| La484. | CH | 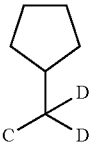 | N | CH | S | H | H | H |

-continued
| Number | X₁ | X₂ | X₃ | X₄ | X | R₂₁ | R₂₂ | R₂₃ |
|---|---|---|---|---|---|---|---|---|
| La485. | CH | 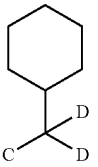 | N | CH | S | H | H | H |
| La486. | CH | CCH₃ | N | CH | S | CH₃ | H | H |
| La487. | CH |  | N | CH | S | CH₃ | H | H |
| La488. | CH |  | N | CH | S | CH₃ | H | H |
| La489. | CH |  | N | CH | S | CH₃ | H | H |
| La490. | CH |  | N | CH | S | CH₃ | H | H |
| La491. | CH |  | N | CH | S | CH₃ | H | H |
| La492. | CH | 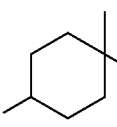 | N | CH | S | CH₃ | H | H |
| La493. | CH | 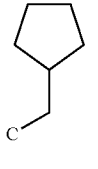 | N | CH | S | CH₃ | H | H |
| La494. | CH | 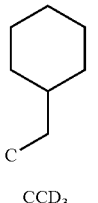 | N | CH | S | CH₃ | H | H |
| La495. | CH | CCD₃ | N | CH | S | CD₃ | H | H |
| La496. | CH |  | N | CH | S | CD₃ | H | H |
| La497. | CH | 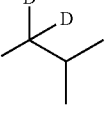 | N | CH | S | CD₃ | H | H |
| La498. | CH | 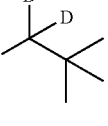 | N | CH | S | CD₃ | H | H |

-continued
| Number | X₁ | X₂ | X₃ | X₄ | X | R₂₁ | R₂₂ | R₂₃ |
|---|---|---|---|---|---|---|---|---|
| La499. | CH | 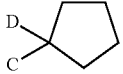 | N | CH | S | CD₃ | H | H |
| La500. | CH | 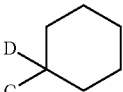 | N | CH | S | CD₃ | H | H |
| La501. | CH | 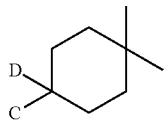 | N | CH | S | CD₃ | H | H |
| La502. | CH | 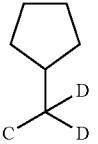 | N | CH | S | CD₃ | H | H |
| La503. | CH | 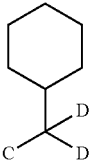 | N | CH | S | CD₃ | H | H |
| La504. | CH | CCH₃ | N | CH | S | CH₃ | H | CH₃ |
| La505. | CH |  | N | CH | S | CH₃ | H | CH₃ |
| La506. | CH | 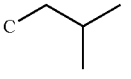 | N | CH | S | CH₃ | H | CH₃ |
| La507. | CH | 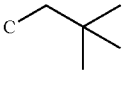 | N | CH | S | CH₃ | H | CH₃ |
| La508. | CH | 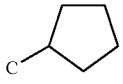 | N | CH | S | CH₃ | H | CH₃ |
| La509. | CH | 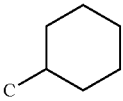 | N | CH | S | CH₃ | H | CH₃ |
| La510. | CH | 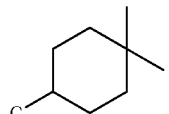 | N | CH | S | CH₃ | H | CH₃ |
| La511. | CH | 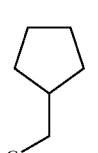 | N | CH | S | CH₃ | H | CH₃ |

-continued

| Number | X$_1$ | X$_2$ | X$_3$ | X$_4$ | X | R$_{21}$ | R$_{22}$ | R$_{23}$ |
|---|---|---|---|---|---|---|---|---|
| La512. | CH | C-CH$_2$-cyclohexyl | N | CH | S | CH$_3$ | H | CH$_3$ |
| La513. | CH | CCD$_3$ | N | CH | S | CD$_3$ | H | CD$_3$ |
| La514. | CH | C-CD(CH$_3$)$_2$ (isopropyl with one D on CH) | N | CH | S | CD$_3$ | H | CD$_3$ |
| La515. | CH | C-CD$_2$-CH(CH$_3$)$_2$ | N | CH | S | CD$_3$ | H | CD$_3$ |
| La516. | CH | C-CD$_2$-C(CH$_3$)$_3$ | N | CH | S | CD$_3$ | H | CD$_3$ |
| La517. | CH | C-CD(cyclopentyl) | N | CH | S | CD$_3$ | H | CD$_3$ |
| La518. | CH | C-CD(cyclohexyl) | N | CH | S | CD$_3$ | H | CD$_3$ |
| La519. | CH | C-CD(4,4-dimethylcyclohexyl) | N | CH | S | CD$_3$ | H | CD$_3$ |
| La520. | CH | C-CD$_2$-cyclopentyl | N | CH | S | CD$_3$ | H | CD$_3$ |
| La521. | CH | C-CD$_2$-cyclohexyl | N | CH | S | CD$_3$ | H | CD$_3$ |
| La522. | CH | CH | N | CH | Se | H | H | H |
| La523. | CH | CH | N | CH | Se | CH$_3$ | H | H |
| La524. | CH | CH | N | CH | Se | H | CH$_3$ | H |
| La525. | CH | CH | N | CH | Se | CH$_3$ | H | CH$_3$ |
| La526. | CH | CH | N | CH | Se | CD$_3$ | H | H |
| La527. | CH | CH | N | CH | Se | H | CD$_3$ | H |
| La528. | CH | CH | N | CH | Se | CH$_3$ | H | CD$_3$ |
| La529. | CH | CCH$_3$ | N | CH | Se | H | H | H |
| La530. | CH | C-CH(CH$_3$)$_2$ | N | CH | Se | H | H | H |

-continued
| Number | X$_1$ | X$_2$ | X$_3$ | X$_4$ | X | R$_{21}$ | R$_{22}$ | R$_{23}$ |
|---|---|---|---|---|---|---|---|---|
| La531. | CH | 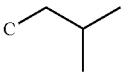 | N | CH | Se | H | H | H |
| La532. | CH | 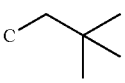 | N | CH | Se | H | H | H |
| La533. | CH |  | N | CH | Se | H | H | H |
| La534. | CH | 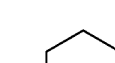 | N | CH | Se | H | H | H |
| La535. | CH | 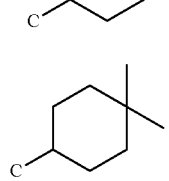 | N | CH | Se | H | H | H |
| La536. | CH |  | N | CH | Se | H | H | H |
| La537. | CH | 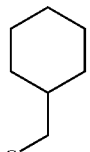 | N | CH | Se | H | H | H |
| La538. | CH | CCD$_3$ | N | CH | Se | H | H | H |
| La539. | CH |  | N | CH | Se | H | H | H |
| La540. | CH | 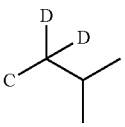 | N | CH | Se | H | H | H |
| La541. | CH | 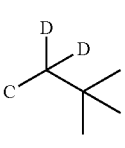 | N | CH | Se | H | H | H |
| La542. | CH | 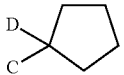 | N | CH | Se | H | H | H |
| La543. | CH | 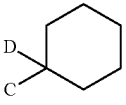 | N | CH | Se | H | H | H |

-continued
| Number | X₁ | X₂ | X₃ | X₄ | X | R₂₁ | R₂₂ | R₂₃ |
|---|---|---|---|---|---|---|---|---|
| La544. | CH | 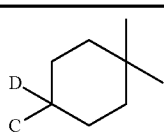 | N | CH | Se | H | H | H |
| La545. | CH | 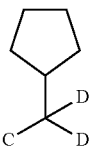 | N | CH | Se | H | H | H |
| La546. | CH | 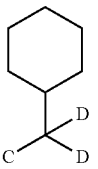 | N | CH | Se | H | H | H |
| La547. | CH | CCH₃ | N | CH | Se | CH₃ | H | H |
| La548. | CH |  | N | CH | Se | CH₃ | H | H |
| La549. | CH | 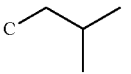 | N | CH | Se | CH₃ | H | H |
| La550. | CH | 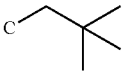 | N | CH | Se | CH₃ | H | H |
| La551. | CH | 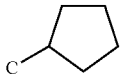 | N | CH | Se | CH₃ | H | H |
| La552. | CH | 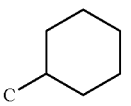 | N | CH | Se | CH₃ | H | H |
| La553. | CH | 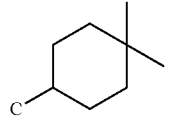 | N | CH | Se | CH₃ | H | H |
| La554. | CH | 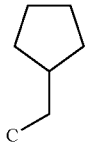 | N | CH | Se | CH₃ | H | H |
| La555. | CH | 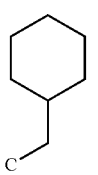 | N | CH | Se | CH₃ | H | H |
| La556. | CH | CCD₃ | N | CH | Se | CD₃ | H | H |
| La557. | CH |  | N | CH | Se | CD₃ | H | H |

-continued

| Number | X₁ | X₂ | X₃ | X₄ | X | R₂₁ | R₂₂ | R₂₃ |
|---|---|---|---|---|---|---|---|---|
| La558. | CH | CD₂-CH(CH₃)- | N | CH | Se | CD₃ | H | H |
| La559. | CH | CD₂-C(CH₃)₃ | N | CH | Se | CD₃ | H | H |
| La560. | CH | 1-(D)-cyclopentyl | N | CH | Se | CD₃ | H | H |
| La561. | CH | 1-(D)-cyclohexyl | N | CH | Se | CD₃ | H | H |
| La562. | CH | 4,4-dimethyl-1-(D)-cyclohexyl | N | CH | Se | CD₃ | H | H |
| La563. | CH | cyclopentyl-CD₂- | N | CH | Se | CD₃ | H | H |
| La564. | CH | cyclohexyl-CD₂- | N | CH | Se | CD₃ | H | H |
| La565. | CH | CCH₃ | N | CH | Se | CH₃ | H | CH₃ |
| La566. | CH | CH(CH₃)₂ | N | CH | Se | CH₃ | H | CH₃ |
| La567. | CH | CH₂CH(CH₃)₂ | N | CH | Se | CH₃ | H | CH₃ |
| La568. | CH | CH₂C(CH₃)₃ | N | CH | Se | CH₃ | H | CH₃ |
| La569. | CH | cyclopentyl | N | CH | Se | CH₃ | H | CH₃ |
| La570. | CH | cyclohexyl | N | CH | Se | CH₃ | H | CH₃ |

-continued

| Number | X₁ | X₂ | X₃ | X₄ | X | R₂₁ | R₂₂ | R₂₃ |
|---|---|---|---|---|---|---|---|---|
| La571. | CH | *4,4-dimethylcyclohexyl-CH₂-* | N | CH | Se | CH₃ | H | CH₃ |
| La572. | CH | *cyclopentyl-CH₂-* | N | CH | Se | CH₃ | H | CH₃ |
| La573. | CH | *cyclohexyl-CH₂-* | N | CH | Se | CH₃ | H | CH₃ |
| La574. | CH | CCD₃ | N | CH | Se | CD₃ | H | CD₃ |
| La575. | CH | *C(D)₂-C(CH₃)₃... tert-butyl-CD₂-* | N | CH | Se | CD₃ | H | CD₃ |
| La576. | CH | *isopropyl-CD₂-* | N | CH | Se | CD₃ | H | CD₃ |
| La577. | CH | *neopentyl-CD₂-* | N | CH | Se | CD₃ | H | CD₃ |
| La578. | CH | *cyclopentyl-CD₂-* | N | CH | Se | CD₃ | H | CD₃ |
| La579. | CH | *cyclohexyl-CD₂-* | N | CH | Se | CD₃ | H | CD₃ |
| La580. | CH | *4,4-dimethylcyclohexyl-CD₂-* | N | CH | Se | CD₃ | H | CD₃ |
| La581. | CH | *cyclopentyl-CD₂-* | N | CH | Se | CD₃ | H | CD₃ |
| La582. | CH | *cyclohexyl-CD₂-* | N | CH | Se | CD₃ | H | CD₃ |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La583. | CH | CH | CH | N | S | H | H | H |
| La584. | CH | CH | CH | N | S | $CH_3$ | H | H |
| La585. | CH | CH | CH | N | S | H | $CH_3$ | H |
| La586. | CH | CH | CH | N | S | $CH_3$ | H | $CH_3$ |
| La587. | CH | CH | CH | N | S | $CD_3$ | H | H |
| La588. | CH | CH | CH | N | S | H | $CD_3$ | H |
| La589. | CH | CH | CH | N | S | $CH_3$ | H | $CD_3$ |
| La590. | CH | CH | $CCH_3$ | N | S | H | H | H |
| La591. | CH | CH |  | N | S | H | H | H |
| La592. | CH | CH | 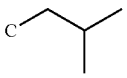 | N | S | H | H | H |
| La593. | CH | CH | 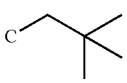 | N | S | H | H | H |
| La594. | CH | CH | 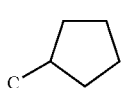 | N | S | H | H | H |
| La595. | CH | CH | 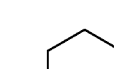 | N | S | H | H | H |
| La596. | CH | CH | 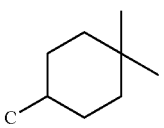 | N | S | H | H | H |
| La597. | CH | CH | 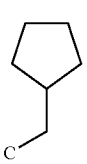 | N | S | H | H | H |
| La598. | CH | CH | 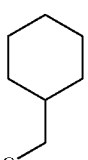 | N | S | H | H | H |
| La599. | CH | CH | $CCD_3$ | N | S | H | H | H |
| La600. | CH | CH |  | N | S | H | H | H |
| La601. | CH | CH | 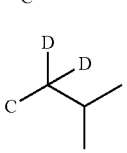 | N | S | H | H | H |
| La602. | CH | CH | 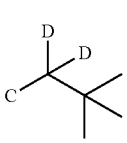 | N | S | H | H | H |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La603. | CH | CH | cyclopentyl (C,D substituted) | N | S | H | H | H |
| La604. | CH | CH | cyclohexyl (C,D substituted) | N | S | H | H | H |
| La605. | CH | CH | 4,4-dimethylcyclohexyl (C,D substituted) | N | S | H | H | H |
| La606. | CH | CH | cyclopentyl-CD$_2$- (C attached) | N | S | H | H | H |
| La607. | CH | CH | cyclohexyl-CD$_2$- (C attached) | N | S | H | H | H |
| La608. | CH | CH | CCH$_3$ | N | S | CH$_3$ | H | H |
| La609. | CH | CH | isopropyl | N | S | CH$_3$ | H | H |
| La610. | CH | CH | isobutyl | N | S | CH$_3$ | H | H |
| La611. | CH | CH | neopentyl | N | S | CH$_3$ | H | H |
| La612. | CH | CH | cyclopentyl | N | S | CH$_3$ | H | H |
| La613. | CH | CH | cyclohexyl | N | S | CH$_3$ | H | H |
| La614. | CH | CH | 4,4-dimethylcyclohexyl | N | S | CH$_3$ | H | H |
| La615. | CH | CH | cyclopentylmethyl | N | S | CH$_3$ | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La616. | CH | CH | 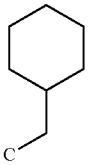 | N | S | $CH_3$ | H | H |
| La617. | CH | CH | $CCD_3$ | N | S | $CD_3$ | H | H |
| La618. | CH | CH |  | N | S | $CD_3$ | H | H |
| La619. | CH | CH | 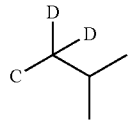 | N | S | $CD_3$ | H | H |
| La620. | CH | CH | 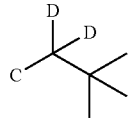 | N | S | $CD_3$ | H | H |
| La621. | CH | CH | 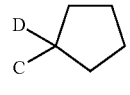 | N | S | $CD_3$ | H | H |
| La622. | CH | CH | 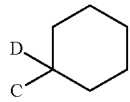 | N | S | $CD_3$ | H | H |
| La623. | CH | CH | 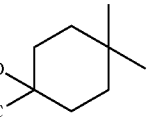 | N | S | $CD_3$ | H | H |
| La624. | CH | CH | 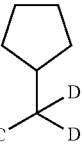 | N | S | $CD_3$ | H | H |
| La625. | CH | CH | 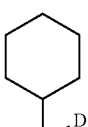 | N | S | $CD_3$ | H | H |
| La626. | CH | CH | $CCH_3$ | N | S | $CH_3$ | H | $CH_3$ |
| La627. | CH | CH |  | N | S | $CH_3$ | H | $CH_3$ |
| La628. | CH | CH | 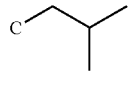 | N | S | $CH_3$ | H | $CH_3$ |
| La629. | CH | CH | 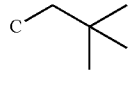 | N | S | $CH_3$ | H | $CH_3$ |

-continued
| Number | X₁ | X₂ | X₃ | X₄ | X | R₂₁ | R₂₂ | R₂₃ |
|---|---|---|---|---|---|---|---|---|
| La630. | CH | CH | 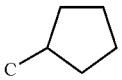 | N | S | CH₃ | H | CH₃ |
| La631. | CH | CH | 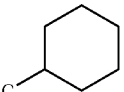 | N | S | CH₃ | H | CH₃ |
| La632. | CH | CH | 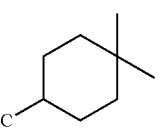 | N | S | CH₃ | H | CH₃ |
| La633. | CH | CH |  | N | S | CH₃ | H | CH₃ |
| La634. | CH | CH | 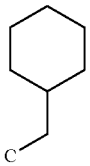 | N | S | CH₃ | H | CH₃ |
| La635. | CH | CH | CCD₃ | N | S | CD₃ | H | CD₃ |
| La636. | CH | CH |  | N | S | CD₃ | H | CD₃ |
| La637. | CH | CH | 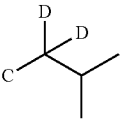 | N | S | CD₃ | H | CD₃ |
| La638. | CH | CH | 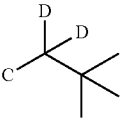 | N | S | CD₃ | H | CD₃ |
| La639. | CH | CH |  | N | S | CD₃ | H | CD₃ |
| La640. | CH | CH | 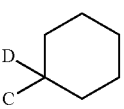 | N | S | CD₃ | H | CD₃ |
| La641. | CH | CH | 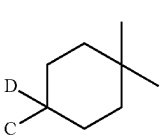 | N | S | CD₃ | H | CD₃ |
| La642. | CH | CH | 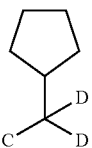 | N | S | CD₃ | H | CD₃ |

-continued

| Number | X₁ | X₂ | X₃ | X₄ | X | R₂₁ | R₂₂ | R₂₃ |
|---|---|---|---|---|---|---|---|---|
| La643. | CH | CH | 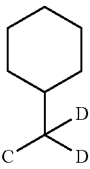 | N | S | CD₃ | H | CD₃ |
| La644. | CH | CH | CH | N | Se | H | H | H |
| La645. | CH | CH | CH | N | Se | CH₃ | H | H |
| La646. | CH | CH | CH | N | Se | H | CH₃ | H |
| La647. | CH | CH | CH | N | Se | CH₃ | H | CH₃ |
| La648. | CH | CH | CH | N | Se | CD₃ | H | H |
| La649. | CH | CH | CH | N | Se | H | CD₃ | H |
| La650. | CH | CH | CH | N | Se | CH₃ | H | CD₃ |
| La651. | CH | CH | CCH₃ | N | Se | H | H | H |
| La652. | CH | CH |  | N | Se | H | H | H |
| La653. | CH | CH | 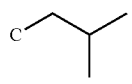 | N | Se | H | H | H |
| La654. | CH | CH | 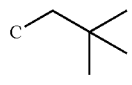 | N | Se | H | H | H |
| La655. | CH | CH | 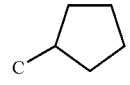 | N | Se | H | H | H |
| La656. | CH | CH | 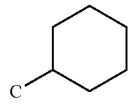 | N | Se | H | H | H |
| La657. | CH | CH | 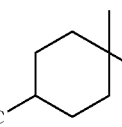 | N | Se | H | H | H |
| La658. | CH | CH | 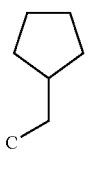 | N | Se | H | H | H |
| La659. | CH | CH | 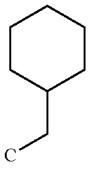 | N | Se | H | H | H |
| La660. | CH | CH | CCD₃ | N | Se | H | H | H |
| La661. | CH | CH |  | N | Se | H | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La662. | CH | CH | 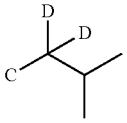 | N | Se | H | H | H |
| La663. | CH | CH | 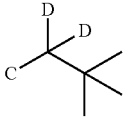 | N | Se | H | H | H |
| La664. | CH | CH |  | N | Se | H | H | H |
| La665. | CH | CH | 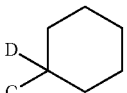 | N | Se | H | H | H |
| La666. | CH | CH | 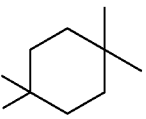 | N | Se | H | H | H |
| La667. | CH | CH | 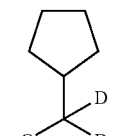 | N | Se | H | H | H |
| La668. | CH | CH | 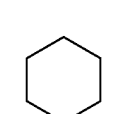 | N | Se | H | H | H |
| La669. | CH | CH | CCH$_3$ | N | Se | CH$_3$ | H | H |
| La670. | CH | CH | 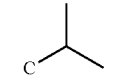 | N | Se | CH$_3$ | H | H |
| La671. | CH | CH | 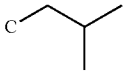 | N | Se | CH$_3$ | H | H |
| La672. | CH | CH | 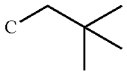 | N | Se | CH$_3$ | H | H |
| La673. | CH | CH | 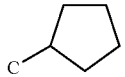 | N | Se | CH$_3$ | H | H |
| La674. | CH | CH | 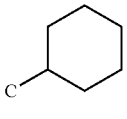 | N | Se | CH$_3$ | H | H |

-continued

| Number | X₁ | X₂ | X₃ | X₄ | X | R₂₁ | R₂₂ | R₂₃ |
|---|---|---|---|---|---|---|---|---|
| La675. | CH | CH | (4,4-dimethylcyclohexyl-C) | N | Se | CH₃ | H | H |
| La676. | CH | CH | (cyclopentylmethyl-C) | N | Se | CH₃ | H | H |
| La677. | CH | CH | (cyclohexylmethyl-C) | N | Se | CH₃ | H | H |
| La678. | CH | CH | CCD₃ | N | Se | CD₃ | H | H |
| La679. | CH | CH | (C(CD)(CH₃)₂... isopropyl-d) | N | Se | CD₃ | H | H |
| La680. | CH | CH | (CD₂-iPr) | N | Se | CD₃ | H | H |
| La681. | CH | CH | (CD₂-tBu) | N | Se | CD₃ | H | H |
| La682. | CH | CH | (1-D-cyclopentyl-C) | N | Se | CD₃ | H | H |
| La683. | CH | CH | (1-D-cyclohexyl-C) | N | Se | CD₃ | H | H |
| La684. | CH | CH | (D-4,4-dimethylcyclohexyl-C) | N | Se | CD₃ | H | H |
| La685. | CH | CH | (cyclopentyl-CD₂) | N | Se | CD₃ | H | H |
| La686. | CH | CH | (cyclohexyl-CD₂) | N | Se | CD₃ | H | H |
| La687. | CH | CH | CCH₃ | N | Se | CH₃ | H | CH₃ |

-continued
| Number | X₁ | X₂ | X₃ | X₄ | X | R₂₁ | R₂₂ | R₂₃ |
|---|---|---|---|---|---|---|---|---|
| La688. | CH | CH |  | N | Se | CH₃ | H | CH₃ |
| La689. | CH | CH | 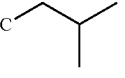 | N | Se | CH₃ | H | CH₃ |
| La690. | CH | CH | 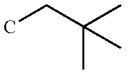 | N | Se | CH₃ | H | CH₃ |
| La691. | CH | CH | 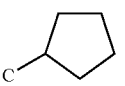 | N | Se | CH₃ | H | CH₃ |
| La692. | CH | CH | 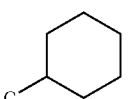 | N | Se | CH₃ | H | CH₃ |
| La693. | CH | CH | 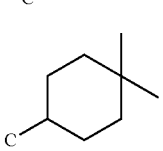 | N | Se | CH₃ | H | CH₃ |
| La694. | CH | CH | 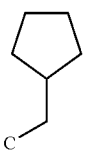 | N | Se | CH₃ | H | CH₃ |
| La695. | CH | CH | 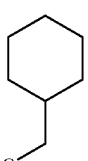 | N | Se | CH₃ | H | CH₃ |
| La696. | CH | CH | CCD₃ | N | Se | CD₃ | H | CD₃ |
| La697. | CH | CH |  | N | Se | CD₃ | H | CD₃ |
| La698. | CH | CH | 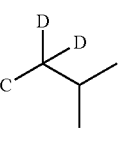 | N | Se | CD₃ | H | CD₃ |
| La699. | CH | CH | 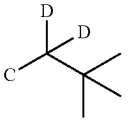 | N | Se | CD₃ | H | CD₃ |
| La700. | CH | CH | 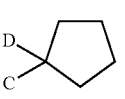 | N | Se | CD₃ | H | CD₃ |
| La701. | CH | CH | 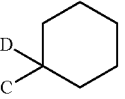 | N | Se | CD₃ | H | CD₃ |

-continued

| Number | X₁ | X₂ | X₃ | X₄ | X | R₂₁ | R₂₂ | R₂₃ |
|---|---|---|---|---|---|---|---|---|
| La702. | CH | CH | 4,4-dimethylcyclohexyl-CD₂- | N | Se | CD₃ | H | CD₃ |
| La703. | CH | CH | cyclopentyl-CD₂- | N | Se | CD₃ | H | CD₃ |
| La704. | CH | CH | cyclohexyl-CD₂- | N | Se | CD₃ | H | CD₃ |
| La705. | N | CH | | N | CH S | H | H | H |
| La706. | N | CH | | N | CH S | CH₃ | H | H |
| La707. | N | CH | | N | CH S | H | CH₃ | H |
| La708. | N | CH | | N | CH S | CH₃ | H | CH₃ |
| La709. | N | CH | | N | CH S | CD₃ | H | H |
| La710. | N | CH | | N | CH S | H | CD₃ | H |
| La711. | N | CH | | N | CH S | CH₃ | H | CD₃ |
| La712. | N | CCH₃ | | N | CH S | H | H | H |
| La713. | N | isopropyl-C- | | N | CH S | H | H | H |
| La714. | N | isobutyl-C- | | N | CH S | H | H | H |
| La715. | N | neopentyl-C- | | N | CH S | H | H | H |
| La716. | N | cyclopentyl-C- | | N | CH S | H | H | H |
| La717. | N | cyclohexyl-C- | | N | CH S | H | H | H |
| La718. | N | 4,4-dimethylcyclohexyl-C- | | N | CH S | H | H | H |
| La719. | N | cyclopentyl-CH₂-C- | | N | CH S | H | H | H |

-continued

| Number | X₁ | X₂ | X₃ | X₄ | X | R₂₁ | R₂₂ | R₂₃ |
|---|---|---|---|---|---|---|---|---|
| La720. | N | cyclohexylmethyl (–CH₂–C₆H₁₁) | N | CH | S | H | H | H |
| La721. | N | CCD₃ | N | CH | S | H | H | H |
| La722. | N | –CH(CH₃)(CD₃) | N | CH | S | H | H | H |
| La723. | N | –CH(CD₂H)-CH(CH₃)₂ (with D,D) | N | CH | S | H | H | H |
| La724. | N | –CH(CD₂H)-C(CH₃)₃ | N | CH | S | H | H | H |
| La725. | N | 1-deutero-cyclopentyl | N | CH | S | H | H | H |
| La726. | N | 1-deutero-cyclohexyl | N | CH | S | H | H | H |
| La727. | N | 1-deutero-4,4-dimethylcyclohexyl | N | CH | S | H | H | H |
| La728. | N | cyclopentyl-CD₂– | N | CH | S | H | H | H |
| La729. | N | cyclohexyl-CD₂– | N | CH | S | H | H | H |
| La730. | N | CCH₃ | N | CH | S | CH₃ | H | H |
| La731. | N | –CH(CH₃)₂ | N | CH | S | CH₃ | H | H |
| La732. | N | –CH₂-CH(CH₃)₂ | N | CH | S | CH₃ | H | H |
| La733. | N | –CH₂-C(CH₃)₃ | N | CH | S | CH₃ | H | H |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La734. | N | cyclopentyl | N | CH | S | $CH_3$ | H | H |
| La735. | N | cyclohexyl | N | CH | S | $CH_3$ | H | H |
| La736. | N | 4,4-dimethylcyclohexyl | N | CH | S | $CH_3$ | H | H |
| La737. | N | cyclopentylmethyl | N | CH | S | $CH_3$ | H | H |
| La738. | N | cyclohexylmethyl | N | CH | S | $CH_3$ | H | H |
| La739. | N | $CCD_3$ | N | CH | S | $CD_3$ | H | H |
| La740. | N | $C(CH_3)_2D$ | N | CH | S | $CD_3$ | H | H |
| La741. | N | $CD_2CH(CH_3)_2$ | N | CH | S | $CD_3$ | H | H |
| La742. | N | $CD_2C(CH_3)_3$ | N | CH | S | $CD_3$ | H | H |
| La743. | N | 1-D-cyclopentyl | N | CH | S | $CD_3$ | H | H |
| La744. | N | 1-D-cyclohexyl | N | CH | S | $CD_3$ | H | H |
| La745. | N | 1-D-4,4-dimethylcyclohexyl | N | CH | S | $CD_3$ | H | H |
| La746. | N | cyclopentyl-$CD_2$ | N | CH | S | $CD_3$ | H | H |

-continued
| Number | X₁ | X₂ | X₃ | X₄ | X | R₂₁ | R₂₂ | R₂₃ |
|---|---|---|---|---|---|---|---|---|
| La747. | N | 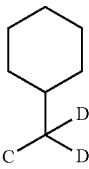 | N | CH | S | CD₃ | H | H |
| La748. | N | CCH₃ | N | CH | S | CH₃ | H | CH₃ |
| La749. | N |  | N | CH | S | CH₃ | H | CH₃ |
| La750. | N |  | N | CH | S | CH₃ | H | CH₃ |
| La751. | N |  | N | CH | S | CH₃ | H | CH₃ |
| La752. | N |  | N | CH | S | CH₃ | H | CH₃ |
| La753. | N |  | N | CH | S | CH₃ | H | CH₃ |
| La754. | N | 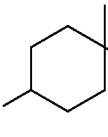 | N | CH | S | CH₃ | H | CH₃ |
| La755. | N | 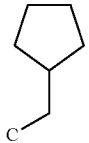 | N | CH | S | CH₃ | H | CH₃ |
| La756. | N | 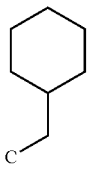 | N | CH | S | CH₃ | H | CH₃ |
| La757. | N | CCD₃ | N | CH | S | CD₃ | H | CD₃ |
| La758. | N |  | N | CH | S | CD₃ | H | CD₃ |
| La759. | N | 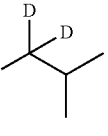 | N | CH | S | CD₃ | H | CD₃ |
| La760. | N | 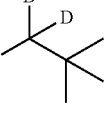 | N | CH | S | CD₃ | H | CD₃ |

| Number | X₁ | X₂ | X₃ | X₄ | X | R₂₁ | R₂₂ | R₂₃ |
|---|---|---|---|---|---|---|---|---|
| La761. | N | cyclopentyl-CD (1-D-cyclopentyl) | N | CH | S | CD₃ | H | CD₃ |
| La762. | N | cyclohexyl-CD (1-D-cyclohexyl) | N | CH | S | CD₃ | H | CD₃ |
| La763. | N | 4,4-dimethyl-1-D-cyclohexyl | N | CH | S | CD₃ | H | CD₃ |
| La764. | N | cyclopentyl-CD₂ | N | CH | S | CD₃ | H | CD₃ |
| La765. | N | cyclohexyl-CD₂ | N | CH | S | CD₃ | H | CD₃ |
| La766. | N | CH | N | CH | Se | H | H | H |
| La767. | N | CH | N | CH | Se | CH₃ | H | H |
| La768. | N | CH | N | CH | Se | H | CH₃ | H |
| La769. | N | CH | N | CH | Se | CH₃ | H | CH₃ |
| La770. | N | CH | N | CH | Se | CD₃ | H | H |
| La771. | N | CH | N | CH | Se | H | CD₃ | H |
| La772. | N | CH | N | CH | Se | CH₃ | H | CD₃ |
| La773. | N | CCH₃ | N | CH | Se | H | H | H |
| La774. | N | isopropyl | N | CH | Se | H | H | H |
| La775. | N | isobutyl | N | CH | Se | H | H | H |
| La776. | N | neopentyl | N | CH | Se | H | H | H |
| La777. | N | cyclopentylmethyl | N | CH | Se | H | H | H |
| La778. | N | cyclohexylmethyl | N | CH | Se | H | H | H |
| La779. | N | (4,4-dimethylcyclohexyl)methyl | N | CH | Se | H | H | H |

-continued

| Number | X₁ | X₂ | X₃ | X₄ | X | R₂₁ | R₂₂ | R₂₃ |
|---|---|---|---|---|---|---|---|---|
| La780. | N | cyclopentyl-CH₂–C | N | CH | Se | H | H | H |
| La781. | N | cyclohexyl-CH₂–C | N | CH | Se | H | H | H |
| La782. | N | CCD₃ | N | CH | Se | H | H | H |
| La783. | N | C(CH₃)₂D (iPr-d1) | N | CH | Se | H | H | H |
| La784. | N | CD₂–CH(CH₃)– | N | CH | Se | H | H | H |
| La785. | N | CD₂–C(CH₃)₃ | N | CH | Se | H | H | H |
| La786. | N | 1-D-cyclopentyl-C | N | CH | Se | H | H | H |
| La787. | N | 1-D-cyclohexyl-C | N | CH | Se | H | H | H |
| La788. | N | 4-methyl-1-D-cyclohexyl-C | N | CH | Se | H | H | H |
| La789. | N | cyclopentyl-CD₂–C | N | CH | Se | H | H | H |
| La790. | N | cyclohexyl-CD₂–C | N | CH | Se | H | H | H |
| La791. | N | CCH₃ | N | CH | Se | CH₃ | H | H |
| La792. | N | CH(CH₃)₂–C | N | CH | Se | CH₃ | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La793. | N | 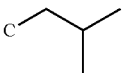 | N | CH | Se | $CH_3$ | H | H |
| La794. | N | 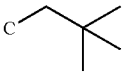 | N | CH | Se | $CH_3$ | H | H |
| La795. | N | 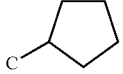 | N | CH | Se | $CH_3$ | H | H |
| La796. | N | 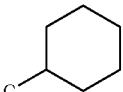 | N | CH | Se | $CH_3$ | H | H |
| La797. | N | 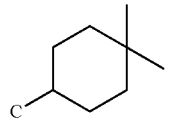 | N | CH | Se | $CH_3$ | H | H |
| La798. | N | 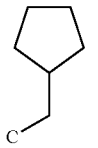 | N | CH | Se | $CH_3$ | H | H |
| La799. | N | 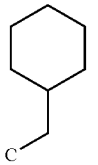 | N | CH | Se | $CH_3$ | H | H |
| La800. | N | $CCD_3$ | N | CH | Se | $CD_3$ | H | H |
| La801. | N |  | N | CH | Se | $CD_3$ | H | H |
| La802. | N | 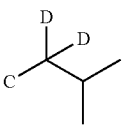 | N | CH | Se | $CD_3$ | H | H |
| La803. | N | 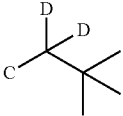 | N | CH | Se | $CD_3$ | H | H |
| La804. | N | 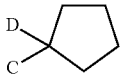 | N | CH | Se | $CD_3$ | H | H |
| La805. | N | 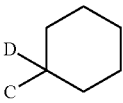 | N | CH | Se | $CD_3$ | H | H |

-continued
| Number | X₁ | X₂ | X₃ | X₄ | X | R₂₁ | R₂₂ | R₂₃ |
|---|---|---|---|---|---|---|---|---|
| La806. | N | 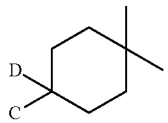 | N | CH | Se | CD₃ | H | H |
| La807. | N | 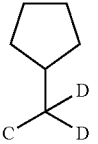 | N | CH | Se | CD₃ | H | H |
| La808. | N | 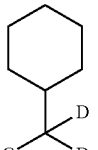 | N | CH | Se | CD₃ | H | H |
| La809. | N | CCH₃ | N | CH | Se | CH₃ | H | CH₃ |
| La810. | N |  | N | CH | Se | CH₃ | H | CH₃ |
| La811. | N |  | N | CH | Se | CH₃ | H | CH₃ |
| La812. | N |  | N | CH | Se | CH₃ | H | CH₃ |
| La813. | N |  | N | CH | Se | CH₃ | H | CH₃ |
| La814. | N |  | N | CH | Se | CH₃ | H | CH₃ |
| La815. | N | 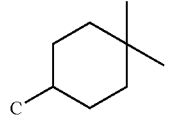 | N | CH | Se | CH₃ | H | CH₃ |
| La816. | N | 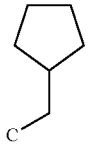 | N | CH | Se | CH₃ | H | CH₃ |
| La817. | N | 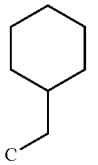 | N | CH | Se | CH₃ | H | CH₃ |
| La818. | N | CCD₃ | N | CH | Se | CD₃ | H | CD₃ |
| La819. | N |  | N | CH | Se | CD₃ | H | CD₃ |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La820. | N | (isopropyl, CD$_2$) | N | CH | Se | $CD_3$ | H | $CD_3$ |
| La821. | N | (neopentyl-like, CD$_2$-C(CH$_3$)$_3$) | N | CH | Se | $CD_3$ | H | $CD_3$ |
| La822. | N | (cyclopentyl with CD) | N | CH | Se | $CD_3$ | H | $CD_3$ |
| La823. | N | (cyclohexyl with CD) | N | CH | Se | $CD_3$ | H | $CD_3$ |
| La824. | N | (4,4-dimethylcyclohexyl with CD) | N | CH | Se | $CD_3$ | H | $CD_3$ |
| La825. | N | (cyclopentylmethyl-CD$_2$) | N | CH | Se | $CD_3$ | H | $CD_3$ |
| La826. | N | (cyclohexylmethyl-CD$_2$) | N | CH | Se | $CD_3$ | H | $CD_3$ |
| La827. | N | CH | CH | N | S | H | H | H |
| La828. | N | CH | CH | N | S | $CH_3$ | H | H |
| La829. | N | CH | CH | N | S | H | $CH_3$ | H |
| La830. | N | CH | CH | N | S | $CH_3$ | H | $CH_3$ |
| La831. | N | CH | CH | N | S | $CD_3$ | H | H |
| La832. | N | CH | CH | N | S | H | $CD_3$ | H |
| La833. | N | CH | CH | N | S | $CH_3$ | H | $CD_3$ |
| La834. | N | $CCH_3$ | CH | N | S | H | H | H |
| La835. | N | (isopropyl) | CH | N | S | H | H | H |
| La836. | N | (isobutyl) | CH | N | S | H | H | H |
| La837. | N | (neopentyl) | CH | N | S | H | H | H |
| La838. | N | (cyclopentyl) | CH | N | S | H | H | H |

-continued
| Number | X₁ | X₂ | X₃ | X₄ | X | R₂₁ | R₂₂ | R₂₃ |
|---|---|---|---|---|---|---|---|---|
| La839. | N | 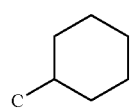 | CH | N | S | H | H | H |
| La840. | N | 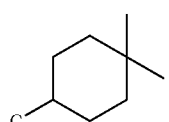 | CH | N | S | H | H | H |
| La841. | N | 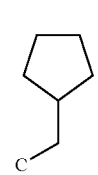 | CH | N | S | H | H | H |
| La842. | N | 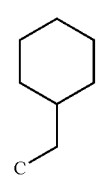 | CH | N | S | H | H | H |
| La843. | N | CCD₃ | CH | N | S | H | H | H |
| La844. | N |  | CH | N | S | H | H | H |
| La845. | N | 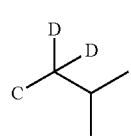 | CH | N | S | H | H | H |
| La846. | N | 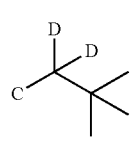 | CH | N | S | H | H | H |
| La847. | N | 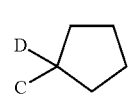 | CH | N | S | H | H | H |
| La848. | N | 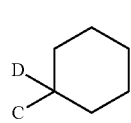 | CH | N | S | H | H | H |
| La849. | N | 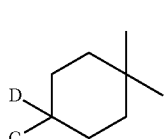 | CH | N | S | H | H | H |
| La850. | N | 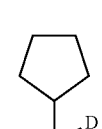 | CH | N | S | H | H | H |

-continued
| Number | X₁ | X₂ | X₃ | X₄ | X | R₂₁ | R₂₂ | R₂₃ |
|---|---|---|---|---|---|---|---|---|
| La851. | N | 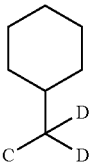 | CH | N | S | H | H | H |
| La852. | N | CCH₃ | CH | N | S | CH₃ | H | H |
| La853. | N |  | CH | N | S | CH₃ | H | H |
| La854. | N |  | CH | N | S | CH₃ | H | H |
| La855. | N |  | CH | N | S | CH₃ | H | H |
| La856. | N |  | CH | N | S | CH₃ | H | H |
| La857. | N |  | CH | N | S | CH₃ | H | H |
| La858. | N | 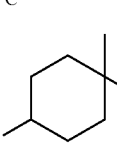 | CH | N | S | CH₃ | H | H |
| La859. | N | 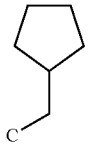 | CH | N | S | CH₃ | H | H |
| La860. | N | 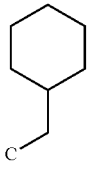 | CH | N | S | CH₃ | H | H |
| La861. | N | CCD₃ | CH | N | S | CD₃ | H | H |
| La862. | N |  | CH | N | S | CD₃ | H | H |
| La863. | N | 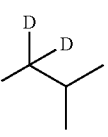 | CH | N | S | CD₃ | H | H |
| La864. | N | 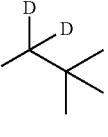 | CH | N | S | CD₃ | H | H |

-continued
| Number | X₁ | X₂ | X₃ | X₄ | X | R₂₁ | R₂₂ | R₂₃ |
|---|---|---|---|---|---|---|---|---|
| La865. | N | 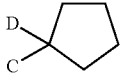 | CH | N | S | CD₃ | H | H |
| La866. | N | 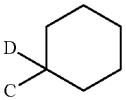 | CH | N | S | CD₃ | H | H |
| La867. | N | 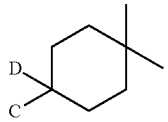 | CH | N | S | CD₃ | H | H |
| La868. | N | 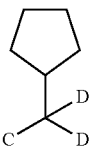 | CH | N | S | CD₃ | H | H |
| La869. | N | 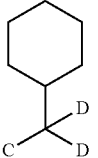 | CH | N | S | CD₃ | H | H |
| La870. | N | CCH₃ | CH | N | S | CH₃ | H | CH₃ |
| La871. | N |  | CH | N | S | CH₃ | H | CH₃ |
| La872. | N | 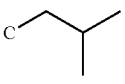 | CH | N | S | CH₃ | H | CH₃ |
| La873. | N | 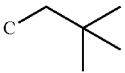 | CH | N | S | CH₃ | H | CH₃ |
| La874. | N | 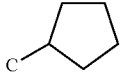 | CH | N | S | CH₃ | H | CH₃ |
| La875. | N | 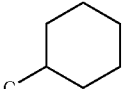 | CH | N | S | CH₃ | H | CH₃ |
| La876. | N | 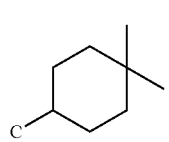 | CH | N | S | CH₃ | H | CH₃ |
| La877. | N | 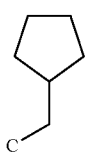 | CH | N | S | CH₃ | H | CH₃ |

-continued

| Number | X$_1$ | X$_2$ | X$_3$ | X$_4$ | X | R$_{21}$ | R$_{22}$ | R$_{23}$ |
|---|---|---|---|---|---|---|---|---|
| La878. | N |  | CH | N | S | CH$_3$ | H | CH$_3$ |
| La879. | N | CCD$_3$ | CH | N | S | CD$_3$ | H | CD$_3$ |
| La880. | N |  | CH | N | S | CD$_3$ | H | CD$_3$ |
| La881. | N | 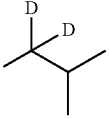 | CH | N | S | CD$_3$ | H | CD$_3$ |
| La882. | N | 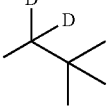 | CH | N | S | CD$_3$ | H | CD$_3$ |
| La883. | N |  | CH | N | S | CD$_3$ | H | CD$_3$ |
| La884. | N |  | CH | N | S | CD$_3$ | H | CD$_3$ |
| La885. | N | 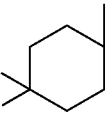 | CH | N | S | CD$_3$ | H | CD$_3$ |
| La886. | N | 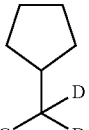 | CH | N | S | CD$_3$ | H | CD$_3$ |
| La887. | N | 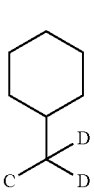 | CH | N | S | CD$_3$ | H | CD$_3$ |
| La888. | N | CH | CH | N | Se | H | H | H |
| La889. | N | CH | CH | N | Se | CH$_3$ | H | H |
| La890. | N | CH | CH | N | Se | H | CH$_3$ | H |
| La891. | N | CH | CH | N | Se | CH$_3$ | H | CH$_3$ |
| La892. | N | CH | CH | N | Se | CD$_3$ | H | H |
| La893. | N | CH | CH | N | Se | H | CD$_3$ | H |
| La894. | N | CH | CH | N | Se | CH$_3$ | H | CD$_3$ |
| La895. | N | CCH$_3$ | CH | N | Se | H | H | H |
| La896. | N |  | CH | N | Se | H | H | H |

-continued
| Number | X₁ | X₂ | X₃ | X₄ | X | R₂₁ | R₂₂ | R₂₃ |
|---|---|---|---|---|---|---|---|---|
| La897. | N | 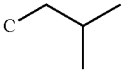 | CH | N | Se | H | H | H |
| La898. | N | 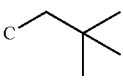 | CH | N | Se | H | H | H |
| La899. | N | 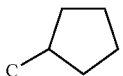 | CH | N | Se | H | H | H |
| La900. | N | 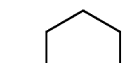 | CH | N | Se | H | H | H |
| La901. | N | 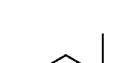 | CH | N | Se | H | H | H |
| La902. | N |  | CH | N | Se | H | H | H |
| La903. | N | 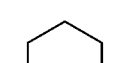 | CH | N | Se | H | H | H |
| La904. | N | CCD₃ | CH | N | Se | H | H | H |
| La905. | N |  | CH | N | Se | H | H | H |
| La906. | N | 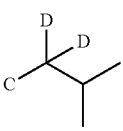 | CH | N | Se | H | H | H |
| La907. | N | 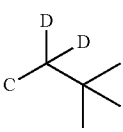 | CH | N | Se | H | H | H |
| La908. | N |  | N | Se | H | H | H | |
| La909. | N | 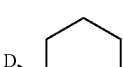 | CH | N | Se | H | H | H |

-continued
| Number | X₁ | X₂ | X₃ | X₄ | X | R₂₁ | R₂₂ | R₂₃ |
|---|---|---|---|---|---|---|---|---|
| La910. | N | 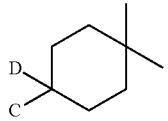 | CH | N | Se | H | H | H |
| La911. | N | 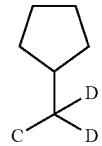 | CH | N | Se | H | H | H |
| La912. | N | 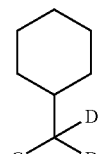 | CH | N | Se | H | H | H |
| La913. | N | CCH₃ | CH | N | Se | CH₃ | H | H |
| La914. | N |  | CH | N | Se | CH₃ | H | H |
| La915. | N | 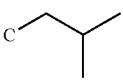 | CH | N | Se | CH₃ | H | H |
| La916. | N | 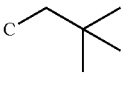 | CH | N | Se | CH₃ | H | H |
| La917. | N | 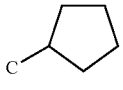 | CH | N | Se | CH₃ | H | H |
| La918. | N | 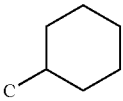 | CH | N | Se | CH₃ | H | H |
| La919. | N | 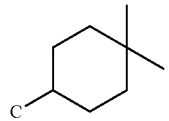 | CH | N | Se | CH₃ | H | H |
| La920. | N | 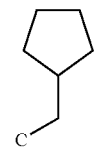 | CH | N | Se | CH₃ | H | H |
| La921. | N | 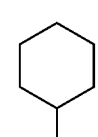 | CH | N | Se | CH₃ | H | H |
| La922. | N | CCD₃ | CH | N | Se | CD₃ | H | H |

| Number | X₁ | X₂ | X₃ | X₄ | X | R₂₁ | R₂₂ | R₂₃ |
|---|---|---|---|---|---|---|---|---|
| La923. | N | C-C(D)(CH₃)₂ (tert-butyl with one D) | CH | N | Se | CD₃ | H | H |
| La924. | N | C-CD₂-CH(CH₃)₂ | CH | N | Se | CD₃ | H | H |
| La925. | N | C-CD₂-C(CH₃)₃ | CH | N | Se | CD₃ | H | H |
| La926. | N | 1-D-cyclopentyl (C attached) | CH | N | Se | CD₃ | H | H |
| La927. | N | 1-D-cyclohexyl (C attached) | CH | N | Se | CD₃ | H | H |
| La928. | N | 4,4-dimethyl-1-D-cyclohexyl | CH | N | Se | CD₃ | H | H |
| La929. | N | cyclopentyl-CD₂-C | CH | N | Se | CD₃ | H | H |
| La930. | N | cyclohexyl-CD₂-C | CH | N | Se | CD₃ | H | H |
| La931. | N | CCH₃ | CH | N | Se | CH₃ | H | CH₃ |
| La932. | N | C-CH(CH₃)₂ | CH | N | Se | CH₃ | H | CH₃ |
| La933. | N | C-CH₂-CH(CH₃)₂ | CH | N | Se | CH₃ | H | CH₃ |
| La934. | N | C-CH₂-C(CH₃)₃ | CH | N | Se | CH₃ | H | CH₃ |
| La935. | N | cyclopentyl-C | CH | N | Se | CH₃ | H | CH₃ |
| La936. | N | cyclohexyl-C | CH | N | Se | CH₃ | H | CH₃ |

-continued
| Number | X₁ | X₂ | X₃ | X₄ | X | R₂₁ | R₂₂ | R₂₃ |
|---|---|---|---|---|---|---|---|---|
| La937. | N | 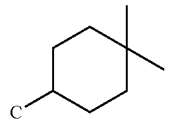 | CH | N | Se | CH₃ | H | CH₃ |
| La938. | N | 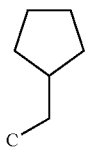 | CH | N | Se | CH₃ | H | CH₃ |
| La939. | N | 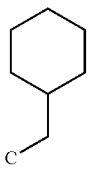 | CH | N | Se | CH₃ | H | CH₃ |
| La940. | N | CCD₃ | CH | N | Se | CD₃ | H | CD₃ |
| La941. | N |  | CH | N | Se | CD₃ | H | CD₃ |
| La942. | N | 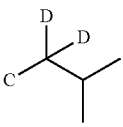 | CH | N | Se | CD₃ | H | CD₃ |
| La943. | N | 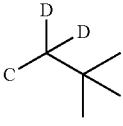 | CH | N | Se | CD₃ | H | CD₃ |
| La944. | N |  | CH | N | Se | CD₃ | H | CD₃ |
| La945. | N | 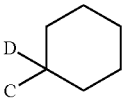 | CH | N | Se | CD₃ | H | CD₃ |
| La946. | N | 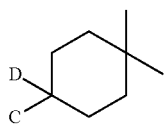 | CH | N | Se | CD₃ | H | CD₃ |
| La947. | N | 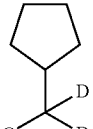 | CH | N | Se | CD₃ | H | CD₃ |
| La948. | N | 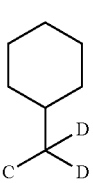 | CH | N | Se | CD₃ | H | CD₃ |
| La949. | CH | N | CH | N | S | H | H | H |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La950. | CH | N | CH | N | S | $CH_3$ | H | H |
| La951. | CH | N | CH | N | S | H | $CH_3$ | H |
| La952. | CH | N | CH | N | S | $CH_3$ | H | $CH_3$ |
| La953. | CH | N | CH | N | S | $CD_3$ | H | H |
| La954. | CH | N | CH | N | S | H | $CD_3$ | H |
| La955. | CH | N | CH | N | S | $CH_3$ | H | $CD_3$ |
| La956. | CH | N | $CCH_3$ | N | S | H | H | H |
| La957. | CH | N |  | N | S | H | H | H |
| La958. | CH | N | 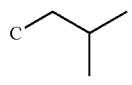 | N | S | H | H | H |
| La959. | CH | N | 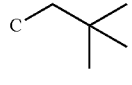 | N | S | H | H | H |
| La960. | CH | N | 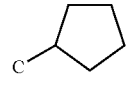 | N | S | H | H | H |
| La961. | CH | N | 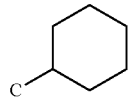 | N | S | H | H | H |
| La962. | CH | N | 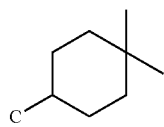 | N | S | H | H | H |
| La963. | CH | N | 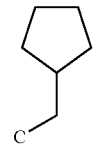 | N | S | H | H | H |
| La964. | CH | N | 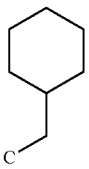 | N | S | H | H | H |
| La965. | CH | N | $CCD_3$ | N | S | H | H | H |
| La966. | CH | N |  | N | S | H | H | H |
| La967. | CH | N | 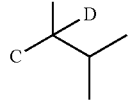 | N | S | H | H | H |
| La968. | CH | N | 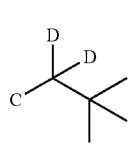 | N | S | H | H | H |

-continued

| Number | X₁ | X₂ | X₃ | X₄ | X | R₂₁ | R₂₂ | R₂₃ |
|---|---|---|---|---|---|---|---|---|
| La969. | CH | N | 1-D-cyclopentyl | N | S | H | H | H |
| La970. | CH | N | 1-D-cyclohexyl | N | S | H | H | H |
| La971. | CH | N | 1-D-4,4-dimethylcyclohexyl | N | S | H | H | H |
| La972. | CH | N | cyclopentyl-CD₂- | N | S | H | H | H |
| La973. | CH | N | cyclohexyl-CD₂- | N | S | H | H | H |
| La974. | CH | N | CCH₃ | N | S | CH₃ | H | H |
| La975. | CH | N | isopropyl | N | S | CH₃ | H | H |
| La976. | CH | N | isobutyl | N | S | CH₃ | H | H |
| La977. | CH | N | neopentyl | N | S | CH₃ | H | H |
| La978. | CH | N | cyclopentyl | N | S | CH₃ | H | H |
| La979. | CH | N | cyclohexyl | N | S | CH₃ | H | H |
| La980. | CH | N | 4,4-dimethylcyclohexyl | N | S | CH₃ | H | H |
| La981. | CH | N | cyclopentylmethyl | N | S | CH₃ | H | H |

-continued
| Number | X₁ | X₂ | X₃ | X₄ | X | R₂₁ | R₂₂ | R₂₃ |
|---|---|---|---|---|---|---|---|---|
| La982. | CH | N | 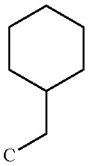 | N | S | CH₃ | H | H |
| La983. | CH | N | CCD₃ | N | S | CD₃ | H | H |
| La984. | CH | N |  | N | S | CD₃ | H | H |
| La985. | CH | N | 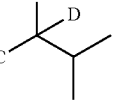 | N | S | CD₃ | H | H |
| La986. | CH | N | 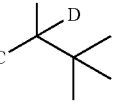 | N | S | CD₃ | H | H |
| La987. | CH | N | 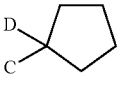 | N | S | CD₃ | H | H |
| La988. | CH | N | 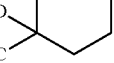 | N | S | CD₃ | H | H |
| La989. | CH | N | 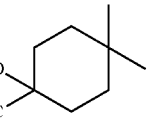 | N | S | CD₃ | H | H |
| La990. | CH | N | 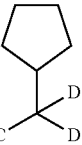 | N | S | CD₃ | H | H |
| La991. | CH | N | 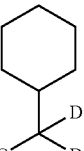 | N | S | CD₃ | H | H |
| La992. | CH | N | CCH₃ | N | S | CH₃ | H | CH₃ |
| La993. | CH | N |  | N | S | CH₃ | H | CH₃ |
| La994. | CH | N |  | N | S | CH₃ | H | CH₃ |
| La995. | CH | N | 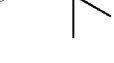 | N | S | CH₃ | H | CH₃ |

-continued
| Number | X₁ | X₂ | X₃ | X₄ | X | R₂₁ | R₂₂ | R₂₃ |
|---|---|---|---|---|---|---|---|---|
| La996. | CH | N | 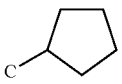 | N | S | CH₃ | H | CH₃ |
| La997. | CH | N | 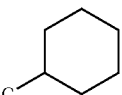 | N | S | CH₃ | H | CH₃ |
| La998. | CH | N | 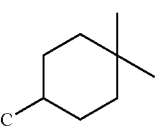 | N | S | CH₃ | H | CH₃ |
| La999. | CH | N | 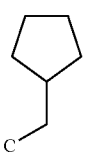 | N | S | CH₃ | H | CH₃ |
| La1000. | CH | N | 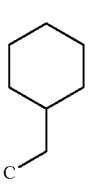 | N | S | CH₃ | H | CH₃ |
| La1001. | CH | N | CCD₃ | N | S | CD₃ | H | CD₃ |
| La1002. | CH | N |  | N | S | CD₃ | H | CD₃ |
| La1003. | CH | N | 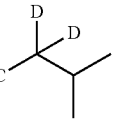 | N | S | CD₃ | H | CD₃ |
| La1004. | CH | N | 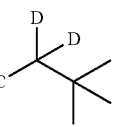 | N | S | CD₃ | H | CD₃ |
| La1005. | CH | N | 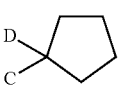 | N | S | CD₃ | H | CD₃ |
| La1006. | CH | N | 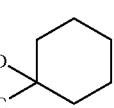 | N | S | CD₃ | H | CD₃ |
| La1007. | CH | N | 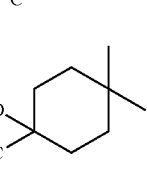 | N | S | CD₃ | H | CD₃ |

-continued

| Number | X₁ | X₂ | X₃ | X₄ | X | R₂₁ | R₂₂ | R₂₃ |
|---|---|---|---|---|---|---|---|---|
| La1008. | CH | N | cyclopentyl-CD₂- | N | S | CD₃ | H | CD₃ |
| La1009. | CH | N | cyclohexyl-CD₂- | N | S | CD₃ | H | CD₃ |
| La1010. | CH | N | CH | N | Se | H | H | H |
| La1011. | CH | N | CH | N | Se | CH₃ | H | H |
| La1012. | CH | N | CH | N | Se | H | CH₃ | H |
| La1013. | CH | N | CH | N | Se | CH₃ | H | CH₃ |
| La1014. | CH | N | CH | N | Se | CD₃ | H | H |
| La1015. | CH | N | CH | N | Se | H | CD₃ | H |
| La1016. | CH | N | CH | N | Se | CH₃ | H | CD₃ |
| La1017. | CH | N | CCH₃ | N | Se | H | H | H |
| La1018. | CH | N | isopropyl | N | Se | H | H | H |
| La1019. | CH | N | isobutyl | N | Se | H | H | H |
| La1020. | CH | N | neopentyl | N | Se | H | H | H |
| La1021. | CH | N | cyclopentyl | N | Se | H | H | H |
| La1022. | CH | N | cyclohexyl | N | Se | H | H | H |
| La1023. | CH | N | 4,4-dimethylcyclohexyl | N | Se | H | H | H |
| La1024. | CH | N | cyclopentylmethyl | N | Se | H | H | H |
| La1025. | CH | N | cyclohexylmethyl | N | Se | H | H | H |
| La1026. | CH | N | CCD₃ | N | Se | H | H | H |

-continued
| Number | X₁ | X₂ | X₃ | X₄ | X | R₂₁ | R₂₂ | R₂₃ |
|---|---|---|---|---|---|---|---|---|
| La1027. | CH | N |  | N | Se | H | H | H |
| La1028. | CH | N | 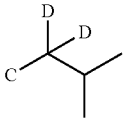 | N | Se | H | H | H |
| La1029. | CH | N | 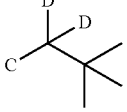 | N | Se | H | H | H |
| La1030. | CH | N |  | N | Se | H | H | H |
| La1031. | CH | N | 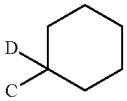 | N | Se | H | H | H |
| La1032. | CH | N | 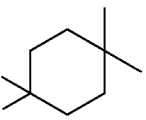 | N | Se | H | H | H |
| La1033. | CH | N | 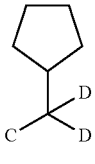 | N | Se | H | H | H |
| La1034. | CH | N | 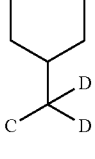 | N | Se | H | H | H |
| La1035. | CH | N | CCH₃ | N | Se | CH₃ | H | H |
| La1036. | CH | N |  | N | Se | CH₃ | H | H |
| La1037. | CH | N | 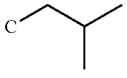 | N | Se | CH₃ | H | H |
| La1038. | CH | N | 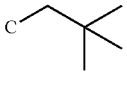 | N | Se | CH₃ | H | H |
| La1039. | CH | N | 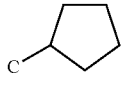 | N | Se | CH₃ | H | H |
| La1040. | CH | N | 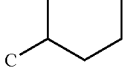 | N | Se | CH₃ | H | H |

-continued

| Number | $X_1$ | $X_2$ | $X_3$ | $X_4$ | X | $R_{21}$ | $R_{22}$ | $R_{23}$ |
|---|---|---|---|---|---|---|---|---|
| La1041. | CH | N | 4,4-dimethylcyclohexyl-CH₂- | N | Se | $CH_3$ | H | H |
| La1042. | CH | N | cyclopentyl-CH₂- | N | Se | $CH_3$ | H | H |
| La1043. | CH | N | cyclohexyl-CH₂- | N | Se | $CH_3$ | H | H |
| La1044. | CH | N | $CCD_3$ | N | Se | $CD_3$ | H | H |
| La1045. | CH | N | -C(D)(CH₃)₂ (isopropyl-d1) | N | Se | $CD_3$ | H | H |
| La1046. | CH | N | -CD₂-CH(CH₃)₂ | N | Se | $CD_3$ | H | H |
| La1047. | CH | N | -CD₂-C(CH₃)₃ | N | Se | $CD_3$ | H | H |
| La1048. | CH | N | 1-D-cyclopentyl- | N | Se | $CD_3$ | H | H |
| La1049. | CH | N | 1-D-cyclohexyl- | N | Se | $CD_3$ | H | H |
| La1050. | CH | N | 4-D-4-methyl... cyclohexyl (d-labeled) | N | Se | $CD_3$ | H | H |
| La1051. | CH | N | cyclopentyl-CD₂- | N | Se | $CD_3$ | H | H |
| La1052. | CH | N | cyclohexyl-CD₂- | N | Se | $CD_3$ | H | H |
| La1053. | CH | N | $CCH_3$ | N | Se | $CH_3$ | H | $CH_3$ |

-continued
| Number | X₁ | X₂ | X₃ | X₄ | X | R₂₁ | R₂₂ | R₂₃ |
|---|---|---|---|---|---|---|---|---|
| La1054. | CH | N |  | N | Se | CH₃ | H | CH₃ |
| La1055. | CH | N | 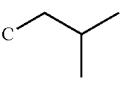 | N | Se | CH₃ | H | CH₃ |
| La1056. | CH | N | 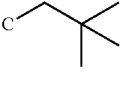 | N | Se | CH₃ | H | CH₃ |
| La1057. | CH | N | 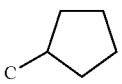 | N | Se | CH₃ | H | CH₃ |
| La1058. | CH | N | 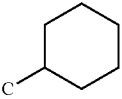 | N | Se | CH₃ | H | CH₃ |
| La1059. | CH | N | 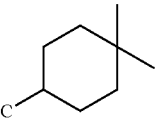 | N | Se | CH₃ | H | CH₃ |
| La1060. | CH | N | 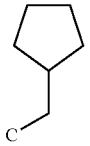 | N | Se | CH₃ | H | CH₃ |
| La1061. | CH | N | 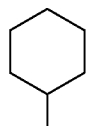 | N | Se | CH₃ | H | CH₃ |
| La1062. | CH | N | CCD₃ | N | Se | CD₃ | H | CD₃ |
| La1063. | CH | N |  | N | Se | CD₃ | H | CD₃ |
| La1064. | CH | N | 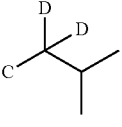 | N | Se | CD₃ | H | CD₃ |
| La1065. | CH | N | 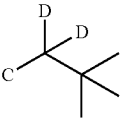 | N | Se | CD₃ | H | CD₃ |
| La1066. | CH | N | 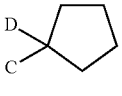 | N | Se | CD₃ | H | CD₃ |
| La1067. | CH | N | 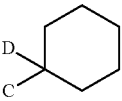 | N | Se | CD₃ | H | CD₃ |

-continued
| Number | $X_1$ | $X_2$ | $X_3$ | $X_4$ | X | $R_{21}$ | $R_{22}$ | $R_{23}$ |
|---|---|---|---|---|---|---|---|---|
| La1068. | CH | N | 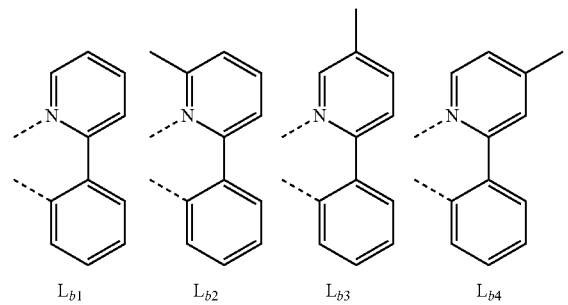 | N | Se | $CD_3$ | H | $CD_3$ |
| La1069. | CH | N | 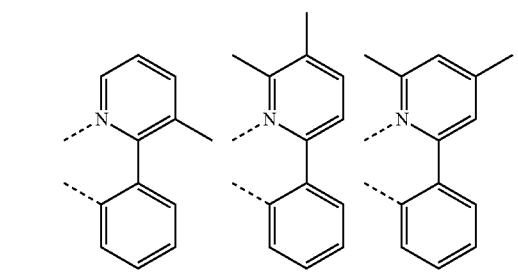 | N | Se | $CD_3$ | H | $CD_3$ |
| La1070. | CH | N | 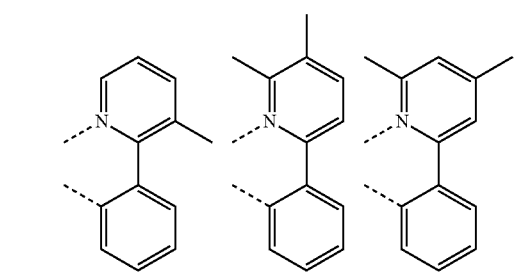 | N | Se | $CD_3$ | H | $CD_3$ |
6. The metal complex of claim 5, wherein the metal complex has the formula of $IrL_a(L_b)_2$, $L_a$ is selected from any one of $L_{a1}$ to $L_{a1070}$ and $L_b$ is each independently selected from any one of the group consisting of:
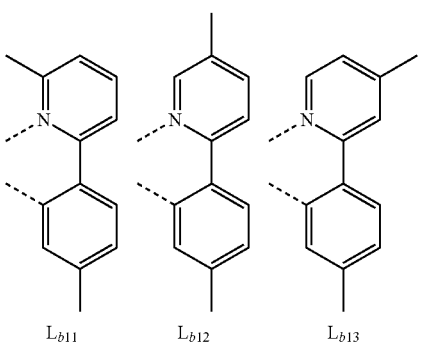
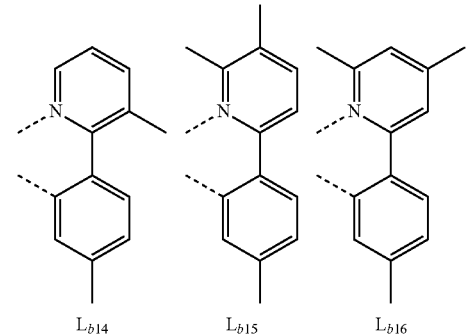
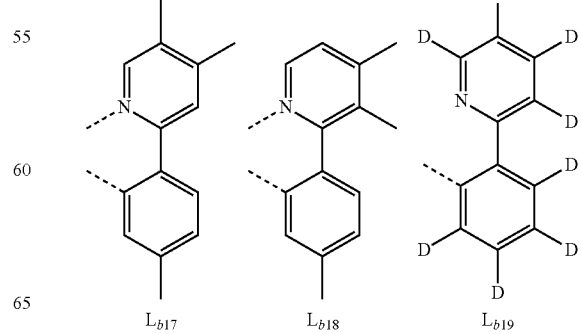

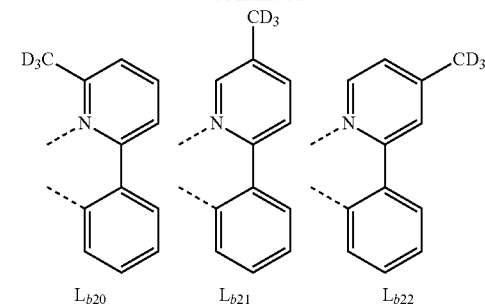
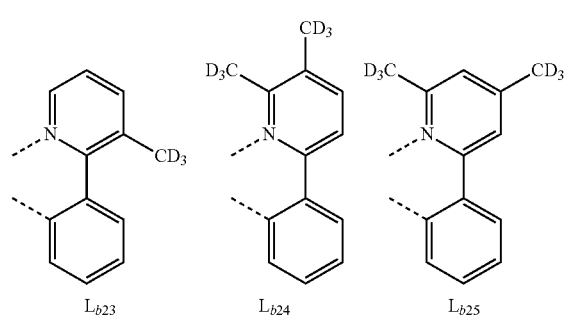
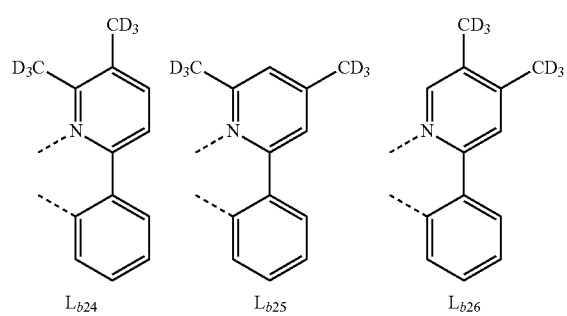
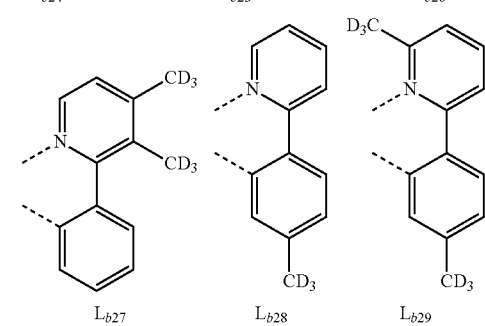
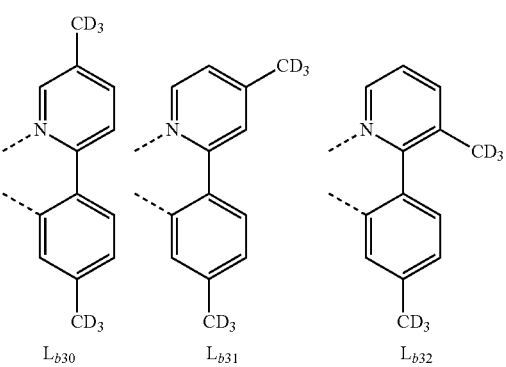
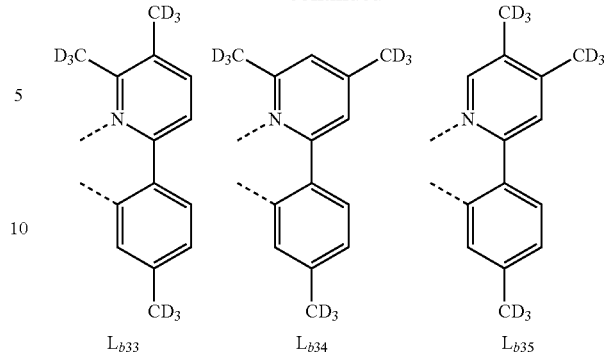
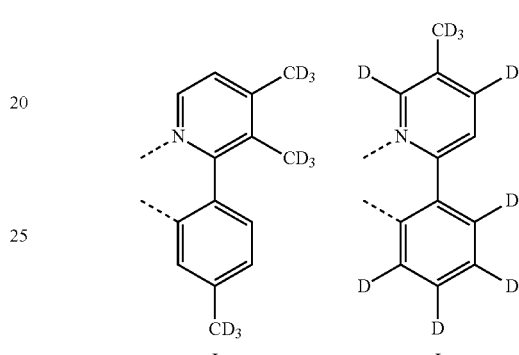
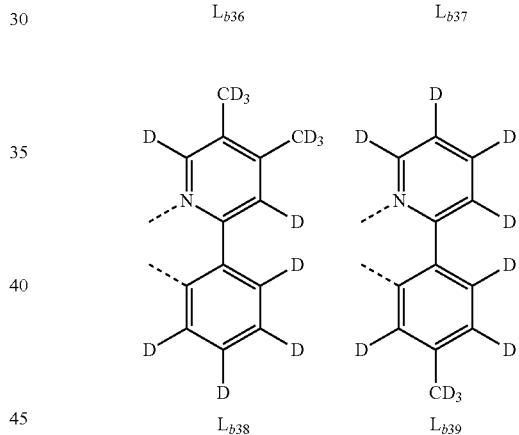
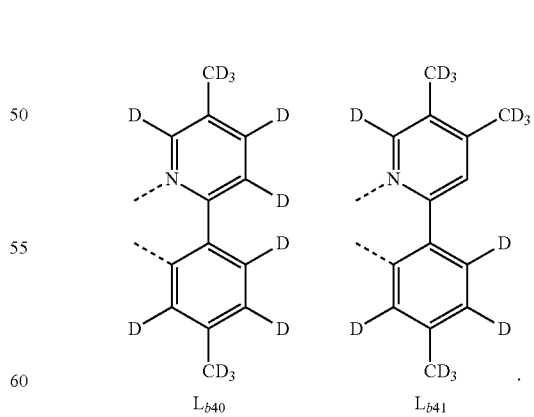
7. The metal complex of claim 5, wherein the metal complex has the formula of $Ir(L_a)_2L_c$, $L_a$ is each independently selected from any one of $L_{a1}$ to $L_{a1070}$ and $L_c$ is selected from any one of the group consisting of:

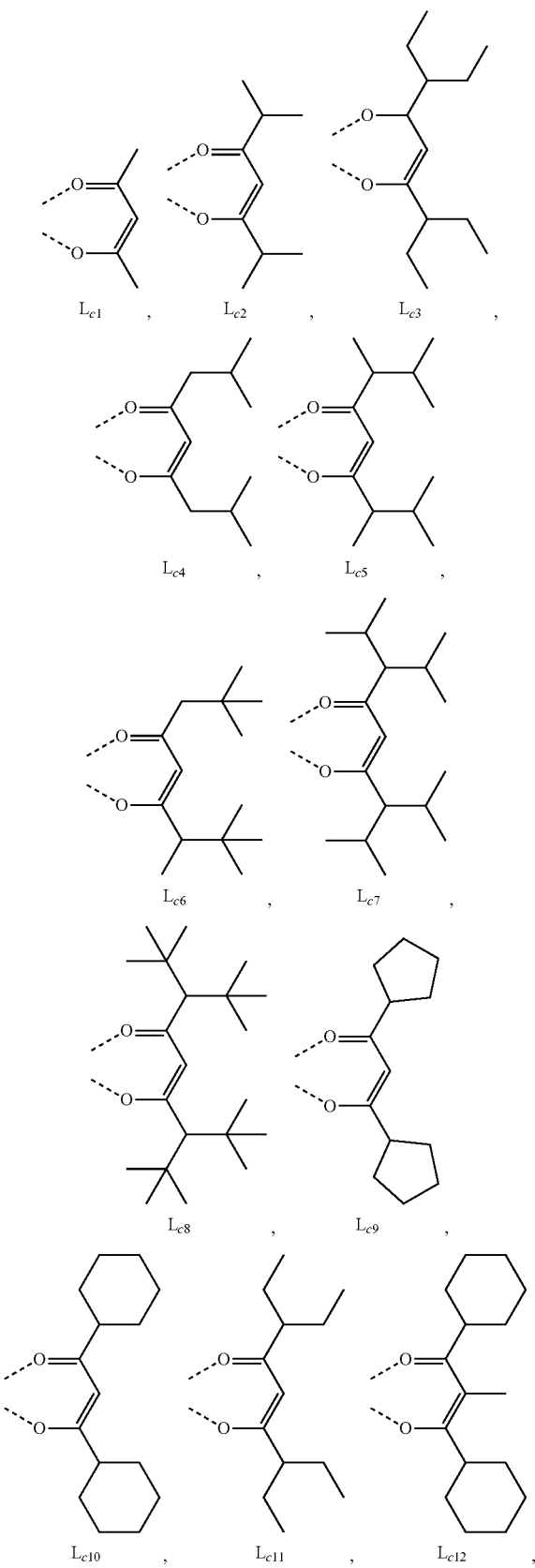

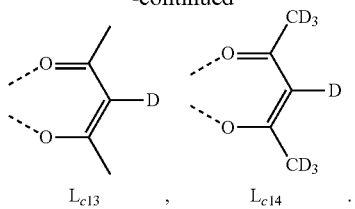

8. An electroluminescent device comprises:
an anode,
a cathode,
and an organic layer, disposed between the anode and the cathode, comprising a metal complex having a partial structure represented by Formula 1:

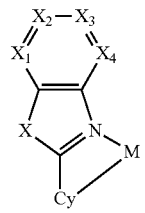

Formula 1 wherein
Cy is a substituted or unsubstituted aryl or heteroaryl group having 5 to 24 aromatic ring atoms;
Cy is bonded to M via a carbon atom;
M is selected from the group consisting of Cu, Ag, Au, Ru, Rh, Pd, Os, and Ir;
X is selected from the group consisting of O, S, and Se;
$X_1$, $X_2$, $X_3$, and $X_4$ are independently selected from N or CR;
at least one of $X_1$, $X_2$, $X_3$, and $X_4$ is N;
wherein R is selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof; and
two adjacent substituents are optionally joined to form a ring.
9. The device of claim 8, wherein the organic layer is an emissive layer and the metal complex is an emitter.

10. The device of claim 8, wherein the organic layer further comprises a host.

11. The device of claim 8, wherein the organic layer comprises at least two hosts.

12. The device of claim 10, wherein the host compound comprises at least one of the chemical groups selected from the group consisting of carbazole, azacarbazole, indolocarbazole, dibenzothiophene, dibenzofuran, triphenylene, naphthalene, phenanthrene, triazine, quinazoline, quinoxaline, azadibenzothiophene, azadibenzofuran and the combinations thereof.

13. The device of claim 11, wherein the host compound comprises at least one of the chemical groups selected from the group consisting of carbazole, azacarbazole, indolocarbazole, dibenzothiophene, dibenzofuran, triphenylene, naphthalene, phenanthrene, triazine, quinazoline, quinoxaline, azadibenzothiophene, azadibenzofuran and the combinations thereof.

14. The device of claim 8, wherein the electroluminescent device is incorporated into another device selected from the group consisting of a consumer product, an electronic component module, an organic light-emitting device, and a lighting panel.

15. A formulation comprises the metal complex of claim 1.

16. The metal complex of claim 4, wherein $R_1$, $R_2$, and $R_3$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted alkylsilyl group having 3 to 20 carbon atoms, a nitrile group, an isonitrile group, and combinations thereof.

17. The metal complex of claim 1, wherein one of $X_1$, $X_2$, $X_3$, and $X_4$ is N.

18. The metal complex of claim 4, wherein $L_a$ is selected from a group consisting of:

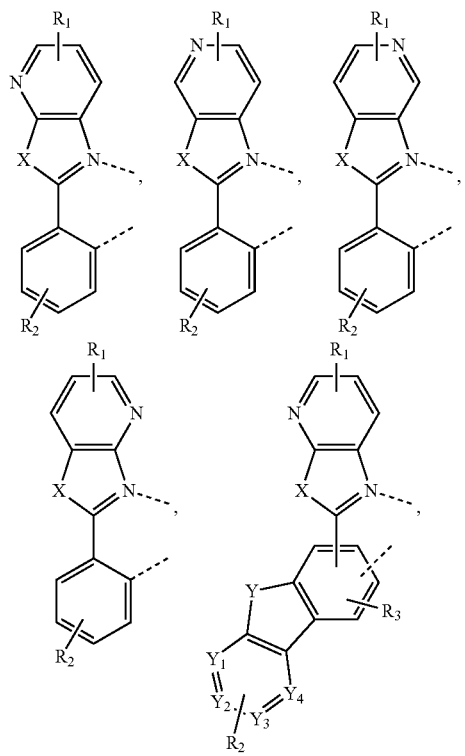

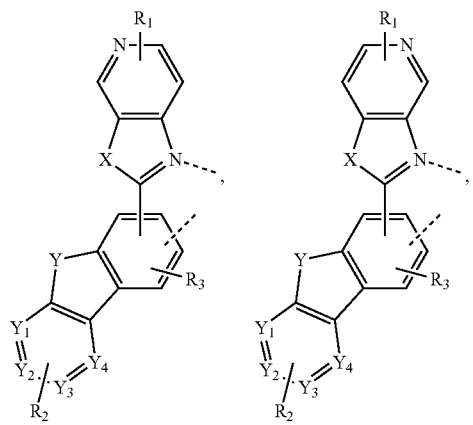

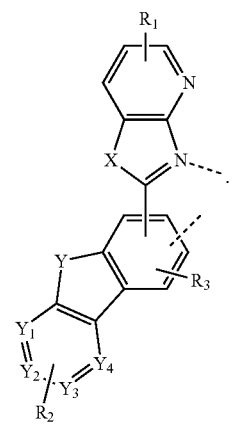

19. The metal complex of claim 18, wherein $L_c$ is selected from

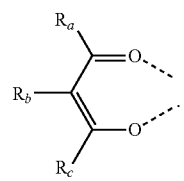

* * * * *